United States Patent
Abdel-Monem et al.

(10) Patent No.: US 11,070,065 B2
(45) Date of Patent: Jul. 20, 2021

(54) METHOD AND APPARATUS OF A MODULAR MANAGEMENT SYSTEM FOR ENERGY STORAGE CELLS

(71) Applicants: VITO NV, Mol (BE); VRIJE UNIVERSITEIT BRUSSEL, Brussels (BE)

(72) Inventors: Mohamed Abdel-Monem, Brussels (BE); Omar Hegazy, Schaerbeek (BE); Noshin Omar, Aalst (BE); Khiem Trad, Mol (BE); Joeri Van Mierlo, Schaerbeek (BE)

(73) Assignees: VRIJE UNIVERSITEIT BRUSSEL, Brussels (BE); VITO NV, Mol (BE)

( * ) Notice: Subject to any disclaimer, the term of this patent is extended or adjusted under 35 U.S.C. 154(b) by 331 days.

(21) Appl. No.: 16/301,208

(22) PCT Filed: May 15, 2017

(86) PCT No.: PCT/EP2017/061631
§ 371 (c)(1),
(2) Date: Nov. 13, 2018

(87) PCT Pub. No.: WO2017/194790
PCT Pub. Date: Nov. 16, 2017

(65) Prior Publication Data
US 2019/0288520 A1    Sep. 19, 2019

(30) Foreign Application Priority Data
May 13, 2016   (EP) .................................. 16169726

(51) Int. Cl.
*H02J 7/00*       (2006.01)
*G01R 31/389*    (2019.01)
(Continued)

(52) U.S. Cl.
CPC .......... *H02J 7/0014* (2013.01); *G01R 31/367* (2019.01); *G01R 31/382* (2019.01);
(Continued)

(58) Field of Classification Search
CPC ..................................................... H02J 7/0014
(Continued)

(56) References Cited

U.S. PATENT DOCUMENTS

| 4,361,809 A | 11/1982 | Bil et al. |
| 4,719,427 A | 1/1988 | Morishita et al. |

(Continued)

FOREIGN PATENT DOCUMENTS

| DE | 102011100151 A1 | 10/2012 |
| EP | 2 490 315 | * 2/2011 |

(Continued)

OTHER PUBLICATIONS

European Office Action in corresponding European Application No. 17726567.5, dated Oct. 12, 2020.
(Continued)

*Primary Examiner* — Yalkew Fantu
(74) *Attorney, Agent, or Firm* — Bacon & Thomas, PLLC

(57) ABSTRACT

A modular management system for balancing, testing and protecting rechargeable energy storage cells connected in series. Different energy storage cell technologies can be connected in the same battery pack and they can be completely balanced by using one or both of two balancing modes. In addition, the modular management system includes bidirectional and unidirectional switches optionally connected to a single ohmic device such as a resistor to efficiently execute a Dual Function Process (DFP) (i.e., passive/active balancing, and testing mode for SoH/SoC estimation) preferably without using any extra or external components (i.e., capacitor or inductor or DC/DC converter
(Continued)

or power supply). The systems and methods decrease the balancing time, energy loss, heat loss and complexity needed to monitor, protect and balance energy storage cell systems such as battery systems, and thus decreasing the overall cost.

15 Claims, 41 Drawing Sheets

(51) Int. Cl.
  *G01R 31/392* (2019.01)
  *G01R 31/367* (2019.01)
  *G01R 31/382* (2019.01)
  *G01R 31/387* (2019.01)
  *G01R 31/396* (2019.01)

(52) U.S. Cl.
  CPC ......... *G01R 31/389* (2019.01); *G01R 31/392* (2019.01); *H02J 7/0024* (2013.01); *H02J 7/0026* (2013.01); *G01R 31/387* (2019.01); *G01R 31/396* (2019.01); *H02J 7/00302* (2020.01); *H02J 7/00306* (2020.01); *H02J 2207/10* (2020.01); *Y02T 10/70* (2013.01)

(58) Field of Classification Search
  USPC ........................................................ 320/118
  See application file for complete search history.

(56) References Cited

U.S. PATENT DOCUMENTS

| | | | |
|---|---|---|---|
| 5,977,750 A | 11/1999 | Ng et al. | |
| 6,172,479 B1* | 1/2001 | Barton | 320/121 |
| 7,072,871 B1 | 7/2006 | Tinnemeyer | |
| 7,274,170 B2 | 9/2007 | Benckenstein, Jr. et al. | |
| 8,648,602 B2* | 2/2014 | Van | 324/426 |
| 9,153,846 B2 | 10/2015 | Liang et al. | |
| 2003/0117112 A1* | 6/2003 | Chen et al. | 320/137 |
| 2011/0060538 A1 | 3/2011 | Fahimi et al. | |
| 2013/0093248 A1 | 4/2013 | Liu | |
| 2013/0293006 A1 | 11/2013 | Kang et al. | |
| 2014/0097787 A1 | 4/2014 | Lin | |
| 2014/0145651 A1 | 5/2014 | Schiemann et al. | |
| 2014/0232346 A1 | 8/2014 | Zhang et al. | |
| 2014/0306712 A1 | 10/2014 | Esnard-Domerego | |

FOREIGN PATENT DOCUMENTS

| | | |
|---|---|---|
| EP | 2416468 A2 | 2/2012 |
| EP | 2490315 A1 | 8/2012 |
| WO | 2014109893 A1 | 7/2014 |
| WO | 2016012922 A1 | 1/2016 |

OTHER PUBLICATIONS

IPRP for PCT/EP2017/061631 dated Nov. 13, 2018.
Kazuhiko, T., Quick testing of batteries in lithium-ion battery packs with impedance-measuring technology, Journal of Power Sources 128 (2004) 67-75.
European Office Action in corresponding European Application No. 17726567.5, dated Mar. 20, 2020.
International Search Report for PCT/EP2017/061631, dated Sep. 8, 2017.
Written Opinion for PCT/EP2017/061631, dated Sep. 8, 2017.
Extended European Search Report in related European Application No. 16169726.3-1804, dated Nov. 16, 2018.

* cited by examiner

METHOD AND APPARATUS OF A MODULAR MANAGEMENT SYSTEM FOR ENERGY STORAGE CELLS

The present invention relates to management systems, methods and devices such as modular management systems, methods and devices for monitoring, balancing and/or protecting of a pack of energy storage cells such as battery cells and for estimating a state of a cell or cells such as a State-of-Health (SoH) and/or State-of-Charge (SoC) of a cell or cells.

BACKGROUND OF THE INVENTION

Rechargeable energy storage systems (RESS) are playing an important role in many applications such as smart grids and electric vehicles (EVs). The performance of the RESS management systems needs improvement. For example, rechargeable storage cells in series need to produce a sufficiently high output voltage and the available energy needs to be optimized. Preferably, a balancing circuit should be provided to ensure that the changing of voltage and capacity of rechargeable storage cells is almost the same during the charging and discharging process. In addition, the voltage, current and temperature should be monitored to protect the RESS against over-charge or over-discharge or over-temperature.

Three or four main functions are required for any BMS:
1) monitoring the voltage, current and temperature,
2) balancing the voltage and capacity of rechargeable storage cells,
3) estimating the SoH (State of Health) and/or SoC (State of Charge) of each cell, and
4) optionally protecting the RESS against over-charge or over-discharge or over-temperature.

The conventional management systems have either a passive or an active balancing circuit. Commercially, passive balancing is popular. Passive balancing can be used to balance the voltage and capacity of the energy cells of rechargeable energy storage systems by using multiple resistors to discharge the excess amount of energy in the higher energy cells during charging and discharging operations. However, this method wastes energy and causes an undesirable local temperature rise, and thus, extra power consumption is needed for cooling. Another method uses active balancing loses less energy, but is a complex system and is expensive. These drawbacks are caused by the extra components (i.e., capacitor or inductor with resistors or DC/DC converter) that are needed to transfer energy from higher energy cells, and afterwards to inject this energy into the lower energy cells.

Another aspect of RESS is to detect the state-of-health/the remaining capacity of rechargeable storage cells. The state-of-health (SoH) is the ability of the storage cell to store and retain energy, and thus if its performance or health deteriorates, this can be determined.

Various methods have been developed for estimating the state-of-health of energy storage cells. Most of them are based on a capacity test or accurate models, which depend on the electrochemical characteristics and the dynamics of the storage cell. The SoH estimation based on capacity test needs a long testing time (>2 hr) due to the fact that the cell should be subjected to a charge and discharge process. In addition, the cost of the measuring unit is affected by the charging/discharging current, which depends on the rated capacity of the tested cell.

In case of a dynamic model is used its accuracy can be increased if a system model consists of high order equivalent circuits but this is too complex practical use.

A number of studies on designing a BMS for batteries have been reported in the literature, as follows: US. Pat. Application No. 2014/0097787 discloses a BMS for actively balancing the voltages and capacities of the battery pack. An array of power transfer units, which are integrated in parallel and are individually connected to the cells in the battery pack in order to balance the cells. However, as most of prior studies, there is a direct proportional between complexity and efficiency of the circuit. For instance, the BMS can be designed to decrease the energy and heat loss, but complex circuit should be used by using extra components such as power transfer units, storage elements and switches.

To clarify the prior attempts toward designing the BMS, the two parts should be investigated: balancing mode, and testing mode (SoH and/or SoC estimation).

In case of balancing, US. Pat. Application No. 2014/0232346 reveals a system includes active cell balancing circuitry configured to balance multiple power cells connected in series within a single module.

As a further example, US. Pat. Application No. 2013/0093248 discloses that multiple batteries connected in series by using an active balancing circuit. The active balancing circuit includes an LC resonance circuit and multiple switches configured to selectively couple different ones of the batteries to the LC resonance circuit.

A disadvantage of these systems is that they need a relatively long balancing time compared to the passive balancing circuit. In addition, the complexity of the system increases due to using storage element, such as inductor and/or capacitor with needed accessories.

Some battery systems use a simple circuit for balancing the batteries. Such systems are described, for example, in US. Pat. Application No. 2013/0293006, which discloses that a parallel connection can be used for balancing batteries connected in series. However, additional resistors are needed to control the balancing current and time, and also extra switches should be used to change the cell connection from series to parallel connection. In US. Pat. Application No. 2014/0145651, this invention relates to a circuit, which enables cell balancing with reduced circuit complexity by using a single resistor. However, when implementing only a passive balancing technique, there is no significant effect caused by reducing the number of resistors on the energy and heat loss of the balancing circuit.

In case of testing mode, in some prior battery monitoring systems, it is necessary to do undesirably long test to evaluate the SoH of the battery. This is especially the case for systems, which require that the battery under test be fully charged before a state-of-health measurement can be made. As an example, U.S. Pat. No. 5,977,750 reveals a system for computing the SoH of battery by tracking the degradation of the full charge capacity of a battery with cycling.

Some battery monitoring systems measure a number of electrochemical parameters and using fuzzy logic to compute a state-of-health for the battery as described in U.S. Pat. No. 7,072,871. As a further example, US. Pat. Application No. 2011/0060538 discloses that the SoH of battery can be estimated by calculating a range of voltages by taking the convolution of a terminal current of the chemical battery with a range of impulse responses from a lookup table of impulse responses corresponding to different states-of-health. In US. Pat. Application No. 2014/0306712, the invention revealed that two levels of voltage and an impedance of the battery are determined. A battery impedance table is used to calculate SoC and SoH of battery systems.

A disadvantage of these battery monitoring systems is that they need to store parameter history for that particular battery, and thus increasing the system complexity.

On-board diagnostics (OBD) is a term of art in the automotive industry. It refers to a vehicle's self-diagnostic and reporting function that gives the vehicle repair technician access to the status of the various vehicle subsystems. OBD was introduced in the early 1980s and has developed depending on changes in on-board vehicle computers. Recent OBD systems use a standardized digital communications port to provide real-time data in addition to a standardized series of diagnostic trouble codes, or DTCs, which allow one to rapidly identify and remedy malfunctions within the vehicle. Some battery monitoring systems measure the AC impedance at 1 kHz by using very small sinusoidal signals. The AC impedance at this frequency is also called "resonance impedance", and attempts have been made to find a relationship between battery health and the resonance impedance. Such systems are described, for example, in Kazuhiko. T, *Quick testing of batteries in lithium-ion battery packs with impedance-measuring technology*, Journal of power sources 128 (2004) 67-75. However, external components (i.e., function generator with switches) are needed to apply a small sinusoidal signal in order to calculate the AC impedance of the battery cell. In addition, only one type of lithium ion battery is used to "prove" that there is a linear regression between the resonance impedance and the remaining capacity of the battery. Practically, due to using a very small sinusoidal signal, an advanced filter is needed to remove the influence of noise and interference of surrounding devices.

AIM/PURPOSE

There remains a need to develop an energy storage cell management method, system and device, preferably in modular form which, for example, as one option ameliorates one or more disadvantages of the prior art. Embodiments of the present invention address these advantages such as providing one or both of these:
1. A passive/active balancing, and testing (e.g. a diagnostic test to estimate SoH/SoC estimation) modes are effectively performed without using any external sources or extra components (e.g. capacitor or inductor) thanks to an arrangement of dedicated switching devices, using bidirectional and unidirectional switches optionally connected to a single ohmic device such as a resistor.
2. A simple and modular cell balancing system, which can be used for a wide variety of different energy storage cell designs, such as some or all battery technologies in order to perform the balancing in such a way that heat loss is low or lower and/or there is a low or lower energy consumption;
3. An effective test, which can be used quickly, reliably and simply, for example as an OBD health check without using an external source, e.g. for estimating the SoH and/or SoC of energy storage cells or cell packs such as batteries.

SUMMARY OF THE INVENTION

In one aspect the present invention, embodiments relate to a management method, system and devices for multicellular rechargeable energy storage systems (RESS). In embodiments of the present invention, the same configuration can be used for monitoring and/or protecting and/or balancing and/or charging and/or testing and/or controlling a RESS comprising rechargeable energy cells. For example RESS cells can be connected in series. In other embodiments of the present invention methods, systems and devices are provided for performing cell balancing with the advantages of a lower energy loss, and thus a decrease in the heat loss, resulting in compact optionally low powered cooling system for a balancing circuit.

In another aspect, the present invention provides a management system such as a modular management system comprising bidirectional and unidirectional switches connected to an energy dissipating device, for example a single ohmic device, such as a resistor to efficiently execute a passive/active balancing, and testing mode for SoH/SoC estimation which can be described as a Dual Function Process (DFP) preferably without using any extra or external components (i.e., capacitor or inductor or DC/DC converter or power supply).

Embodiments of the present invention disclose a management system such as a moular management system for rechargeable energy storage devices comprising:
series connected energy storage cells,
a cell splitting means such as a cell splitting circuit for splitting or separating the series connected energy cells into groups of cells, the cell splitting means or cell splitting circuit comprising first bidirectional switching devices; and
a control unit,
the system comprising: a mode selection circuit comprising first unidirectional switching devices, the first unidirectional switching devices of the mode selection circuit being adapted and configured to allow selection of a management mode selected from any of a balancing mode or a testing mode or a charging or discharging mode of operation, further comprising a balancing current circuit having second bidirectional switching devices, a balancing current, which may be drawn from or injected into any one or more of rechargeable energy cells passing through the balancing current circuit, the second bidirectional switching devices being adapted to allow the control unit to select a balancing current to flow from or to a cell.

In embodiments of a balancing circuit or method, one ohmic device such as a resistor is used (or a limited number of ohmic devices, e.g. less than five, or less than three are used) to achieve balancing of one or more energy storage cells, such as batteries in a pack by using two balancing modes:

1) embodiments in passive balancing mode, for example with only a single ohmic device such as a resistor, and, 2) embodiments with a RESS internally powered balancing mode including series-parallel connected embodiments. The passive balancing embodiments work in both charging and discharging in order to at least partially balance the rechargeable energy cells such as batteries. These embodiments can maintain the capacity and voltage differences around a threshold limit thanks to an arrangement of dedicated switching devices. Thus, the rechargeable energy storage cells can be protected against over-charging or over-discharging during fast charging and deep discharging respectively. By using the same ohmic device, e.g. a single ohmic device such as a resistor, thanks to the arrangement of the dedicated switching devices, the RESS internally powered balancing mode including series-parallel balancing embodiments can utilise a part of, or a majority part of, or all of a rest time (idle time) to completely balance the voltages and capacities of rechargeable energy cells by changing the cell connections, e.g. from series to parallel. The same configuration can be used for SoH estimation by using AC impedance testing mode. Different RESS topologies can be integrated and used together in the same energy storage system by using embodiments of the present invention.

Embodiments of the present invention provide systems, methods and devices for multicellular RESS module/packs. Multicellular RESS module/packs are commonly used in applications such as: electronic devices, medical equipment, automotive and stationary applications, and in transportation vehicles for connecting rechargeable energy storage cells connected in series. With such multicellular RESS module/packs cell imbalance can occur and some rechargeable energy storage cells may age faster than others. The imbalance can occur, for example, due to slight differences in the SoC, in self-discharge rate, in capacity, in impedance or in temperature characteristics of rechargeable energy storage cells that are connected in series. Even for cells that have the same technology from the same manufacturer and even come from the same batch of production, aging may well not be uniform for all cells.

For example, inequality of aging rates and levels may come from a very small variation in the dimensioning or a chemical composition or an effect of temperature distribution during operation. As a result, the internal resistance of these rechargeable energy storage cells can increase, which may eventually lead to their failure. If only one storage cell fails, the entire module also fails because of the series connection. Therefore, an effective management system should be used to ensure that all rechargeable storage cells age at the same rate. Alternatively, energy storage cells, such as batteries can develop self-discharge, uneven current distribution and internal short circuit. This can result in cell overheating and even to explosion.

Embodiments of the present invention may provide one or more of the following:
RESS balancing methods, and/or systems and/or devices, which provide balancing with low or lower energy and/or heat loss;
A simplified cooling system and/or method and/or device for a balancing circuit in order to reduce power consumption, and optionally reduce the overall operating cost;
Provision of a Dual Function Process (DFP), which means splitting or seperating the rechargeable energy cell pack such as a battery pack into two or more independent (isolated) modules each comprising cells of the rechargeable energy cell pack such as a battery pack. Each split module is configured to play a dual function such as a DC power supply itself and each such module can be used as a means to balance and/or to apply a DC pulse (e.g. without using an external supply) to another such module in an RESS in order to carry out a diagnostic test such as to estimate the SoC or SoH of the storage cell/cells thanks to the arrangement of the dedicated switches (bidirectional and unidirectional switches connected optionally to a single ohmic device such as a resistor);
Provision of a modular balancing circuit, and/or system and/or method, which can be used for balancing different RESS technologies;
Provision of a generic, and/or quick and/or simple testing procedure, and/or test system and/or test device to estimate the SoH or SoC of rechargeable energy cells such as batteries;
Provision of a flexible RESS method and/or system and/or device that can be integrated with different types of power electronic converters.

The embodiments of the present invention provide for example one, some or all of:
A modular management system and/or method and/or device for rechargeable energy storage cells or cell packs with a new configuration, using bidirectional and unidirectional switches optionally connected to a single ohmic device such as a resistor.
A modular management system and/or method and/or device comprising group of switches (such as bidirectional and/or unidirectional switches), for example with only a single ohmic device such as a first resistor in order to provide a flexibile circuit and/or system and/or method allowing operation for different applications and/or allowing integration with other circuits. In addition, optionally a second ohmic device such as a resistor can be connected in parallel with the single ohmic device such as the first resistor in order to change the internal resistance of the balancing circuit and hence the balancing rate.
An energy storage system and/or method and/or device for small and large scale applications with good e.g. high efficiency.
The modular management system, method or device can comprise bidirectional and unidirectional switches connected to, for example only a single ohmic device such as a resistor to efficiently manage the rechargeable energy storage cells during the operating process and the idling rest time.
The modular management system, method or device can comprise bidirectional and unidirectional switches with, for example only a single ohmic device such as a resistor used to protect the rechargeable energy storage cells that are connected using an in series switch arrangement.
The modular management system, method or device can comprise bidirectional and unidirectional switches with, for example only a single ohmic device such as a resistor adapted to perform two balancing modes in order to avoid and or any imbalance between the rechargeable energy storage cells.
The modular management system, method or device can comprise bidirectional and unidirectional switches with, for example only a single ohmic device such as a resistor used with a group of cells, e.g. to provide a DFP for a testing mode by applying an excitation current for testing another group of cells.
The modular management system, method or device adapted to perform two balancing modes that provide a passive balancing mode during charge and discharge, and an internally powered balancing mode including a series-parallel mode during an idling rest time.
The modular management system, method or device wherein the passive balancing mode is adapted to protect the rechargeable energy storage cells against overcharge or over-discharge.
The modular management system, method or device can comprise an internally powered balancing mode including a series-parallel mode is adapted to complete the balancing of the rechargeable energy storage cells during an idling rest time.
The modular management system, method or device wherein the testing mode is adapted (optionally based on a DFP) to apply an excitation current signal (for example a square wave or quasi-square wave or pulse width modulation). Afterwards, a response voltage signal is measured without using external supply. Then, these signals are converted from time to frequency domain by using a series of orthogonal waveforms such as in the discrete Fourier transform, in order to compute the AC impedance as a function of frequency levels.

The modular management system, method or device wherein the AC impedance is measured to provide a value of an internal impedance of the rechargeable energy storage cells, especially the AC impedance at 1 kHz, which is called the resonance impedance.

The management system, method or device wherein the resonance impedance is calculated and used to estimate the SoH or SoC of the rechargeable energy storage cells by means of a generic aging model. The generic aging model can relate resonance impedance to State of Charge. For example, in the model the resonance impedance can be defined by:

$$R_{im} = A + \frac{B}{\sqrt{SoH + C}};$$

whereby A, B and C are constants.

The modular management system, method or device can be integrated into a grid by using a single stage, a double stage, or a multi-port and/or a multi-level converter.

A modular management system for rechargeable energy storage systems comprising energy storage cells connected together in an array of cells, the system comprising: a control unit for deciding the operating mode such as balancing or testing or protecting mode, an array of voltage sensors for measuring a voltage of each of the cell in the energy storage pack individually, a current sensor for determining whether the operation type of the energy storage pack is charging, discharging or resting, controllable switches for selecting a balancing mode for the cells or a testing mode for the cells, the balancing mode being one of passive, series-parallel balancing and a controller receiving output from the voltage and current sensors and for controlling the controllable switches so that when the cells are discharging or charging the outputs of the voltage sensors are sent to the controller, and based on a comparison of the received outputs, the controller is adapted to start the passive balancing mode, and when the operation mode is resting, the controller is adapted to start the series-parallel balancing mode followed by a testing mode to estimate SoH and/or SoC.

The controllable switches can include unidirectional and bidirectional switches.

The unidirectional switches can be used to select the operating modes (passive or series-parallel or testing).

The bidirectional switches can be used to control the current direction from or to cell based on the operating mode and also to split the pack The balancing modes can be performed, for example by only a single ohmic device in series thanks to the smart switches arrangement.

A testing mode can be carried out, for example by using a Dual Function Process (DFP) in order to avoid using an external supply thanks to the arrangement of the dedicated switches (bidirectional and unidirectional switches connected optionally to a single ohmic device such as a resistor) with the aim to estimate SoH and/or SoC.

A protecting mode can include disconnecting the battery pack in case of fault.

The control unit can be connected to interface circuits by using communication unit for displaying the status and performance of a pack.

Embodiments of the present invention provide a system, method or device that can be used for different applications, for example any of the following:

Connecting first-life, i.e., new energy storage cells such as in battery storage modules for automotive, smart grid applications;

Connecting second life energy storage cells such as in battery modules, which are removed from automotive applications, to other smart grid applications;

Integrate different rechargeable energy storage technologies together in one specific application.

Flexible integration with an auxiliary energy storage system such as in a battery storage system and renewable energy systems (e.g. wind turbine, tidal energy generation, geothermal electricity or heat generating systems, or PV or similar), by means of the arrangement of dedicated unidirectional switching and/or bidirectional switching devices including a mode selection circuit and a balancing current circuit.

An independent invention includes a system, method or device for estimation of the SoH of rechargeable energy storage cells by using a generic aging model. The generic aging model can relate resonance impedance to State of Charge. For example, in the model the resonance impedance can be defined by:

$$R_{im} = A + \frac{B}{\sqrt{SoH + C}};$$

whereby A, B and C are constants.

In another aspect a management system or a modular management system for rechargeable energy storage devices is provided comprising series connected energy storage cells, bidirectional and unidirectional switches connected to a single ohmic device such as a resistor to efficiently execute a Dual Function Process (DFP) (e.g. passive/active balancing, and testing mode for SoH/SoC estimation) preferably without using any extra or external components.

The DFP provides splitting or separating of the rechargeable energy cell pack such as a battery pack into two or more independent modules, each split module playing a dual function such as being a DC power supply. Each such module can be used as a means to balance and/or to apply a DC pulse (without using external supply) to another such module in an RESS in order to estimate a state such as the SoH of storage cell/cells thanks to an arrangement of dedicated switches (e.g. bidirectional and unidirectional switches preferably connected to a single ohmic device such as a resistor); and a control unit.

In an another aspect system is provided for use in any of the embodiments of the present invention comprising: a mode selection circuit comprising bidirectional and unidirectional switching devices optionally connected to a single resistor, the unidirectional switches of the mode selection circuit being adapted and configured to allow selection of a management mode selected from a balancing mode or a testing mode or a charging or discharging mode of operation, further comprising a balancing current circuit having bidirectional switches, a balancing current, which may be drawn from or injected into any one or more of rechargeable energy cells passing through the balancing current circuit, the bidirectional switches being adapted to allow the control unit to select a balancing current to flow from or to an energy storage cell.

In an another aspect a system is provided for use in any of the embodiments of the present invention having a mode selection circuit comprising a group of switches (e.g. bidirectional and unidirectional switches) optionally connected to a single ohmic device, which determines the level of balancing current and executes a dual function process to allow selection of a management mode. The management mode can be selected from a balancing mode or a testing mode or a charging or discharging mode of operation.

In an another aspect a dual function process can be used in any of the embodiments of the present invention to in which a group of cells is used to apply an excitation current for testing another group of cells without using any external supply. One group of cells can be adapted to apply an excitation current for testing another group of cells whereby a means is provided for measuring a response voltage signal to the excitation current. After splitting the series connected energy cells into groups of cells with bidirectional switches a balancing current is drawn from or injected into any one or more of rechargeable energy cells using bidirectional switching, the bidirectional switches being adapted to select a balancing current to flow from or to a cell.

The level of balancing current can be determined using an additional ohmic device connected in parallel with the single ohmic device.

In an another aspect that can be used in any of the embodiments of the present invention an excitation current is applied for testing one group of cells with another group of cells. For example, an externally powered balancing mode can be a passive balancing mode during charging or discharging of the rechargeable energy storage devices, and the internally powered cell balancing can be a series-parallel mode balancing during a rest time. The passive balancing mode can be adapted to protect the rechargeable energy storage cells against overcharge or overdischarge. The series-parallel mode can be adapted to complete balancing of the rechargeable energy storage cells during a rest or idle time.

A group of cells can be configured to apply an excitation current for testing another group of cells further comprising means for measuring a response voltage signal to the excitation current. The response voltage signal can be converted from a time to a frequency domain, e.g. by using an orthogonal set of waves or wavelets, e.g. using a discrete Fourier transform and the AC impedance can be computed as a function of frequency levels. An SoH of the rechargeable energy storage cells can be computed using said AC impedance. The SoH of the rechargeable energy storage cells can be computed using a generic aging model.

DEFINITIONS

A "bidirectional switching device" refers to one or more switches and diode devices, which allow current to flow selectively in one of two directions through the switching device. The switches can be discrete components such as reed relays in parallel with a diode. Alternatively, the switches can be transistors. The diodes may be discrete components or can be a diode connected transistor for example.

A "unidirectional switching device" refers to one or more switches and optionally diode devices, which allow current to flow selectively in only one direction through the switching device. The switch or switches can be discrete components such as a reed relay in series with a diode. The diode may be a discrete component or can be a diode connected transistor for example. Alternatively, the switches can be single transistors configured to allow current in only one direction.

An "ohmic device" is an electronic device that behaves like, or is, a resistor, or is two or more resistors, e.g. in a resistor circuit, that follows Ohm's law. Therefore current flowing through an ohmic device varies proportionally to the voltage across the device.

A "Dual Function Process" (DFP) means splitting rechargeable energy pack such as a battery pack into two or more independent modules thanks to the arrangement of the dedicated switches (e.g. bidirectional and unidirectional switches optionally connected to a single ohmic device such as a resistor).

An "AC impedance rechargeable energy storage cell heath diagnostic" is a method and/or estimation technique which allows a RESS management system to estimate a diagnostic parameter (i.e., being a, or being related to a, or derived from a, or a function of a SoH) of a cell or pack of cells. The SoH of rechargeable energy storage cells can be estimated from the results of applying an AC-impedance testing mode. Further or alternative diagnostic tests can be used with the present invention and are for example, current diagnostic, voltage diagnostic and a resistance or impedance diagnostic tests, e.g. as indicated in U.S. Pat. Nos. 4,719,427 and 4,361,809, which are incorporated herewith by reference.

DETAILED DESCRIPTION OF THE INVENTION

The present invention relates to a modular management system for rechargeable energy storage cells or cell packs with a new configuration and an advanced scenarios to provide a smart arrangement. The same configuration supported by management system is designed for monitoring, protecting, balancing, charging, testing and controlling a RESS that are connected in series.

Figure 1:
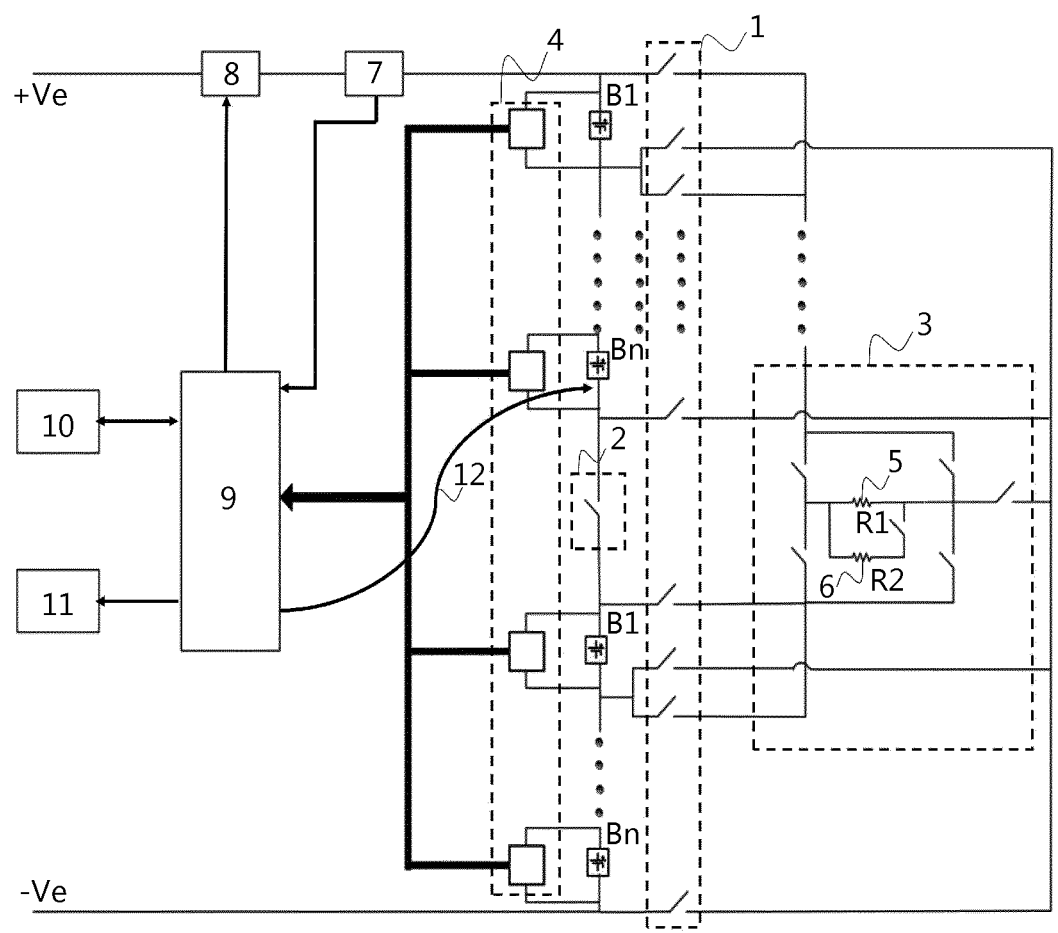
FIG. 1 illustrates a modular management system according to an embodiment of the present invention.
Figure 2:
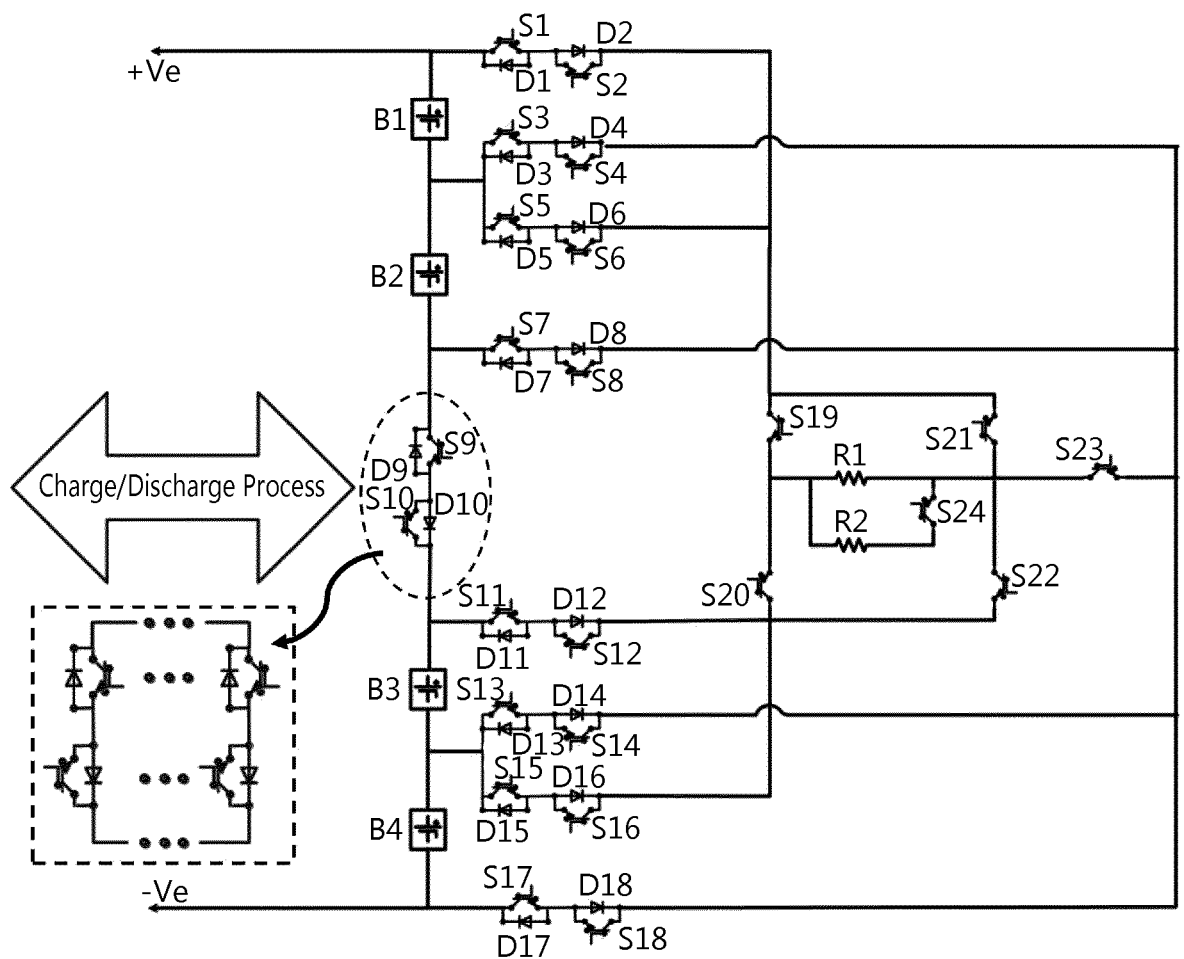
FIG. 2 illustrates an embodiment the present invention for four battery cells.

Figure 1and FIG. 2 illustrate a management circuit in accordance with an embodiment of the present invention. This system has two groups of switching devices or switches: a balancing current circuit (1) comprising bidirectional switching devices, which comprise bidirectional switches S1, S2; S3, S4; S5, S6; S7, S8; S11, S12; S13, S14; S15, S16; S17, S18. A mode selection circuit (3) is provided comprising unidirectional switching devices or switches S19 . . . S23 and a cell splitting circuit (2) comprising bidirectional switching devices or switches S9, S10. A balancing current, which may be drawn from or injected into any one or more of rechargeable energy cells B1 to B4, passes through the balancing current circuit (1), e.g., composed of bidirectional switching devices. The bidirectional switching devices of the balancing current circuit (1) can comprise, or can consist of, two switches (i.e., S1 and S2; S3, S4; S5, S6; S7, S8; S11, S12; S13, S14; S15, S16; S17, S18) each switch being coupled in series with a first diode device and each switch being coupled in parallel to a second diode device, as shown in FIG. 2, whereby one diode D1, for example is reverse connected compared with the other diode D2. These bidirectional switching devices or switches (1) allow a control unit (9) to select a balancing current to flow from or to a cell.

The mode selection circuit (3) comprises unidirectional switching devices or switches S19 . . . S23, which include single switches such as transistors S19, S20, S21, S22, S23 and S24 (see FIG. 2), are adapted and configured to allow selection of a management mode such as balancing mode or a testing mode or a charging or discharging mode of operation. A test process such as a DFP, for example, can be executed by a splitting circuit (2) configured to split the rechargeable energy cell pack such as a battery pack into two or more independent modules. The splitting circuit (2) can include a series connection of bidirectional switching devices or switches S9, S10 which can split the cell pack B1 to B4, into an upper module B1+B2 and a lower module B3+B4 or for any number of cells. Each split module is a power supply itself and each such module can be used as a means to balance and/or to test another such module in an RESS internally powered balancing or diagnostic process embodiment. This can avoid the need for an external power supply for balancing or test processes although provision of an external power supply is not excluded from the scope of the present invention, although less preferred. As shown in FIG. 2, serial connected switches S9 and S10, with reverse connected diodes D9 and D10 connected respectively in parallel to switches S9 and S10 represent the series bidirectional switching device for splitting into modules. Since the required current for balancing and testing the battery cells is relatively low (i.e., less than 5 A), there is no need to increase the parallel redundancy of the unidirectional and/or bidirectional switching devices or switches that are used in this invention, representing economic infeasibility. However, the charging/discharging current passes through switching devices or switches (S9, S10), which therefore need to pass relatively high currents (i.e. >50 A), depending on the battery system size, capacity and the load demand. Therefore, practically, a series connection of bidirectional switching devices or switches (S9 and S10) can be extended with more switching devices or switches connected in parallel (as shown in the inset of FIG. 2) in order to share the battery current during discharging and charging modes, and to reduce the cost and size of these switching devices or switches. A single ohmic device (5) such as a resistor R1 can be used for balancing and/or testing. One or more additional but optional ohmic devices (6) such as resistor R2 may be added in parallel to resistor R1 to increase the balancing current and to decrease the balancing time. Each such additional ohmic device is preferably controlled by a further switching device or switch.

The voltage of each rechargeable energy cell B1 to B4 is individually monitored by a voltage sensing means (4). The voltage sensing means (4) can be provided by an array (4) of voltage sensors, whereby one such sensor can be adapted to measure the voltage of one cell B1 to B4. Alternatively, one sensor may be switched to a cell to be measured (not shown). The voltage sensing means (4) such as the array of voltage sensors can communicate with a central control unit (9) and hence have a means for communicating the voltage measurement results to the central control unit (9). The central control unit (9) has a means for receiving the results of the voltage measurements (e.g. I/O port (10), or network or bus interface) and also has means for storing these values (i.e. memory) and for processing these values (i.e. processing engine).

The temperature of the battery pack is monitored by means of a temperature measuring means such as a temperature gauge (12). The pack temperature is also communicated to the central control unit (9) and hence the temperature measuring means have means for communicating the temperature measurement results to the central control unit (9). Hence, the central control unit (9) has a means for receiving the results of the temperature measurements (e.g. I/O port (10), or network or bus interface) and also has means for storing (i.e. memory) these values and for processing these values (i.e. a processing engine).

The pack current of the rechargeable energy cell pack such as a battery pack is monitored by a current monitoring device (7) and the current values which are results of the current measurements are communicated to the central control unit (9). Hence, current monitoring device (7) has means for communicating the current measurement results to the central control unit (9). The central control unit (9) has a means for receiving the results of the current measurements (e.g. I/O port, or network or bus interface) and also has means for storing these values (i.e. memory) and for processing these values (i.e. a processing engine).

The energy storage pack voltage is also preferably monitored and the values, which are results of the pack voltage measurements are communicated to the central control unit (9). Means are provided for measuring the pack voltage and for communicating the pack voltage measurement results to the central control unit (9). Hence, the central control unit (9) has a means for receiving the results of the pack voltage measurements (e.g. I/O port, or network or bus interface) and also has means for storing these values (i.e. memory) and for processing these values (i.e. a processing engine).

The performance of rechargeable energy storage cells such as batteries can be based on one, some or all of the measured values mentioned above and accumulated during the operation of balancing and/or testing modes. Performance can be displayed on a user display such as an LCD device (11) or communicated to external (the outside world) through an interface such as through an I/O port (10), a network interface or via a bus such as a CAN-Bus, or a serial connection such as a USB port. The rechargeable energy storage cell pack such as a battery pack preferably has means for disconnection e.g. via means of a protection relay (8) under control of the central control unit (9) in case of a fault or for carrying out an on-board diagnostic self-powered test.

Figure 3:
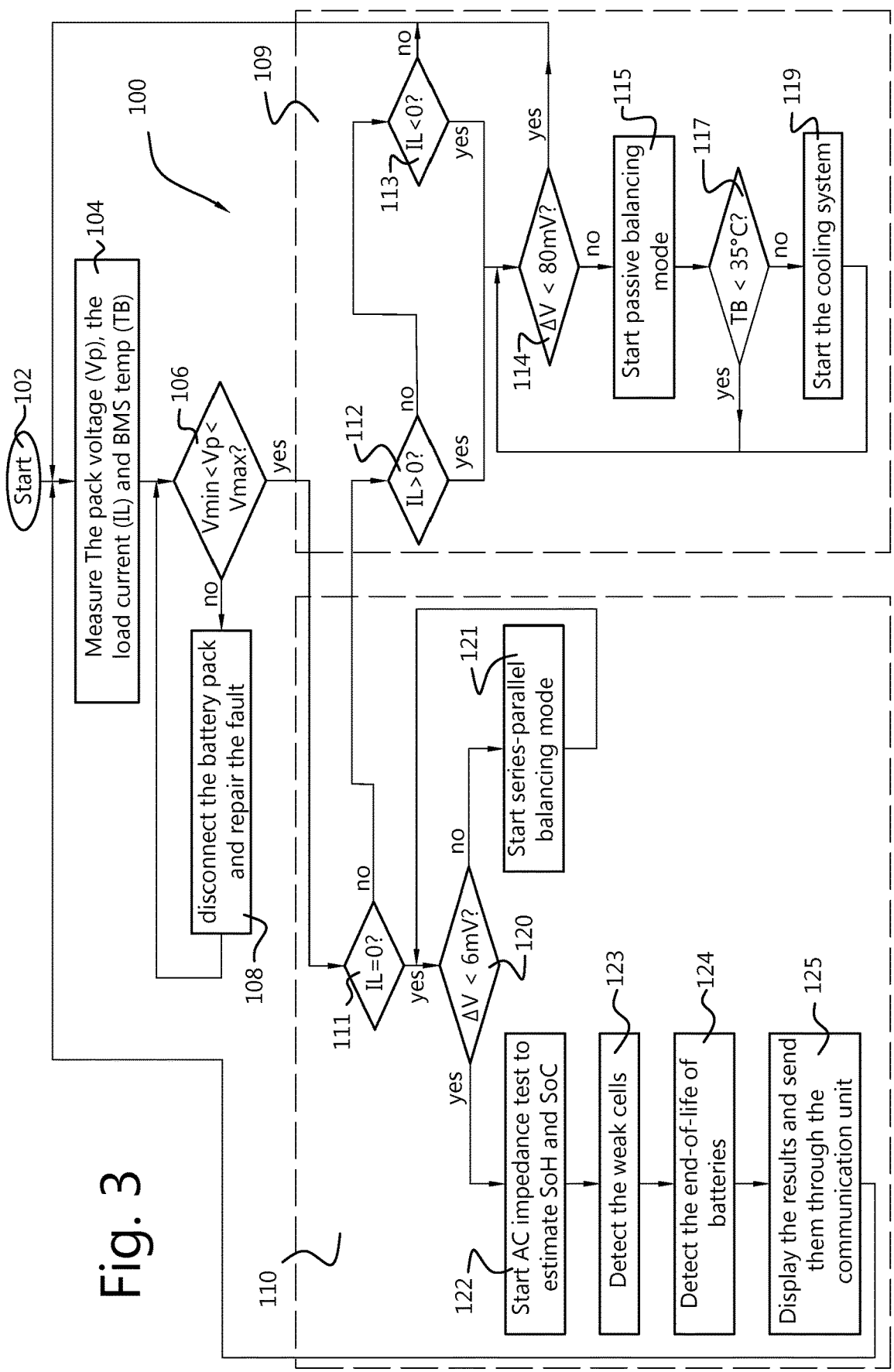
FIG. 3 illustrates a flowchart of battery management devices' operation of FIG. 1 according to an embodiment of the present invention.

FIG. 3 illustrates an operation flow chart of an embodiment of the present invention. In order to ensure data accuracy, it is preferable if all data, such as pack voltage, current flow, cell voltage, cell temperature are calibrated initially, and preferably automatically. Firstly, each cell voltage, pack voltage, pack current and temperature are frequently measured by the relevant sensors, (4), (7), (12), etc., and transmitted to the controller unit (9). Then a control algorithm according to embodiments of the present invention running on the control unit (9) processes this data using a processing engine in order to decide on, and to implement the pack management system function or functions that should be performed. The control unit (9) has a digital processing engine such as a microprocessor, or an FPGA as well as memory. The control unit (9) can be configured as a stand-alone device e.g. can be configured as a microcontroller, or can an integrated or embedded control unit. The control unit (9) has sufficient processing power and memory to implement the management systems and to execute methods according to embodiments of the present invention.

The process flow 100 of FIG. 3 begins with step 102. At the start and before the management system function or functions that should be performed have started, it is preferred if certain safety checks are carried out. One such safety function preferably performed by the control unit (9) is checking the pack voltage $V_p$ to ensure that the RESS cell pack is safe to be used. For example, the RESS cell pack voltage $V_p$, the load current $I_L$ delivered by the RESS cell pack and the RESS cell pack temperature $T_B$ are measured in step 104 using the relevant sensors (4), (7), (12), etc., and can be communicated to the control unit 9 and the values buffered or stored there. In step 106, the measured pack voltage $V_p$ is compared with a maximum value $V_{max}$ by the controller (9) and optionally compared with a minimum value $V_{min}$. One such comparison or both comparisons can be carried out by the control unit (9). If the measured pack voltage $V_p$ exceeds the maximum value $V_{max}$ the RESS cell pack is disconnected (e.g. by the control unit (9) sending a disconnect signal to protection relay (8)), in step 108 to allow repair or investigation. If a pack is totally discharged, the pack voltage $V_p$ can be close to zero so a low value is not necessarily a fault. However, if the pack voltage $V_p$ is lower than a minimum threshold value $V_{min}$ the flow may optionally also exit to step 108. If step 106 is YES, the current sensor (7) and more preferably if the control unit (9), can check whether the RESS cell pack is in charging or discharging operation (109) or resting in idle mode (110). For example, in step 111 the control unit (9) can check if the load current is zero, indicating an idle state (110). If step 111 is NO, the control unit (9) can check, in step 112, if the load current is greater than zero indicating a charging state (109) (or discharging state, depending upon how the circuit is arranged). If step 112 is NO, the control unit (9) checks in step 113 whether the load current is less than zero indicating a discharging (or charging) state. During the charging/discharging operation (109), the voltage sensors (4) continuously communicate the voltage data to the central control unit (9) for determining whether there is any underperforming cell. If YES in steps 112 and 113, an underperforming cell can be determined for example by comparing a minimum cell voltage with a maximum cell voltage value of some or all of the cells in the rechargeable energy storage pack such as a battery pack. For example, once this voltage difference exceeds a threshold value as in step 114, e.g. exceeds 80 mV, the passive balancing mode is started e.g. by the control unit (9), in step 115. The passive balancing mode can be implemented for at least partial balancing of the cells in the rechargeable energy storage pack such as a battery pack by using a single ohmic device such as a resistor. At the same time, the heat loss of the RESS cell pack is preferably monitored to control the cooling system in order to maintain the temperature of the balancing circuit and/or the RESS cell pack below a maximum temperature, e.g. at or around 35° C. For example, in step 117, the control unit (9) checks if the pack temperature $T_B$ is less than a maximum temperature such as 35° C. If YES in step 117, the passive balancing mode is continued until the voltage difference determined in step 115 is below a threshold value such as 80 mV at which point the control restarts at step 104. If NO in step 117, the control unit (9) starts a cooling system in step 119 and the flow returns to step 114.

Various additional steps may be carried out (not shown in FIG. 3), such as entering step 108 (e.g. under control of the control unit (9)) if there is an indication that the cooling system is not controlling the temperature of the cell pack and/or the balancing circuit correctly. For example, if in a number of consecutive time periods step 117 is NO, then this can indicate that the pack is spiralling out of control and step 108 can be entered (e.g. under control of the control unit (9)). Alternatively step 117 can include the control unit (9) checking whether the pack and/or the balancing circuit temperature $T_B$ is less than a first maximum temperature of the balancing circuit such as 35° C. and does not exceed a second maximum temperature of the pack such as 55° C. or 80° C. In case it exceeds the second maximum temperature of the pack, step 108 is entered (e.g. under control of the control unit (9)). Further, steps 112 and 113 can include the control unit (9) performing the additional step of checking if the load current is greater than a maximum absolute value. Exceeding such a value could indicate a short circuit and, hence, step 108 is entered by controller (9).

If YES in step 111, the RESS cell pack is assumed to be idle (110) and flow moves to step 120 where the control unit (9) checks if a difference between the maximum cell voltage and a minimum cell voltage for the cells of the RESS cell pack is less than a certain value, e.g. less than 6 mV. In case of idle operation (110), one or more modes can preferably be selected, e.g. based on the order of operation. For example, if step 120 is NO a series-parallel balancing mode is started by the control unit (9) in step 121 and in a later time step the flow returns to step 120. If the series-parallel balancing mode works correctly it will completely balance the cells and the check in step 120 will reveal that the voltage difference measured in that step is less than a threshold value, e.g. less than 6 mV. Various additional steps may be carried out (not shown in FIG. 3), such as entering step 108; for example, if the series-parallel balancing mode fails to reduce the difference voltage in step 120 after a long time period.

If Step 120 is YES, a testing mode can be started in step 122. Prior to step 122, the RESS can be disconnected from any load using the protection relay (8) for example, under the control of the control unit (9). In step 122 an on-board diagnostic test can be carried out, e.g. powered by a number of cells in one part of the RESS. For example, the diagnostic test can be the determination of an estimate of a SoH of the RESS cells such as battery cells. From additional steps such as steps 122 to 124 an end-of-life of cells of the RESS pack can be determined, e.g. by identifying weak cells, which, for example indicate a poor SoH based on an AC impedance diagnostic test, e.g. have high AC impedance (i.e. greater than 15 mΩ) in step 123 or defective cells such as open circuit cells or short circuited cells detected in step 124. The results of steps 122 or 124 can be displayed on display (11) or communicated to a user in any other suitable way, e.g. through an I/O port (10) or via a bus such as a CAN bus Any defective cell can be replaced or the complete pack can be replaced.

Operation of an RESS cell pack based on the structure of the battery management circuit in FIG. 2 will be described based on simulation results of an RESS cell pack of four lithium-ion battery cells.

Passive Balancing Mode

During charge and discharge process 109, the passive balancing mode in step 115 can work directly in order to at least partially balance the battery cells by using a single ohmic device (5) such as a single resistor (R1 of FIG. 2). FIG. 4 and FIG. 5 illustrate four operating cases of the passive balancing mode during charging/discharging. The function of the unidirectional switching devices or switches (S19, S20 . . . S23 of FIG. 2) is to connect the single ohmic device (5) such as single resistor R1 and a battery cell B1-B4 in parallel, which has the highest energy, based on the location of battery cell in the battery string B1 to B4.

Figure 4A:
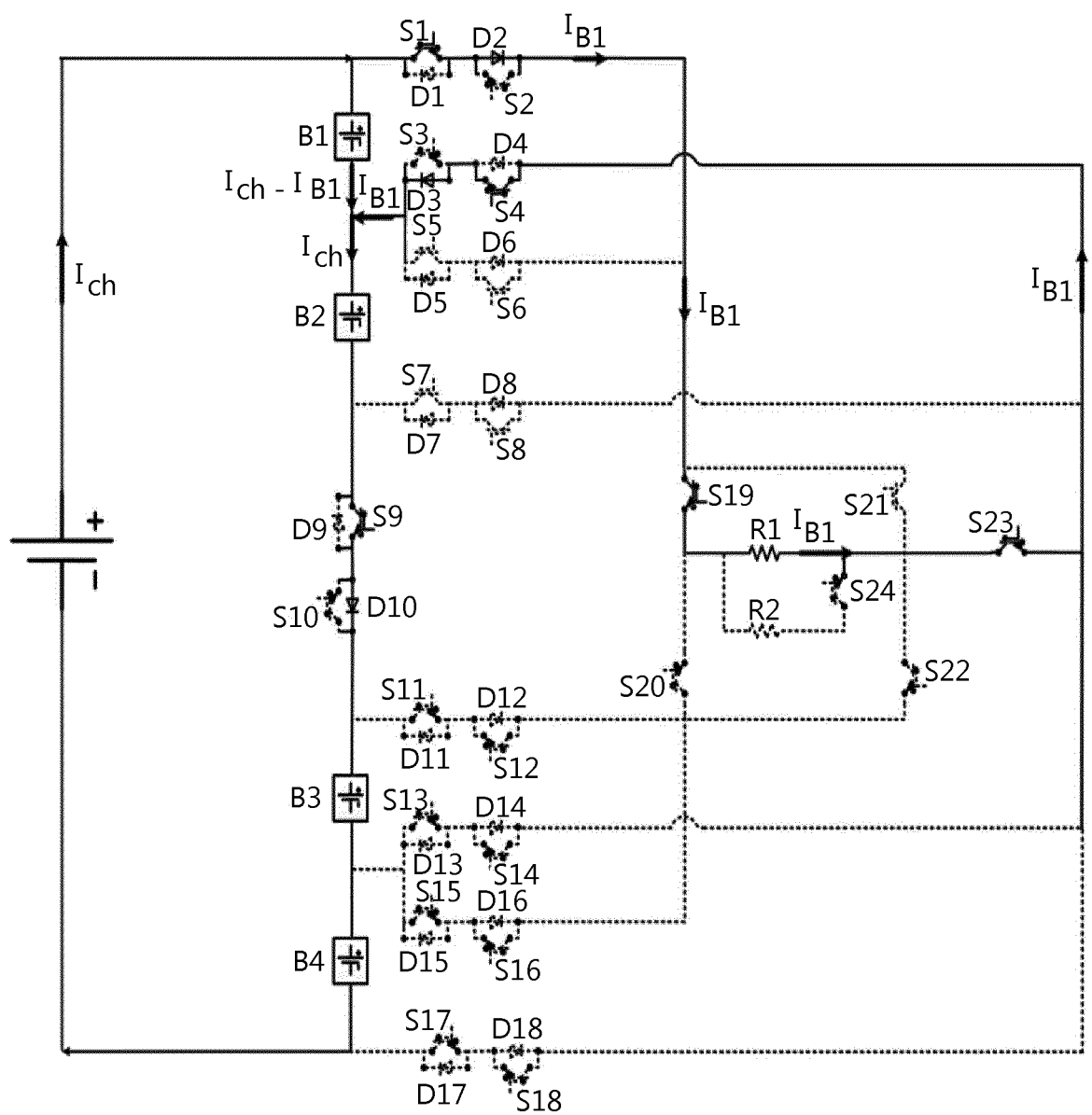
FIGS. 4a to d illustrate four operating cases of passive balancing mode according to an embodiment of the present invention during charge using single resistor a) battery cell B1, b) battery cell B2, c) battery cell B3, and c) battery cell B4

FIG. 4a illustrates the RESS cell pack of FIGS. 1 and 2 subject to a charging current $I_{ch}$ flowing from a charging power supply. The control unit (9) has determined that cell B1 has a high or the highest state of charge and hence a low or lower need of charging current. The charging pack current $I_{ch}$ is reduced by a balancing current $I_{B1}$ for cell B1, in comparison with the other cells B2 to B4 which all receive the full charging current $I_{ch}$ which flows through switch S9 and diode D10 in series with it. The balancing current $I_{B1}$ flows through switch S1 and the diode D2 which is in series with switch S1, and then it flows through switching device or switch S19 and not through switching devices or switches S21 and S20 which are turned-off. The current $I_{B1}$ flows through the single ohmic device (5), i.e. single resistor R1 and through switching devices or switches 23 and S4 and diode D3 which is in series with S4 and in parallel with switch S3 which is turned-off. The charging current for cell B1, which has a high or the highest state of charge and hence a lower need of charging current, is $I_{ch}-I_{B1}$. The value of the current $I_{B1}$ is determined by the voltage drop across cell B1 divided by the resistive impedance in the circuit S1, D2, S19, R1, S23, S4, D3 which includes the resistance of resistor R1. If a higher balancing current is desired then switching device or switch S24 can be turned-on and the resistor R2 is connected in parallel with R1 hence reducing the resistance and increasing current $I_{B1}$. More parallel paths (not shown) which add in further resistors like R2 can be added to resistor R1.

Figure 4B:
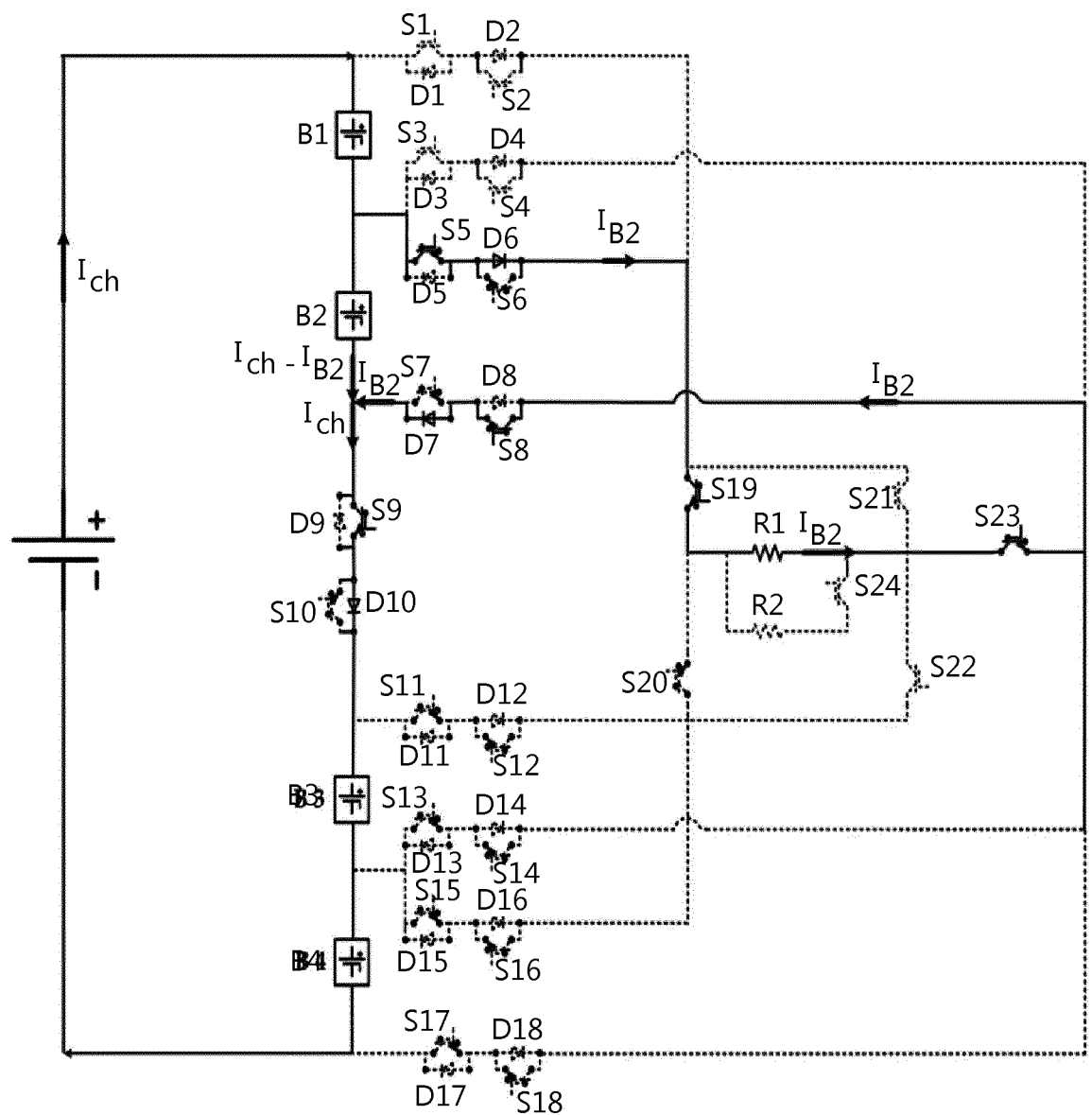
Figure 4C:
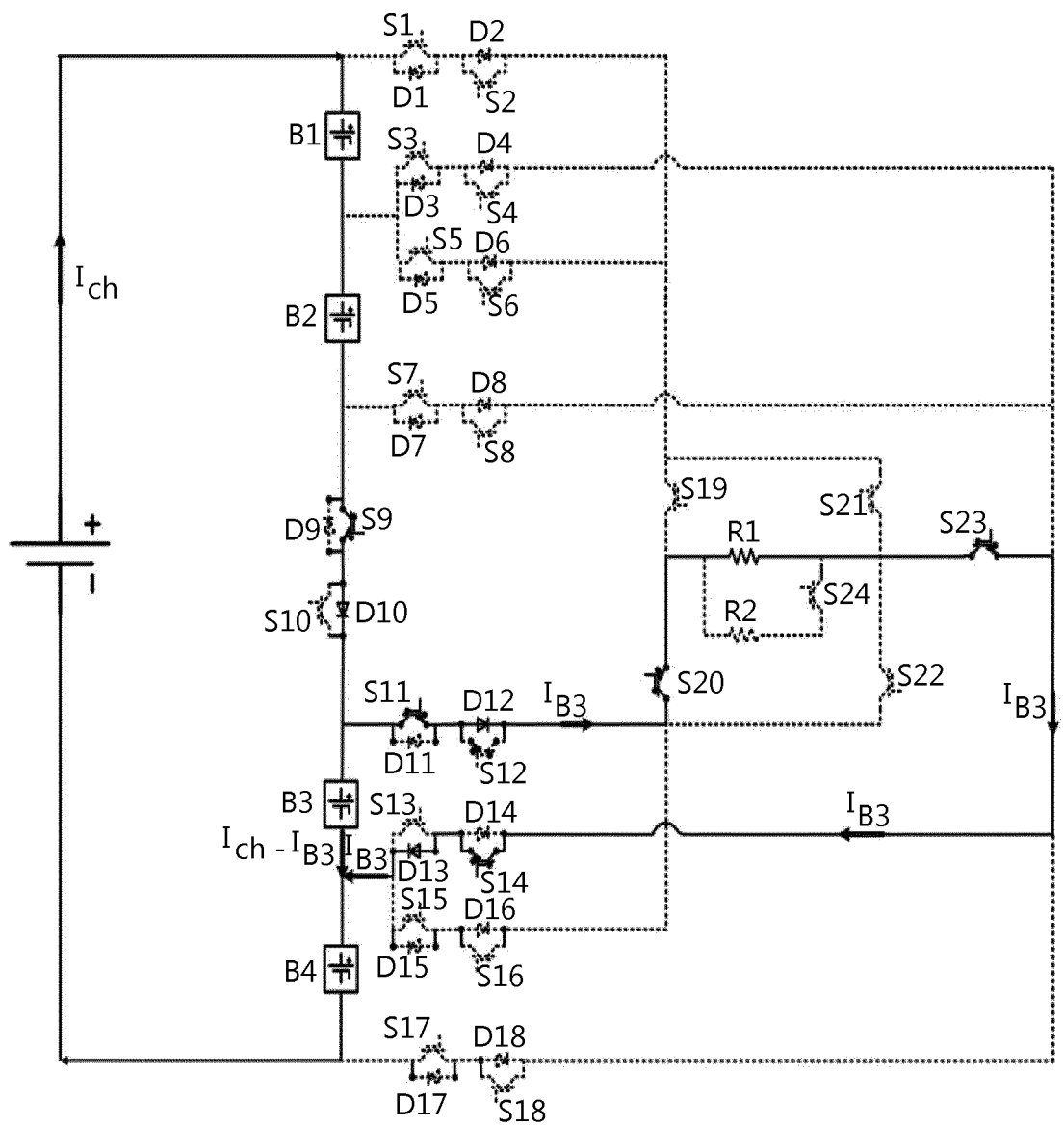
Figure 4D:
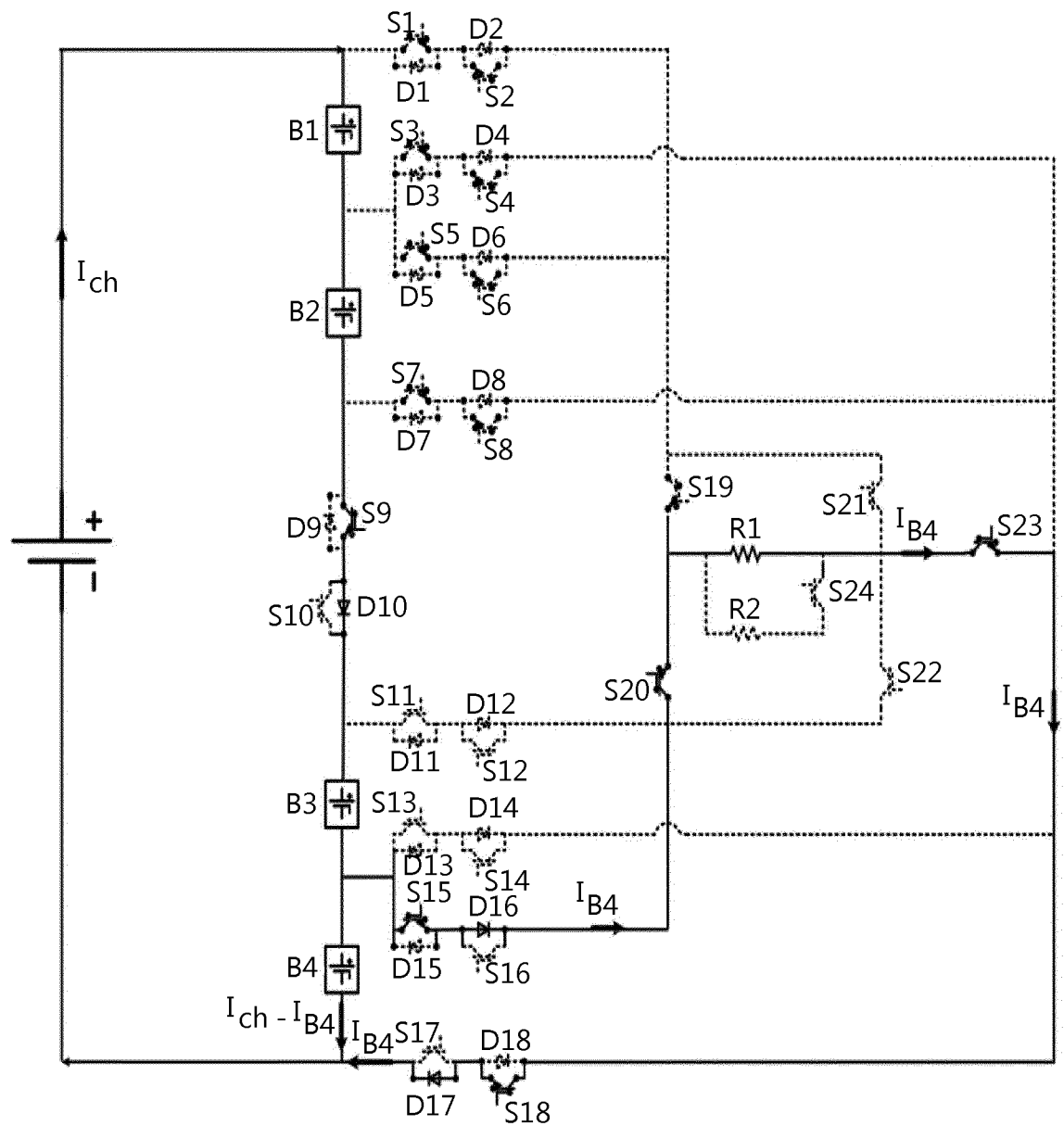

FIGS. 4b to d show similar charging operations, which reduce the charging current in one or more cells B1 to B4. FIG. 4b illustrates the RESS cell pack of FIGS. 1 and 2 subject to a charging current $I_{ch}$ flowing from a charging power supply. The control unit (9) has determined that cell B2 has a high or the highest state of charge and hence a low or lower need of charging current. The charging pack current $I_{ch}$ is reduced by a balancing current $I_{B2}$ for cell B2, in comparison with the other cells B1, B3, B4 which all receive the full charging current $I_{ch}$ which flows through switch S9 and diode D10 in series with it. The balancing current $I_{B2}$ flows through switch S5 and the diode D6 which is in series with switch S5. It then flows through switching device or switch S19 and not through switching devices or switches S21 and S20 which are turned-off. The current $I_{B2}$ flows through the single ohmic device 5, i.e. single resistor R1 and through switches S23 and S8 and diode D7 which is in series with S8 parallel with switch S7 which is turned-off. The charging current for cell B2, which has a high or the highest state of charge and hence a low or lower need of charging current, is $I_{ch}-I_{B2}$. The value of the current $I_{B2}$ is determined by the voltage drop across cell B2 divided by the resistive impedance in the circuit S5, D6, S19, R1, S23, S8, D7 which includes the resistance of resistor R1. If a higher current is desired then switching device or switch S24 can be turned-on and the resistor R2 is connected in parallel with R1 hence reducing the resistance and increasing current $I_{B2}$. More parallel paths which add in further resistors like R2 (not shown) can be added to resistor R1. If switching device or switch S1 is turned-on instead of S5 (not shown), the reduced charging current $I_{ch}-I_B$ flows through B1 and B2.

FIG. 4c illustrates the RESS cell pack of FIGS. 1 and 2 subject to a charging current $I_{ch}$ flowing from a charging power supply. The control unit (9) has determined that cell B3 has a high or the highest state of charge and hence a lower need of charging current. The charging pack current $I_{ch}$ is reduced by a balancing current $I_{B3}$ for cell B3, in comparison with the other cells B1, B2, B4 which all receive the full charging current $I_{ch}$ which flows through switch S9 and diode D10 in series with it. The balancing current $I_{B3}$ flows through switch S11 and the diode D12 which is in series with switch S11. It then flows through switching device or switch S20 and not through switching devices or switches S19 and S21 which are turned-off. The current $I_{B3}$ flows through the single ohmic device 5, i.e. single resistor R1 and through switches 23 and S14 and diode D13 which is in series with S14 parallel with switch S13 which is turned-off. The charging current for cell B3, which has a high or the highest state of charge and hence a low or lower need of charging current, is $I_{ch}-I_{B3}$. The value of the current $I_{B3}$ is determined by the voltage drop across cell B3 divided by the resistive impedance in the circuit S11, D12, S20, R1, S23, S14, D13 which includes the resistance of resistor R1. If a higher current is desired then switching device or switch S24 can be turned-on and the resistor R2 is connected in parallel with R1 hence reducing the resistance and increasing current $I_{B3}$. More parallel paths which add in further resistors like R2 (not shown) can be added to resistor R1.

FIG. 4d illustrates the RESS cell pack of FIGS. 1 and 2 subject to a charging current $I_{ch}$ flowing from a charging power supply. The control unit (9) has determined that cell B4 has a high or the highest state of charge and hence a lower need of charging current. The charging pack current $I_{ch}$ is reduced by a balancing current $I_{B4}$ for cell B4, in comparison with the other cells B1, B2, B3 which all receive the full charging current $I_{ch}$ which flows through switch S9 and diode D10 in series with it. The balancing current $I_{B4}$ flows through switch S15 and the diode D16 which is in series with switch S15. It then flows through switching device or switch S20 and not through switching devices or switches S19 and S21 which are turned-off. The current $I_{B4}$ flows through the single ohmic device 5, i.e. single resistor R1 and through switches 23 and S18 and diode D17 which is in series with S18 parallel with switch S17 which is turned-off. The charging current for cell B4, which has a high or the highest state of charge and hence a a low or lower need of charging current, is $I_{ch}-I_{B4}$. The value of the current $I_{B4}$ is determined by the voltage drop across cell B4 divided by the resistive impedance in the circuit S15, D16, S20, R1, S23, S18, D17 which includes the resistance of resistor R1. If a higher current is desired then switching device or switch S24 can be turned-on and the resistor R2 is connected in parallel with R1 hence reducing the resistance and increasing current $I_{B4}$. More parallel paths which add in further resistors like R2 (not shown) can be added to resistor R1. If switching device or switch S11 is turned-on instead of switching devices or switch S15 (not shown), the reduced charging current $I_{ch}-I_B$ flows through B3 and B4.

Figure 5A:
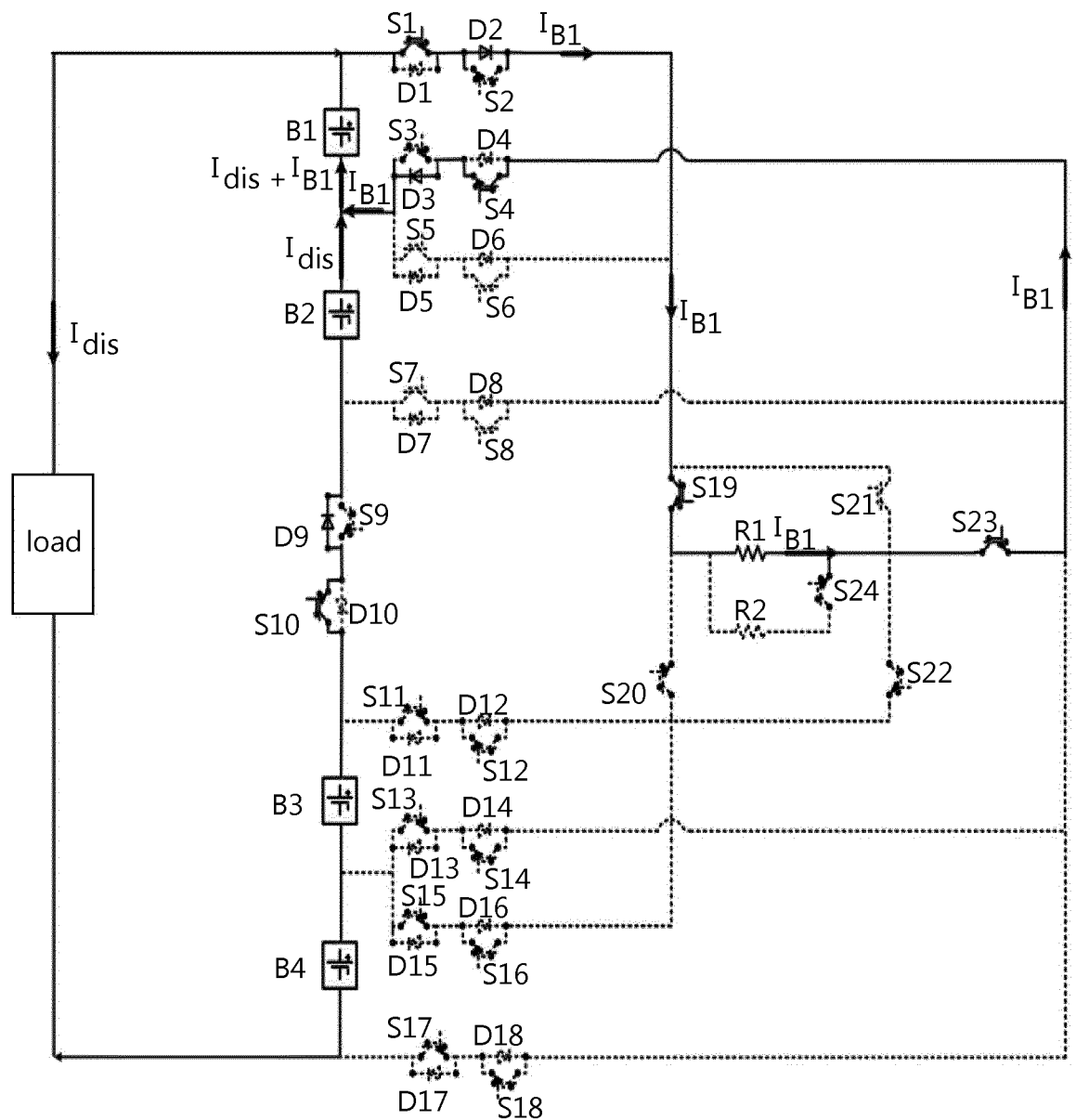
FIGS. 5a to d illustrate four operating cases of passive balancing mode according to an embodiment of the present invention during discharge by using single resistor: a) battery cell B1, b) battery cell B2, c) battery cell B3, and d) battery cell B4

FIGS. 5a to 5d show the same RESS system of FIGS. 4a to 4d for the discharging mode with a load current $I_{dis}$ though a load. The switch operations are equivalent to those described for FIGS. 4a to 4d. FIG. 5a illustrates the RESS cell pack of FIGS. 1 and 2 providing a discharging current $I_{dis}$ into a load. The control unit (9) has determined that cell B1 has a high or the highest state of charge and hence can provide more discharging current. The discharging pack current $I_{dis}$ is increased by a balancing current $I_{B1}$ for cell B1, in comparison with the other cells B2 to B4 which all experience the discharging current $I_{dis}$ which flows through switch S10 and diode D9 in series with it. The balancing current $I_{B1}$ flows through switch S1 and the diode D2 which is in series with switch S1. It then flows through switching device or switch S19 and not through switching devices or switches S21 and S20 which are turned-off. The current $I_{B1}$ flows through the single ohmic device 5, i.e. single resistor R1 and through switching devices or switches 23 and S4 and diode D3 which is in series with S4 and in parallel with switch S3 which is turned-off. The discharging current for cell B1, which has a high or the highest state of charge and hence can provide more discharging current, is $I_{dis}+I_{B1}$. The value of the current $I_{B1}$ is determined by the voltage drop across cell B1 divided by the resistive impedance in the circuit S1, D2, S19, R1, S23, S4, D3 which includes the resistance of resistor R1. If a higher current is desired then switching device or switch S24 can be turned-on and the resistor R2 is connected in parallel with R1 hence reducing the resistance and increasing current $I_{B1}$. More parallel paths (not shown) controlled by a switching device or switch, which add in further resistors like R2 can be added to resistor R1.

Figure 5B:
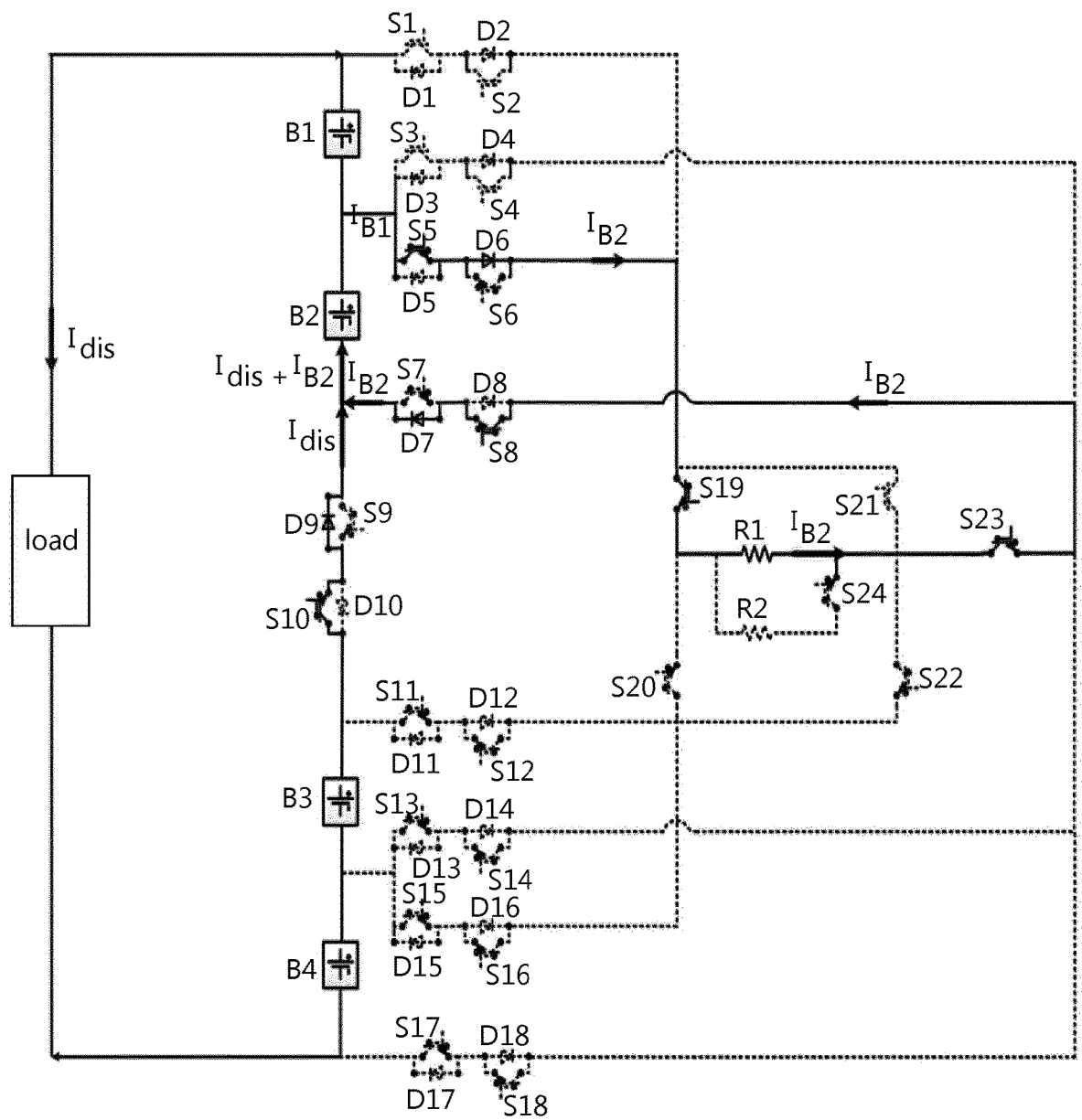

FIG. 5b illustrates the RESS cell pack of FIGS. 1 and 2 subject to a discharging current $I_{dis}$ flowing through a load. The control unit (9) has determined that cell B2 has a high or the highest state of charge and hence is able to supply more discharging current. The discharging pack current $I_{dis}$ is increased by a balancing current $I_{B2}$ for cell B2, in comparison with the other cells B1, B3, B4 which all experience the discharging current $I_{dis}$ which flows through switch S10 and diode D9 in series with it. The balancing current $I_{B2}$ flows through switch S5 and the diode D6 which is in series with switch S5. It then flows through switching device or switch S19 and not through switching devices or switches S21 and S20 which are turned-off. The current $I_{B2}$ flows through the single ohmic device 5, i.e. single resistor R1 and through switching devices or switches S23 and S8 and diode D7 which is in series with S8 parallel with switch S7 which is turned-off. The discharging current for cell B2, which has a high or the highest state of charge and hence a low or lower need of charging current, is $I_{ch}+I_{B2}$. The value of the current $I_{B2}$ is determined by the voltage drop across cell B2 divided by the resistive impedance in the circuit S5, D6, S19, R1, S23, S8, D7 which includes the resistance of resistor R1. If a higher current is desired then switching device or switch S24 can be turned-on and the resistor R2 is connected in parallel with R1 hence reducing the resistance and increasing current $I_{B2}$. More parallel paths which add in further resistors like R2 (not shown) controlled by a switch can be added to resistor R1. If switching device or switch S1 is turned-on instead of switching device or switch S5 (not shown), the increased discharging current $I_{ch}+I_B$ flows through B1 and B2.

Figure 5C:
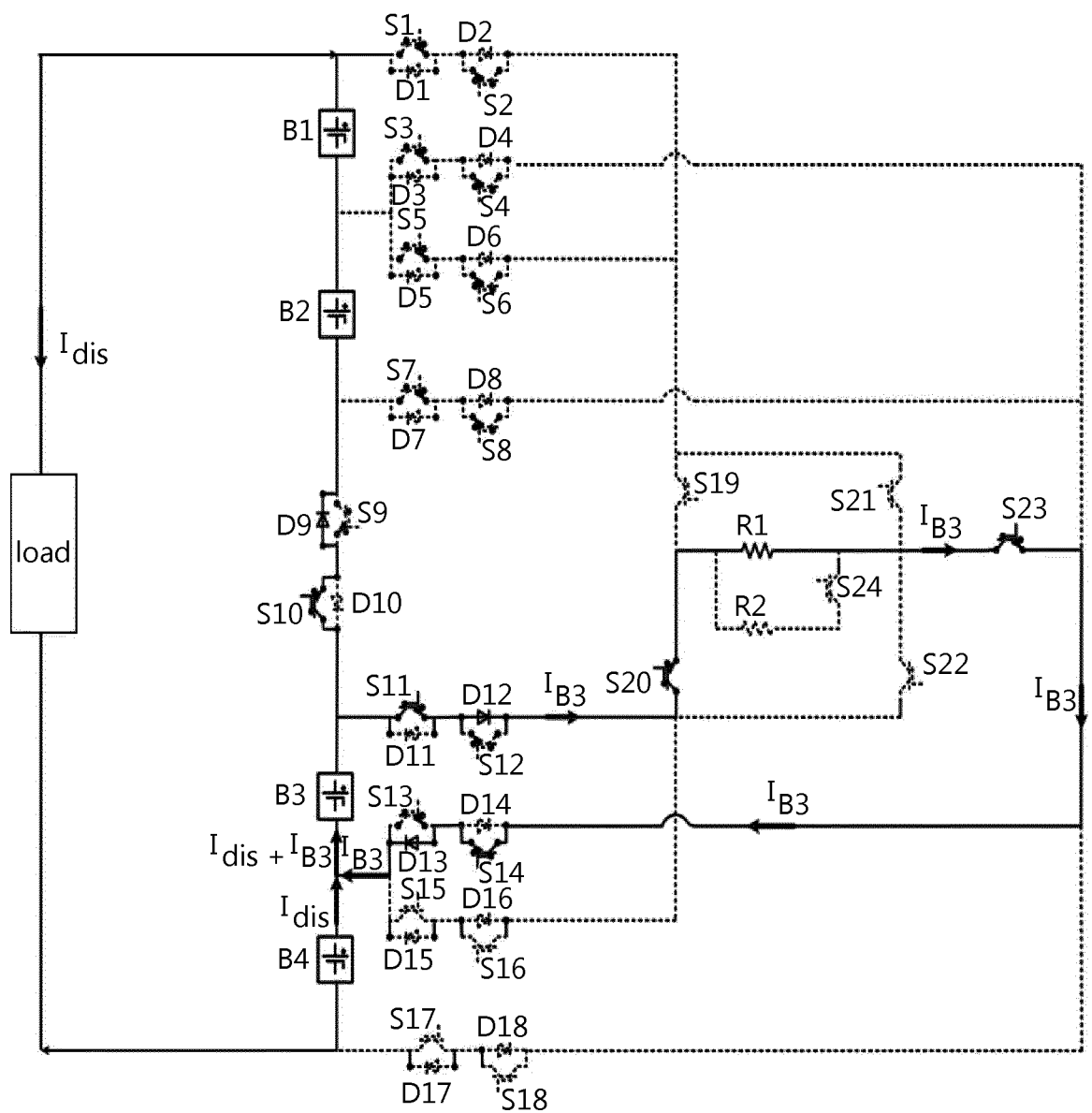

FIG. 5c illustrates the RESS cell pack of FIGS. 1 and 2 subject to a discharging current $I_{dis}$ flowing through a load. The control unit (9) has determined that cell B3 has a high or the highest state of charge and hence can provide a higher discharging current. The discharging pack current $I_{dis}$ is increased by a balancing current $I_{B3}$ for cell B3, in comparison with the other cells B1, B2, B4 which all experience the discharging current $I_{dis}$ which flows through switch S10 and diode D9 in series with it. The balancing current $I_{B3}$ flows through switch S11 and the diode D12 which is in series with switch S11. It then flows through switching device or switch S20 and not through switching devices or switches S19 and S21 which are turned-off. The current $I_{B3}$ flows through the single ohmic device 5, i.e. single resistor R1 and through switching devices or switches 23 and S14 and diode D13 which is in series with S14 parallel with switching device or switch S13 which is turned-off. The discharging current for cell B3, which has a high or the highest state of charge and hence can provide more discharging current, is $I_{dis}+I_{B3}$. The value of the current $I_{B3}$ is determined by the voltage drop across cell B3 divided by the resistive impedance in the circuit S11, D12, S20, R1, S23, S14, D13 which includes the resistance of resistor R1. If a higher current is desired then switching device or switch S24 can be turned-on and the resistor R2 is connected in parallel with R1 hence reducing the resistance and increasing current $I_{B3}$. More parallel paths which add in further resistors like R2 (not shown) controlled by a switching device or switch, can be added to resistor R1.

Figure 5D:
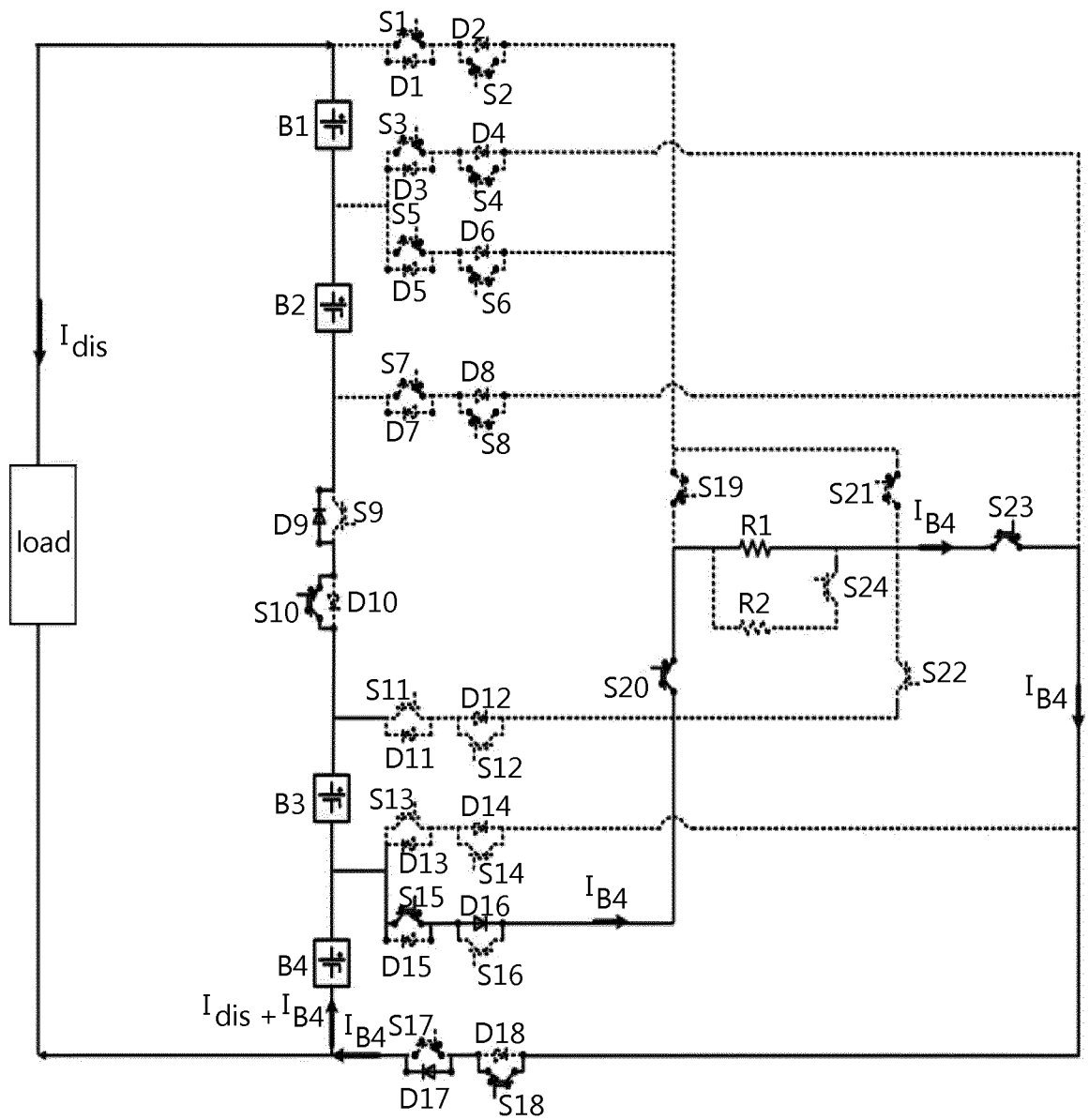

FIG. 5d illustrates the RESS cell pack of FIGS. 1 and 2 subject to a discharging current $I_{dis}$ flowing through a load. The control unit (9) has determined that cell B4 has a high or the highest state of charge and hence can supply more discharging current. The discharging pack current $I_{dis}$ is increased by a balancing current $I_{B4}$ for cell B4, in comparison with the other cells B1, B2, B3 which all receive the discharging current $I_{dis}$ which flows through switch S10 and diode D9 in series with it. The balancing current $I_{B4}$ flows through switch S15 and the diode D16 which is in series with switch S15. It then flows through switching device or switch S20 and not through switching devices or switches S19 and S21 which are turned-off. The current $I_{B4}$ flows through the single ohmic device 5, i.e. single resistor R1 and through switching devices or switches 23 and S18 and diode D17 which is in series with S18 parallel with switching device or switch S17 which is turned-off. The discharging current for cell B4, which has a high or the highest state of charge and hence can provide more discharging current, is $I_{dis}+I_{B4}$. The value of the current $I_{B4}$ is determined by the voltage drop across cell B4 divided by the resistive impedance in the circuit S15, D16, S20, R1, S23, S18, D17 which includes the resistance of resistor R1. If a higher current is desired then switching device or switch S24 can be turned-on and the resistor R2 is connected in parallel with R1 hence reducing the resistance and increasing current $I_{B4}$. More parallel paths which add in further resistors like R2 (not shown) controlled by a switching device or switch can be added to resistor R1. If switching device or switch S11 is turned-on instead of switching device or S15 (not shown), the increased discharging current $I_{ch}+I_B$ flows through B3 and B4.

Figure 6:
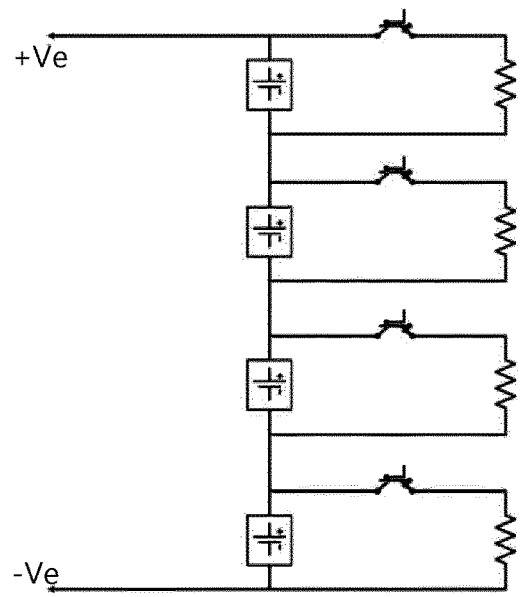
FIG. 6 illustrates switched shunt ohmic resistors (passive balancing) by using multiple ohmic resistors according to an embodiment of the present invention.
Figure 7A:
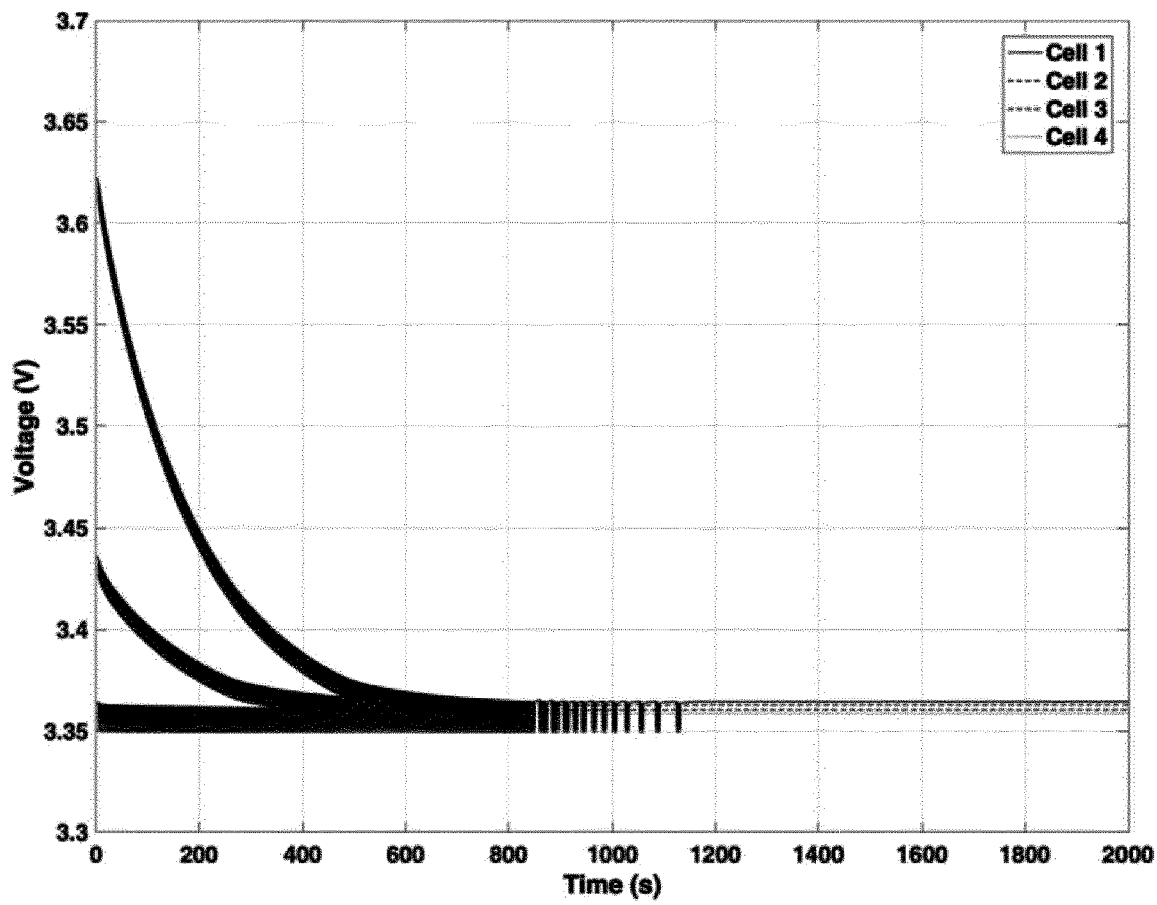
FIGS. 7a and b illustrate cell voltages of a passive balancing simulation: a) multiple ohmic resistor (R=1.5Ω), and b) single ohmic resistor (R1=1.5Ω) according to an embodiment of the present invention.
Figure 7B:
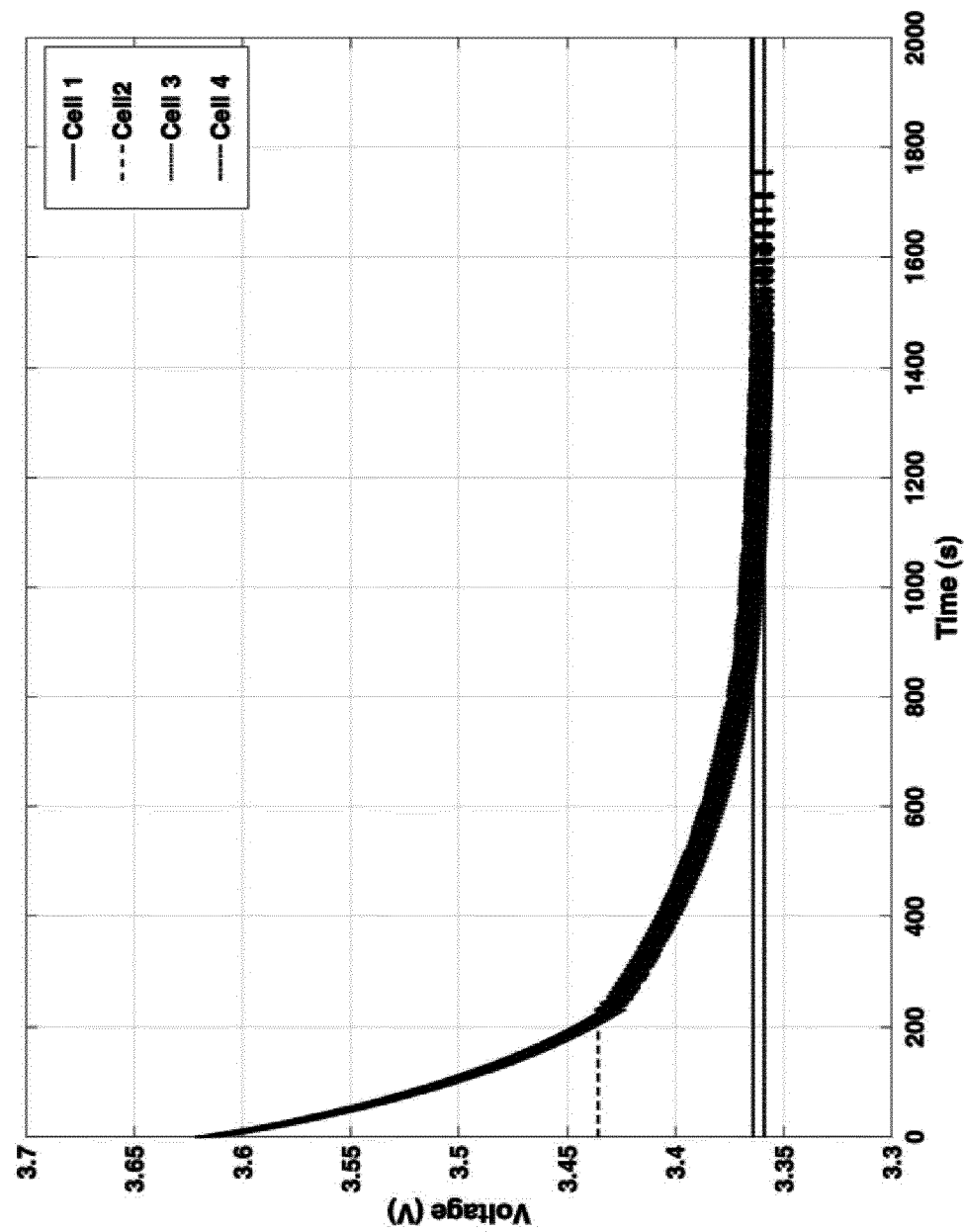
Figure 8A:
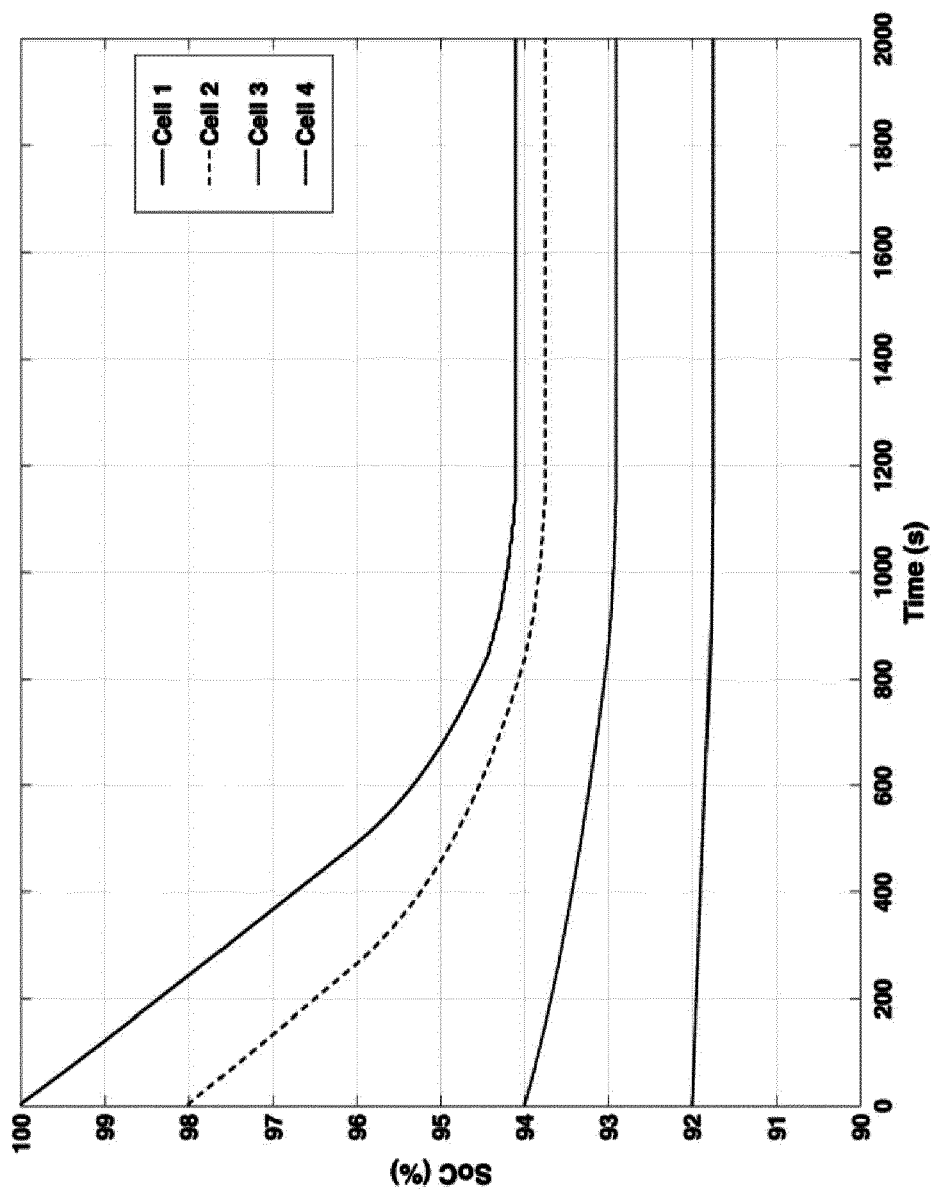
FIGS. 8a and b illustrate cell SoC of a passive balancing simulation: a) multiple ohmic resistor (R=1.5Ω), and b) single ohmic resistor (R1=1.5Ω) according to an embodiment of the present invention.
Figure 8B:
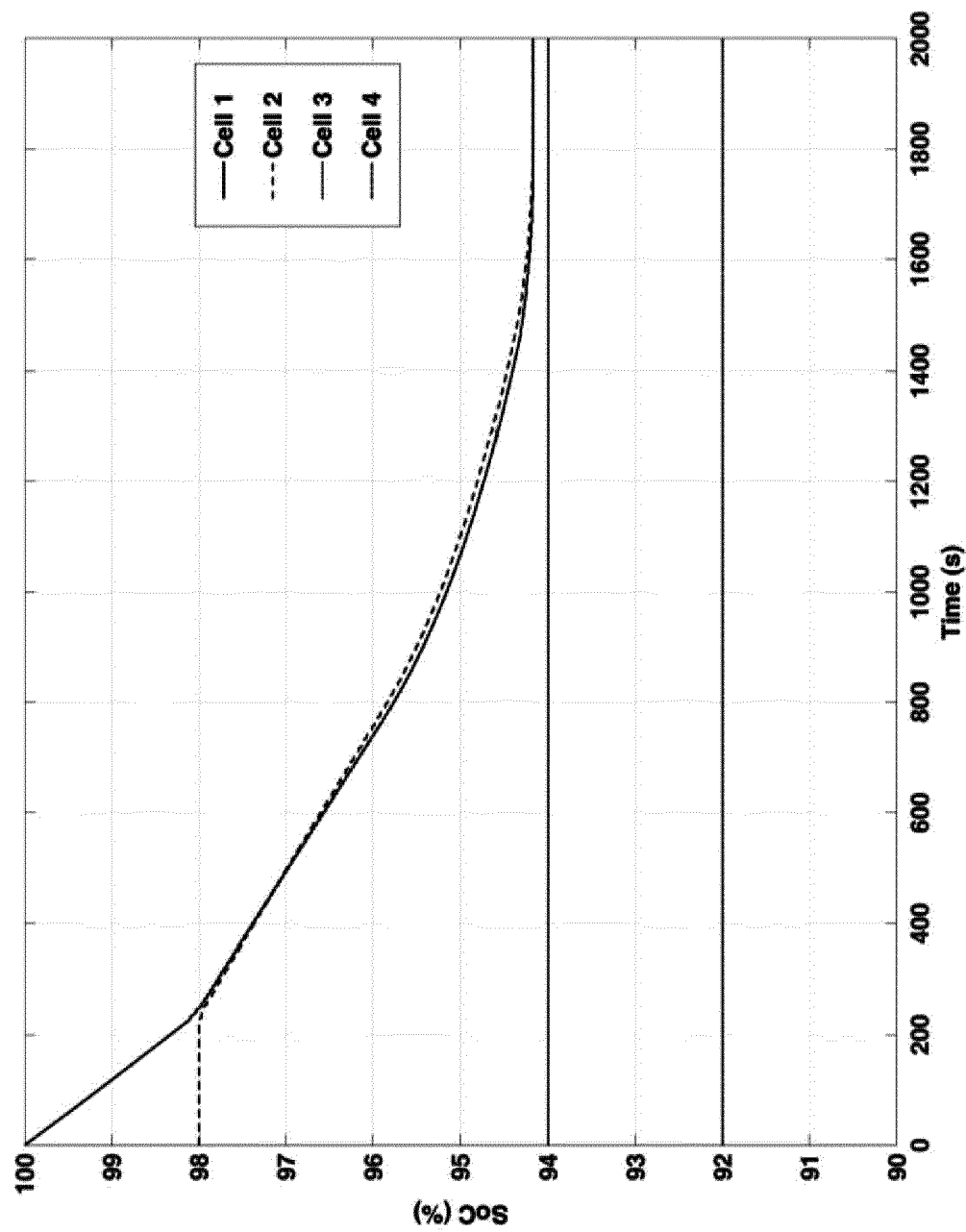
Figure 9A:
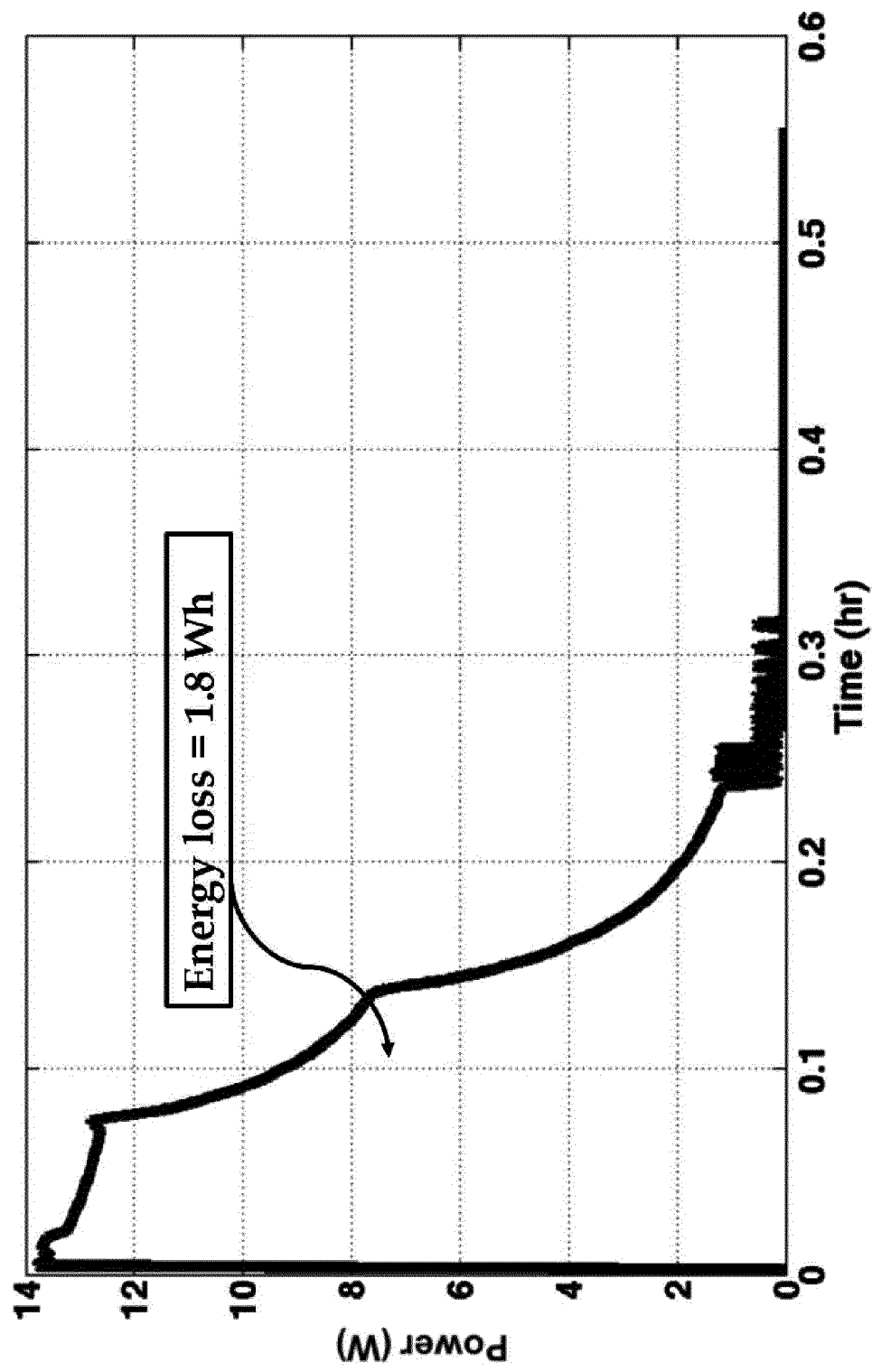
FIGS. 9a and b illustrate energy loss of the passive balancing simulation: a) multiple ohmic resistor (R=1.5Ω), and b) single ohmic resistor (R1=1.5Ω) according to an embodiment of the present invention.
Figure 9B:
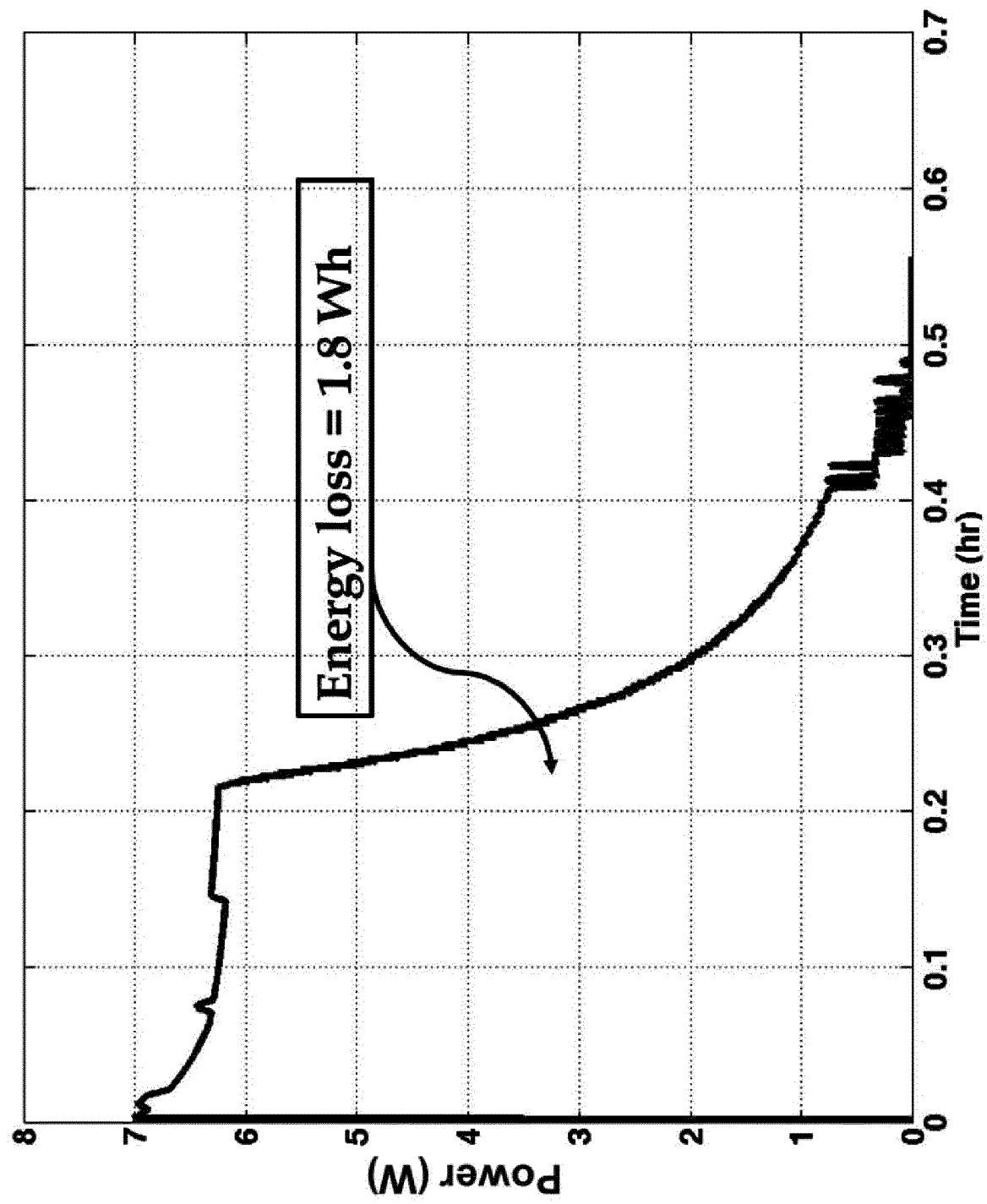

In a further simulation, as shown in FIGS. 7 and 9, during rest time, the initial SoC of the cells that are connected in series was adjusted to be 100%, 98%, 94 and 92 for cell B1, cell B2, cell B3 and cell B4 respectively. Due to 8% difference in SoC between cells, the voltage difference is around 270 mV. As can be seen in FIG. 9, the energy loss of the single and multiple ohmic devices such as resistors (see FIG. 6) is almost the same (~1.8 Wh). However the rate of heat loss for the single ohmic device is is approximately half that of the multiple resistor device and hence the temperature rise of circuit components is reduced increasing component lifetimes.

The balancing time with the multiple resistors (~19 min) is less than the time needed for balancing the cells by a single resistor (~29 min), however this time difference is not significantly longer. Thus in the present invention there is no need to increase the number of resistors more than one although the option to do so as provided by embodiments of the present invention is advantageous. Consequently, in embodiments of this invention, the proposed management system uses a single resistor not only for passive balancing mode but also for series-parallel balancing and AC impedance testing modes thanks to the smart arrangement of the dedicated switches. This advantage outweighs any small increase in balancing time.

Figure 10A:
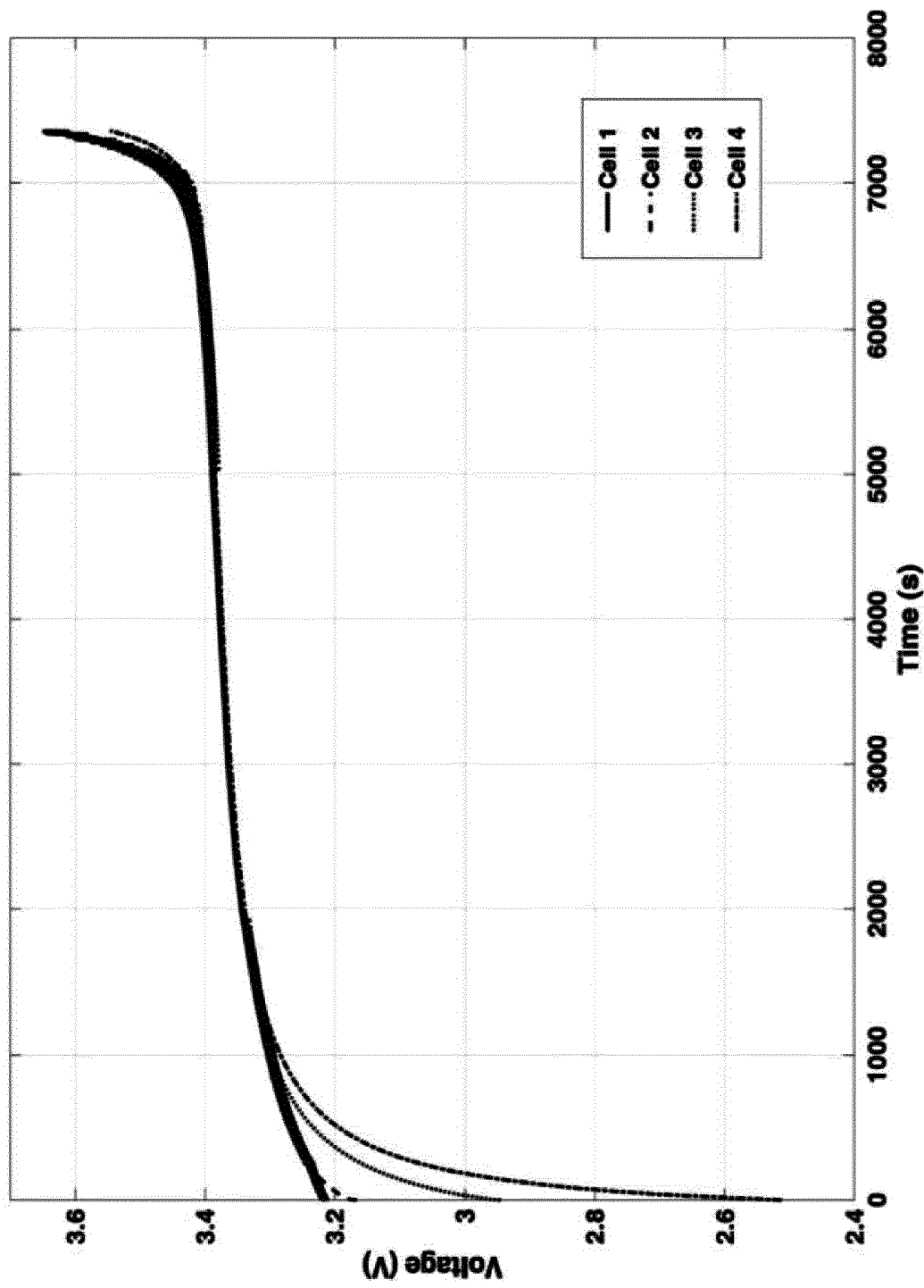
FIGS. 10a and b illustrate simulation results of a passive balancing mode by using a single resistor during charge: a) voltage, and b) SoC according to an embodiment of the present invention.
Figure 10B:
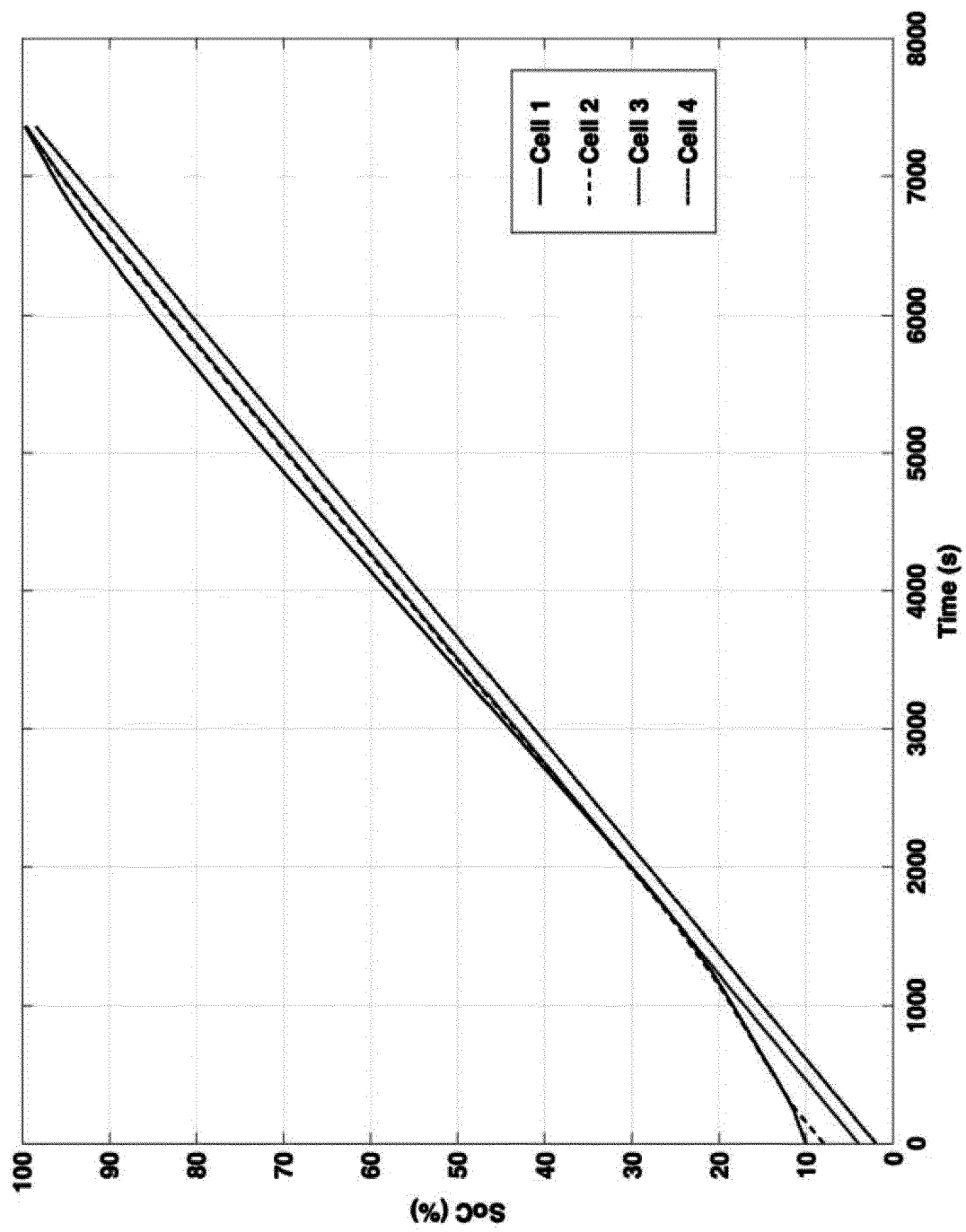
Figure 11A:
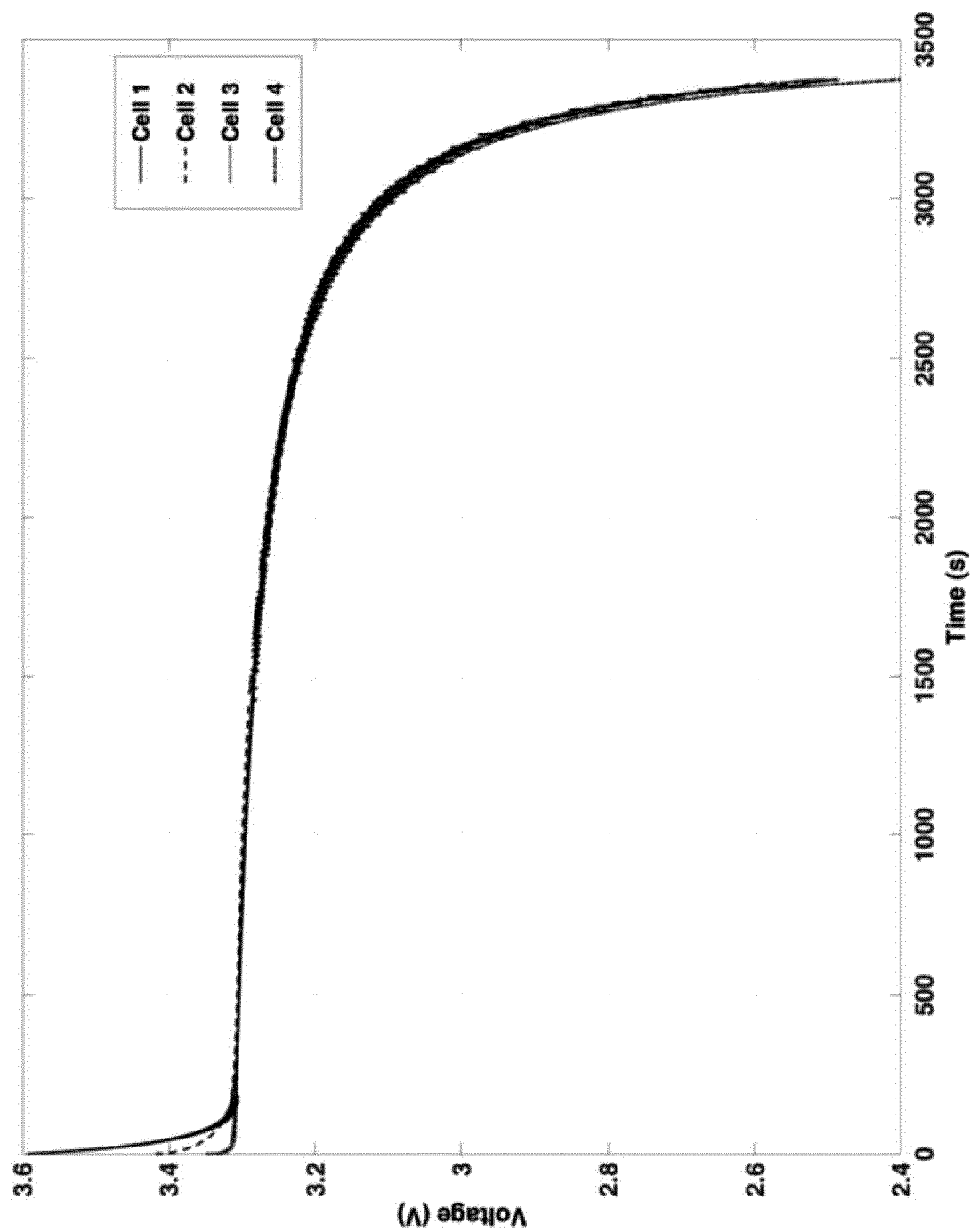
FIGS. 11a and b illustrate simulation results of a passive balancing mode during discharge: a) voltage, and b) SoC according to an embodiment of the present invention.
Figure 11B:
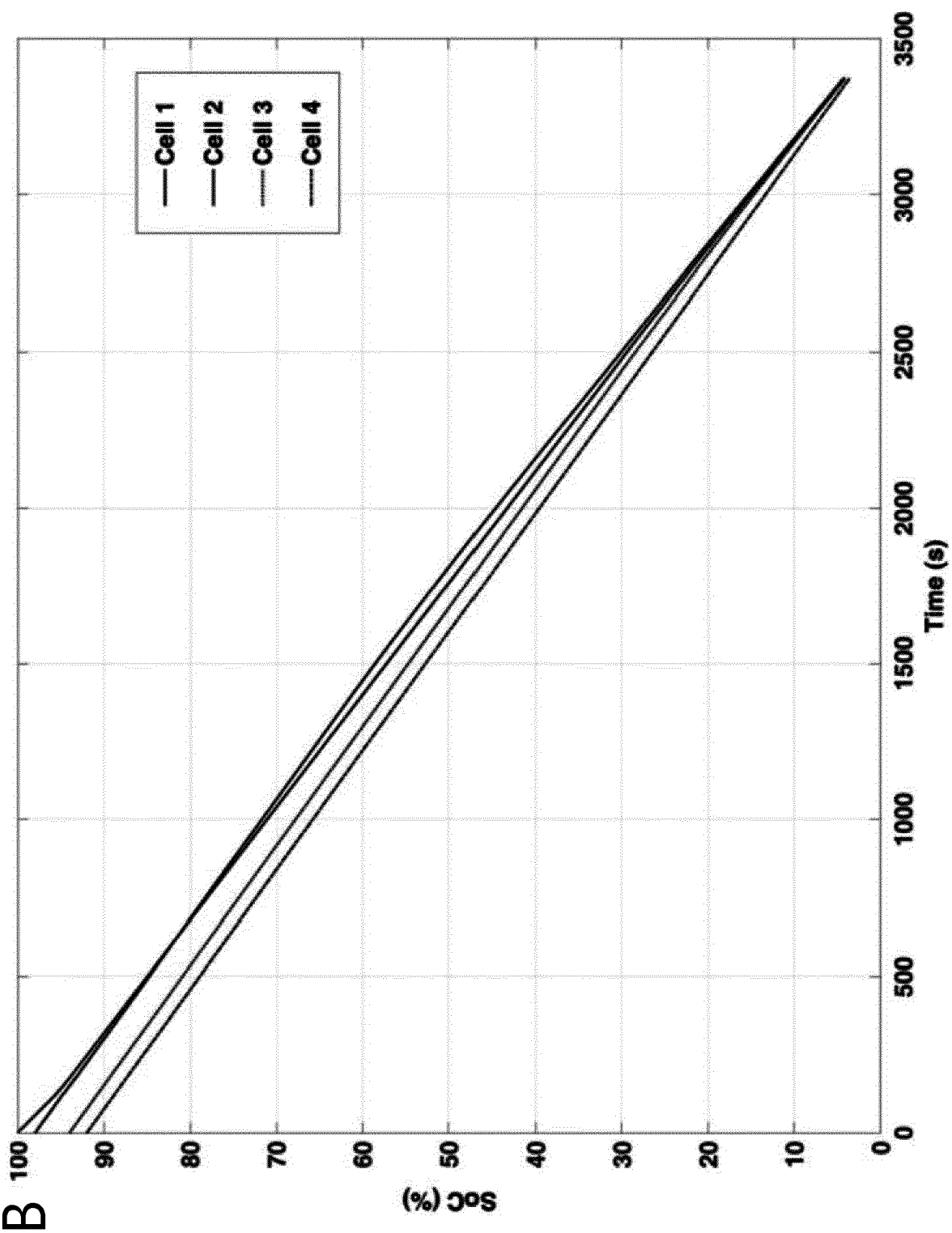

To validate the performance of the proposed control strategy for the passive balancing mode by using single ohmic resistor, the proposed management circuit was designed and realized by using Matlab/Simulink. These simulations were carried out during charge and discharge. During charge, the imbalance in the state of charge (SoC) was around 8%. FIG. 10 shows the simulation results of the passive balancing mode during the charge process. FIG. 11 demonstrates the simulation results of the same balancing mode during discharge at the same initial condition (8% difference in the SoC). As a result, the proposed management system according to embodiments of the present invention especially those with a Pulse Width Modulation (PWM) control strategy (see PWMControl Strategies below) has the ability to eliminate the imbalance in the voltage and the SoC by using single ohmic device such as a resistor passive balancing mode.

Figure 12A:
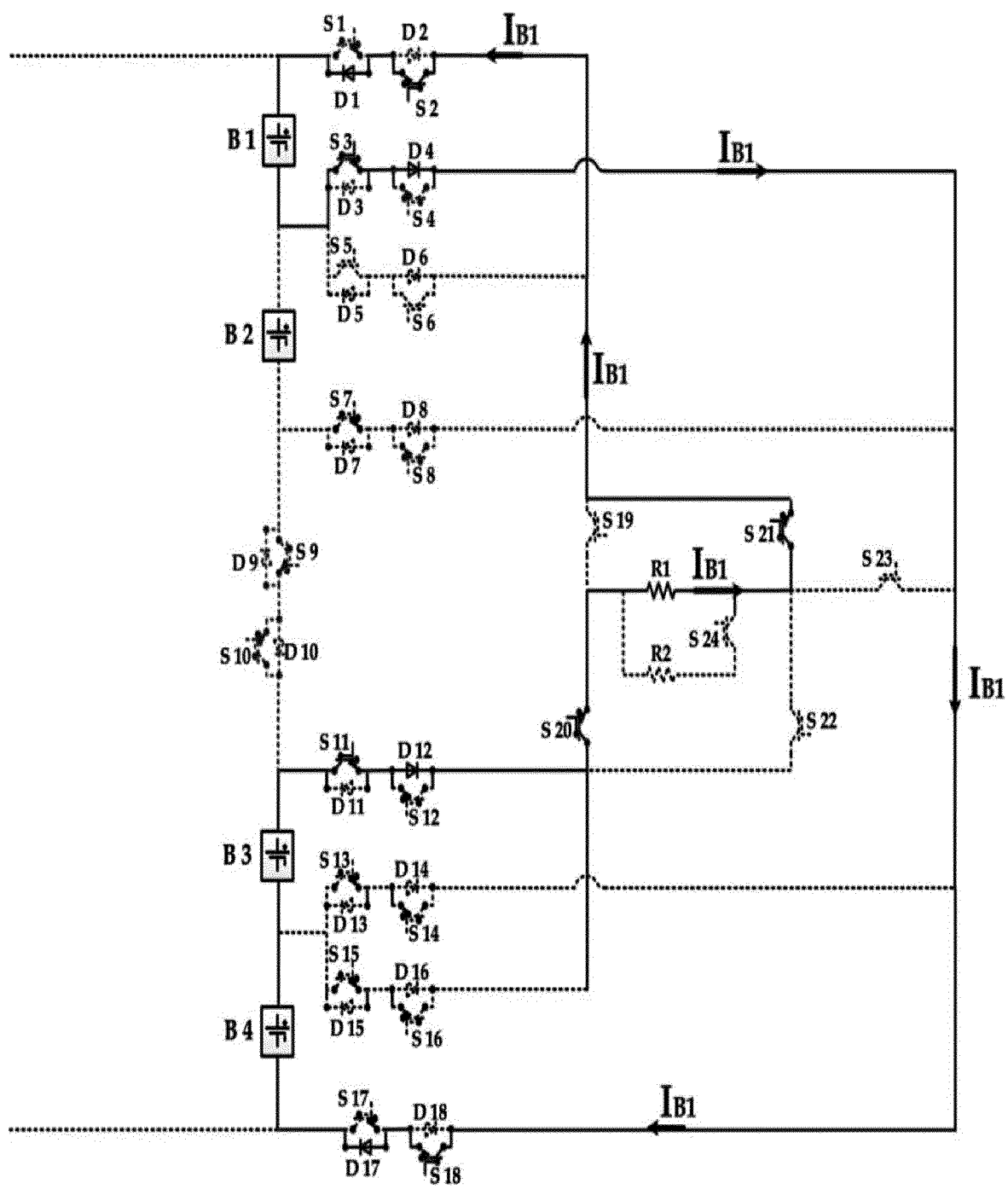
FIGS. 12a to d illustrate four operating cases of series-parallel balancing mode according to an embodiment of the present invention during rest time by using single resistor: a) transfer energy from battery cell 3 and cell 4 to cell 1, b) transfer energy from battery cell 3 and cell 4 to cell 2, c) transfer energy from battery cell 1 and cell 2 to cell 3, and d) transfer energy from battery cell 1 and cell 2 to cell 4.
Figure 12B:
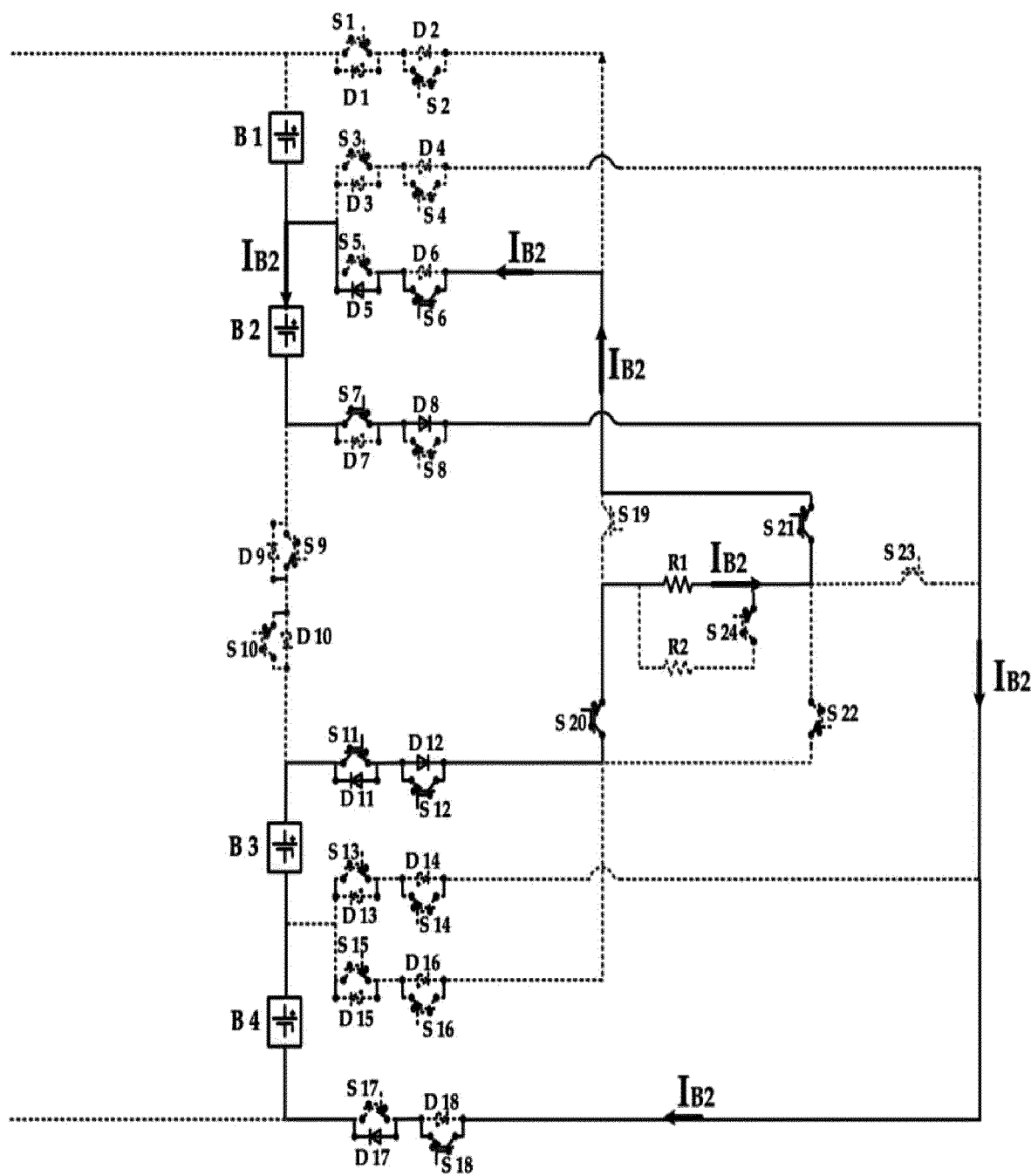
Figure 12C:
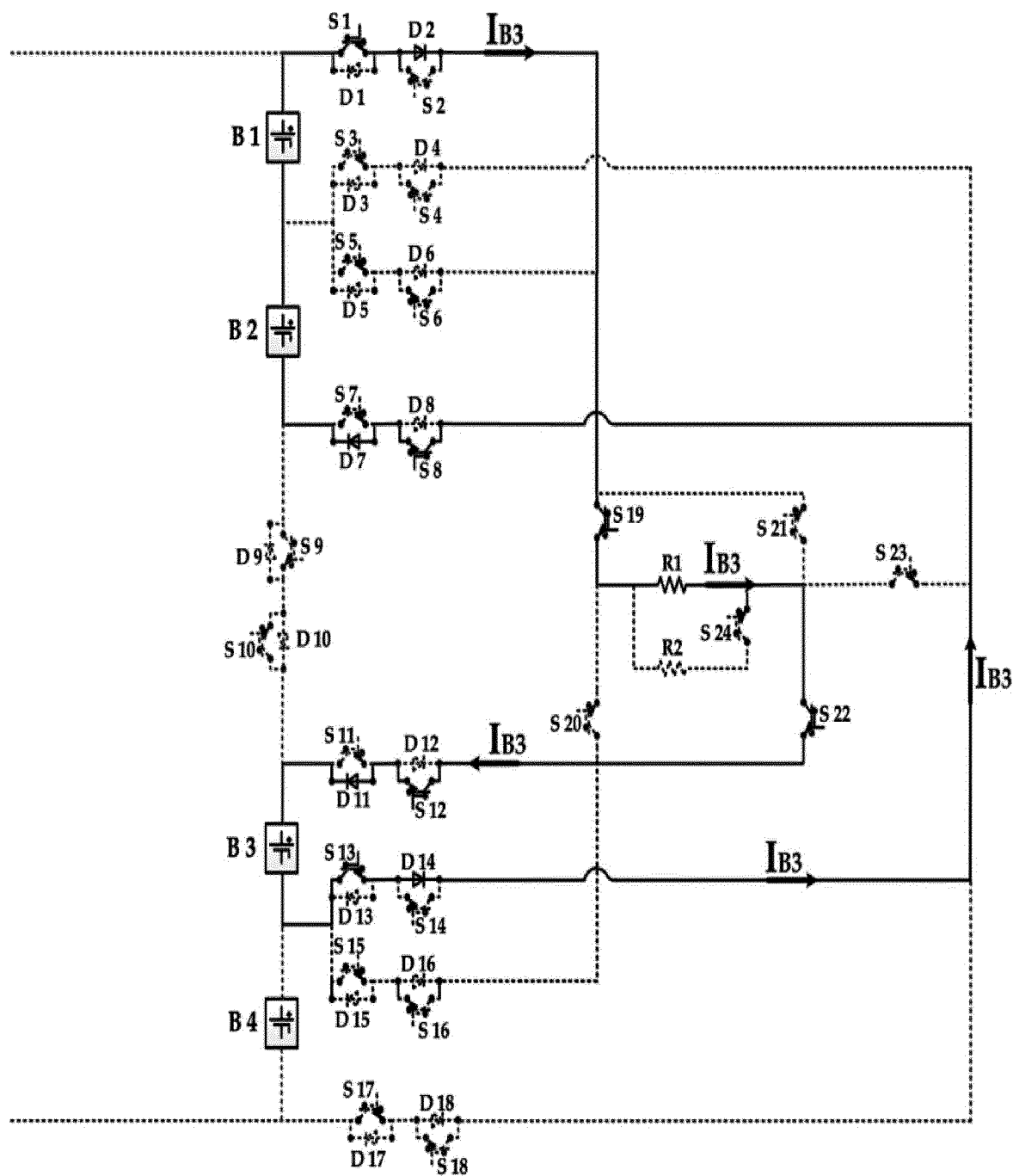
Figure 12D:
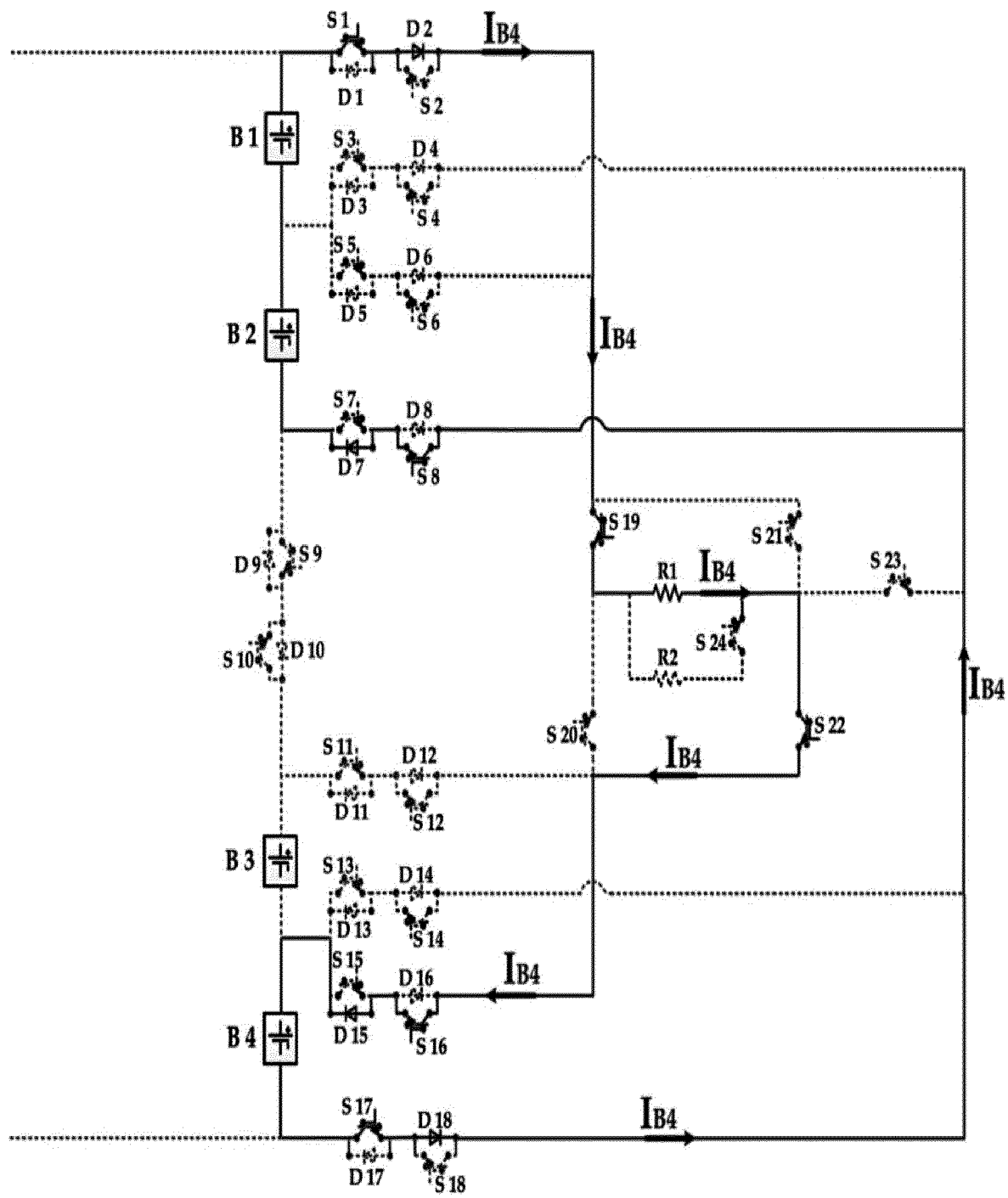

Series-Parallel Balancing Mode—an Internally Powered Balancing Mode for Idle Times In this balancing mode, the connection of some cells B1 to B4 is changed from series to parallel and optionally the cells B1 to B4 can be disconnected from any load or charging device by opening of the protection relay (8). FIG. 12 illustrates four operating cases of internally powered balancing modes for idle time such as series-parallel balancing modes during rest time using, for example a single ohmic device (5) such as a single resistor R1 whereby FIG. 12a illustrates a transfer of energy from cell 3 and cell 4 to cell 1, FIG. 12b illustrates a transfer energy from battery cell 3 and cell 4 to cell 2, FIG. 12c illustrates a transfer energy from battery cell 1 and cell 2 to cell 3 and FIG. 12d illustrates a transfer energy from battery cell 1 and cell 2 to cell 4. One can observe that four unidirectional switches (S19, S20, S21 and S22) can be used to control the direction of balancing current through the same resistor, which is used in this mode to limit the balancing current.

FIG. 12a illustrates the RESS cell pack of FIGS. 1 and 2 in idle or resting mode. The RESS can be isolated by opening the protection relay (8). The control unit (9) has determined that cell B1 has a low state of charge and hence a higher need of charging current. The charging current $I_{B1}$ is supplied to the cell B1 from cells B3 and B4. Switching devices or switches S9 and S10 are turned-off. The balancing current $I_{B1}$ flows through switch S11 and the diode D12, which is in series with switch S11. It then flows through switching devices or switches S20 and S21 and not through switching devices or switches S19, S23 and S22 which are turned-off. The current $I_{B1}$ flows through the single ohmic device 5, i.e. single resistor R1 and through switching devices or switches S21 and S2 and diode D1, which is in series with S2 and in parallel with switch S1 which is turned-off. The charging current for cell B1 is $I_{B1}$. The value of the current $I_{B1}$ is determined by the voltage drop across cell B3 and B4 in series minus the voltage drop across cell B1, by the resistive impedance in the circuit S11, D12, S20, R1, S21, S2, D1, S3, D4, S18, D17 which includes the resistance of resistor R1. If a higher current is desired then switching device or switch S24 can be turned-on and the resistor R2 is connected in parallel with R1 hence reducing the resistance and increasing current $I_{B1}$. More parallel paths (not shown) which add in further resistors like R2 can be added to resistor R1 and controlled by a switching device or switch.

FIG. 12b illustrates the RESS cell pack of FIGS. 1 and 2 in idle mode. The RESS can be isolated by opening the protection relay (8). The control unit (9) has determined that cell B2 has a low state of charge and hence a higher need of charging current. The charging current $I_{B2}$ for cell B2 is supplied to cell B2 from cells B3 and B4, Switching devices or switches S9 and switch S10 are turned-off. The balancing current $I_{B2}$ flows through switch S11 and the diode D12 which is in series with switch S11. It then flows through switching devices or switches S20 and S21 and not through switching devices or switches S22, S23 and S19 which are turned-off. The current $I_{B2}$ flows through the single ohmic device 5, i.e. single resistor R1 and through switching devices or switches S21 and S6 and diode D5 which is in series with S6 parallel with switch S5 which is turned-off. The value of the current $I_{B2}$ is determined by the voltage drop across cells B3 and B4 minus the voltage drop across cell B2 divided by the resistive impedance in the circuit S11, D12, S20, R1, S21, S6, D5, S7, D8, S18, D17 which includes the resistance of resistor R1. If a higher current is desired then switching device or switch S24 can be turned-on and the resistor R2 is connected in parallel with R1 hence reducing the resistance and increasing current $I_{B2}$. More parallel paths which add in further resistors like R2 (not shown) controlled by a switching device or switch can be added to resistor R1.

FIG. 12c illustrates the RESS cell pack of FIGS. 1 and 2 in idle mode. The RESS can be isolated by opening the protection relay (8). The control unit (9) has determined that cell B3 has a low state of charge and hence a higher need of charging current. Switching devices or switches S9 and S10 are turned-off. The balancing current $I_{B3}$ is provided by cells B1 and B2 and flows through switch S1 and the diode D2 which is in series with switch S1. It then flows through switching devices or switches S19 and S22 and not through switching devices or switches S20, S23 and S21 which are turned-off. The current $I_{B3}$ flows through the single ohmic device 5, i.e. single resistor R1 and through switching devices or switches S22 and S12 and diode D11 which is in series with S12 parallel with switch S11 which is turned-off. The value of the current $I_{B3}$ is determined by the voltage drop across cell B1 and B2 in series minus the voltage drop across B3 divided by the resistive impedance in the circuit S1, D2, S19, R1, S22, S12, D11, S13, D14, S8, D7 which includes the resistance of resistor R1. If a higher current is desired then switching device or switch S24 can be turned-on and the resistor R2 is connected in parallel with R1 hence reducing the resistance and increasing current $I_{B3}$. More parallel paths which add in further resistors like R2 (not shown) controlled by a switching device or switch can be added to resistor R1.

FIG. 12d illustrates the RESS cell pack of FIGS. 1 and 2 in idling mode. The RESS can be isolated by opening the protection relay (8). The control unit (9) has determined that cell B4 has a low state of charge and hence a need of charging current. Switching devices or switches S9 and S10 are turned-off. The balancing current $I_{B4}$ is provided by cells B1 and B2 and flows through switch S1 and the diode D2 which is in series with switch S1. It then flows through switching devices or switches S19 and S22 and not through switching devices or switches S20, S23 and S21 which are turned-off. The current $I_{B4}$ flows through the single ohmic device 5, i.e. single resistor R1 and through switching devices or switches S22 and S16 and diode D15 which is in series with S16 and parallel with switch S15 which is turned-off. The value of the current $I_{B4}$ is determined by the voltage drop across cells B1 and B2 in series minus the drop across B4 divided by the resistive impedance in the circuit S1, D2, S19, R1, S22, S16, D15, S17, D18, S8, D7 which includes the resistance of resistor R1. If a higher current is desired then switching device or switch S24 can be turned-on and the resistor R2 is connected in parallel with R1 hence reducing the resistance and increasing current $I_{B4}$. More parallel paths which add in further resistors like R2 (not shown) controlled by a switching device or switch can be added to resistor R1.

FIG. 12: Four operating cases of series-parallel balancing mode during rest time by using single resistor: a) transfer energy from battery cell 3 and cell 4 to cell 1, b) transfer energy from battery cell 3 and cell 4 to cell 2, c) transfer energy from battery cell 1 and cell 2 to cell 3, and d) transfer energy from battery cell 1 and cell 2 to cell 4

Moreover, embodiments of the present invention provide the ability to integrate the RESS such as a battery pack into an electrical grid by charging and discharging from the same port as shown in FIG. 2.

Figure 13:
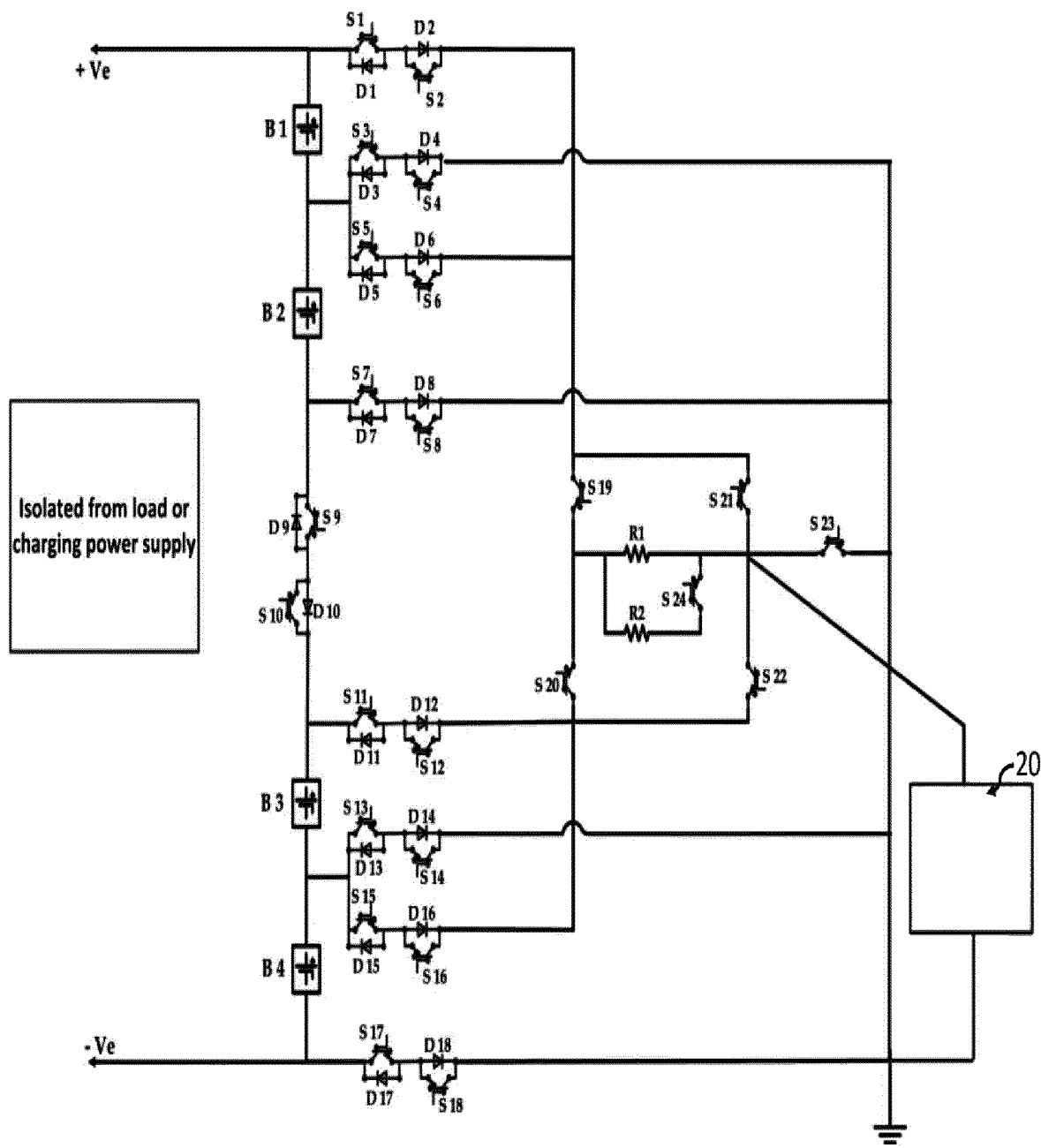
FIG. 13 illustrates an embodiment of the present invention for four battery cells integrated with separate DC charger FIGS. 14a and b illustrate cell voltage of a balancing simulation: a) series-parallel mode (R1=1.5Ω), and b) passive balancing mode by using a single ohmic resistor (R1=1.5Ω) according to an embodiment of the present invention.

In addition, as shown in FIG. 13, embodiments of the present invention have the ability to charge and discharge the batteries from different ports by using a separate DC charger (20).

The external DC charger (20) can be connected or be connectable to a junction point between switching devices or switches S21 to S22. These switching devices or switches control access to the cells B1 to B4. The RESS can be isolated by opening the protection relay (8).

For example the current path from the DC charger (20) can be through switching device or switch S21 (S23 is turned-off) S2, D1, charging cells B1 and B2, through switch S7 and D8 in series with S7 and from there to earth. This charges cells B1 and B2. If only B1 is to be charged, then the earth return path can be via turning-on switch S3 and diode D4 in series with S3 to earth. If only B2 is to be charged, the path from the DC charger 20 passes through switch S6 with diode D5 in series with switch S6 and the earth return is through S7 and D8.

A second charging path is from DC charger (20) (in parallel to the charging paths mentioned above), through turning-on switch S22, switch S12 and diode D11 in series, charging cells B3 and B4, through switch S17 and diode D18 in series with S17 and to earth. If only B3 is to be charged then the return path to earth can be via S13 and diode D14. If only B4 is to be charged, then the path from charger (20) is via turning-on switches 22 and S16 and diode D15. Earth return is via switch S17 and diode D18 to earth.

Figure 14A:
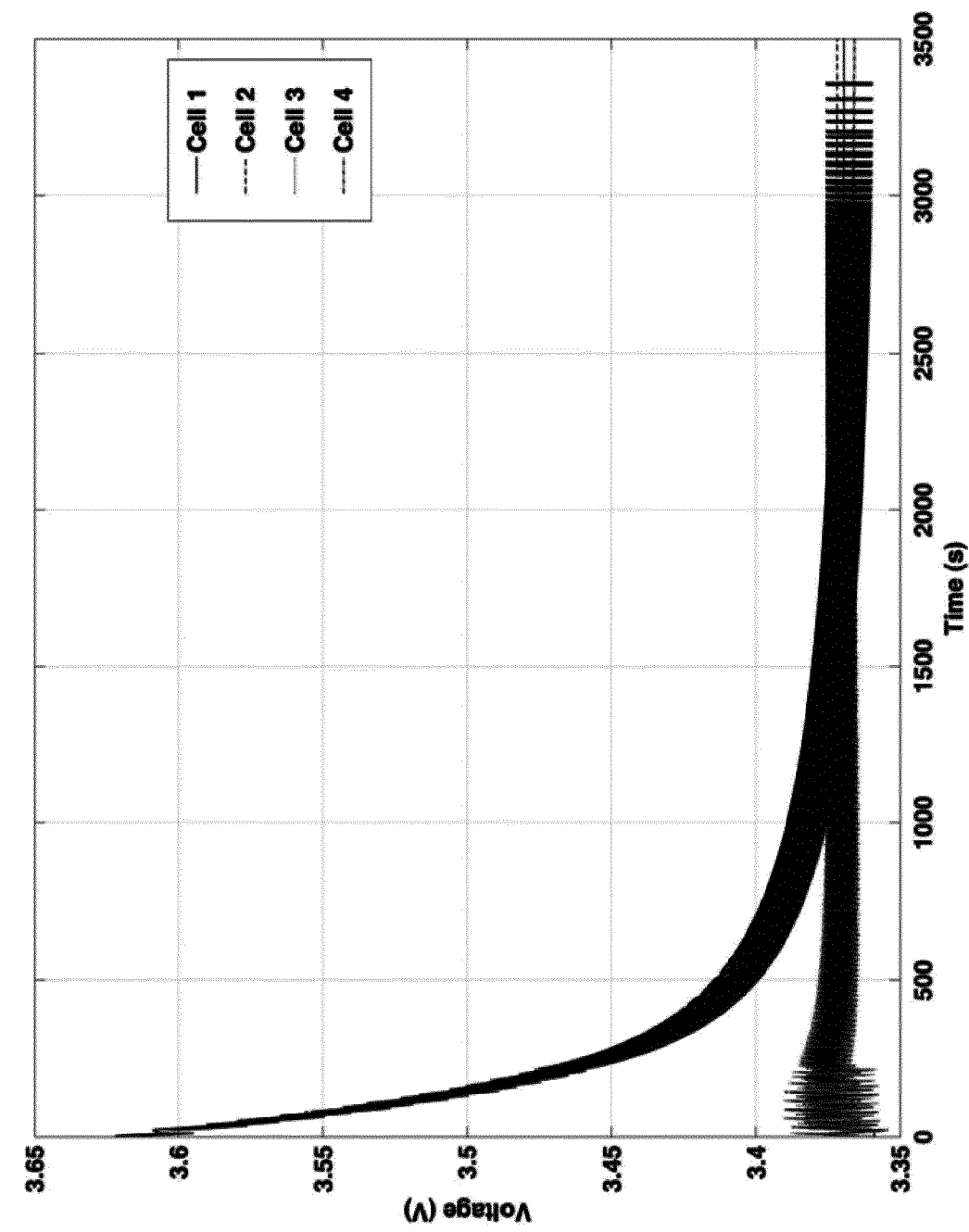
Figure 14B:
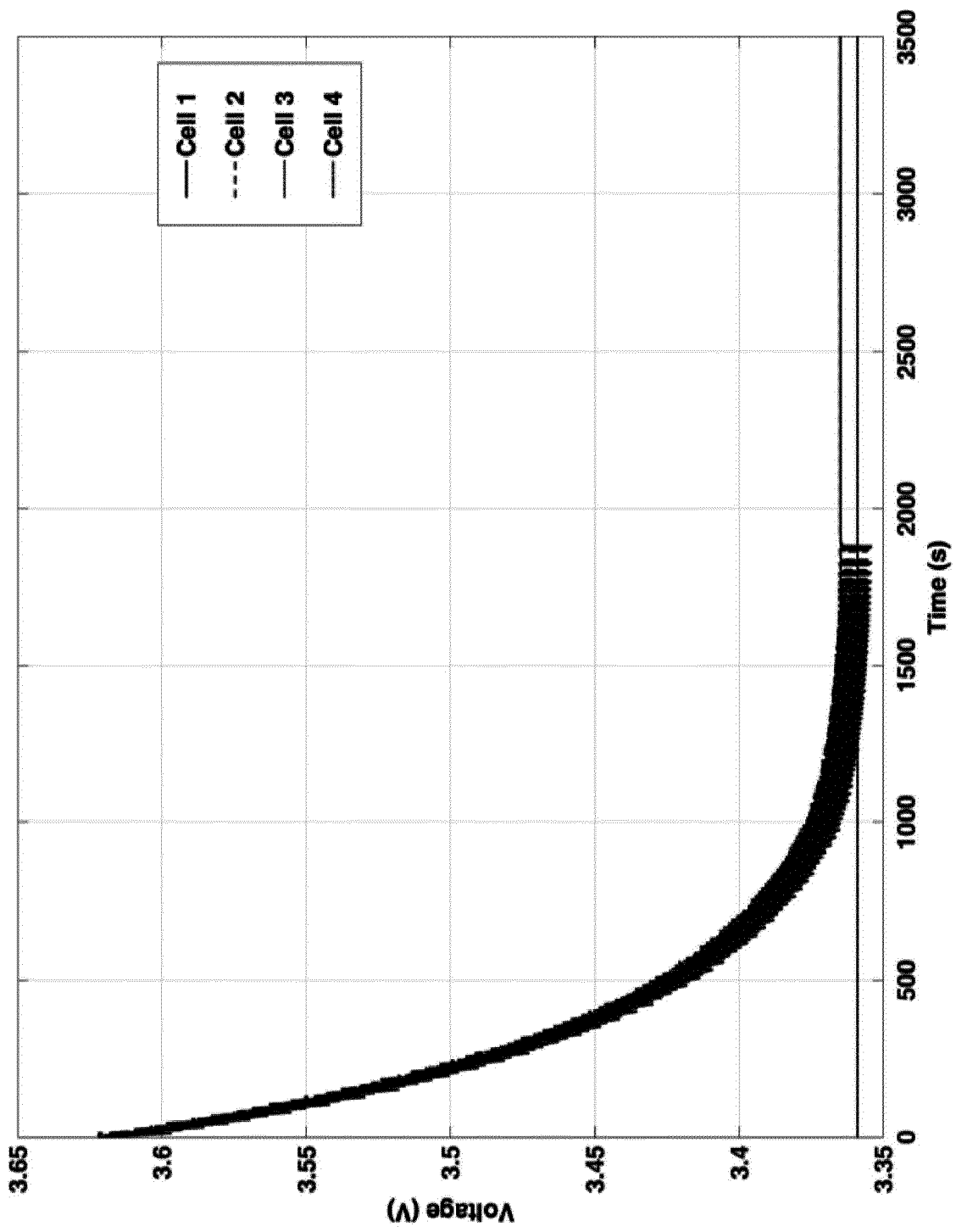

To validate the performance of the series-parallel balancing mode compared to the passive balancing mode by using a single ohmic resistor, the same initial conditions (270 mv difference in the voltage between cells and 8% difference in the SoC) were used to compare between two balancing modes as shown in FIG. 14. To verify the ability of the proposed control strategy to eliminate any differences in the SoC level, the SoC of Cell 1 and Cell 2 has been adjusted at the same level (100% SoC) and the same SoC for cell 3 and cell 4 (92%).

It is clear in FIG. 14 that the passive balancing mode was able eliminate the imbalance faster (31 min) than using the series-parallel balancing mode (56 min). The selection of the balancing time mainly depends on the application to identify the number of using battery pack per day. However, in the present invention, the balancing time could be adjusted by changing the balancing ohmic device value (i.e. decreasing the balancing ohmic resistor, e.g. by resistors in parallel) leads to increase the balancing current, and thus decreases the balancing time).

Figure 15A:
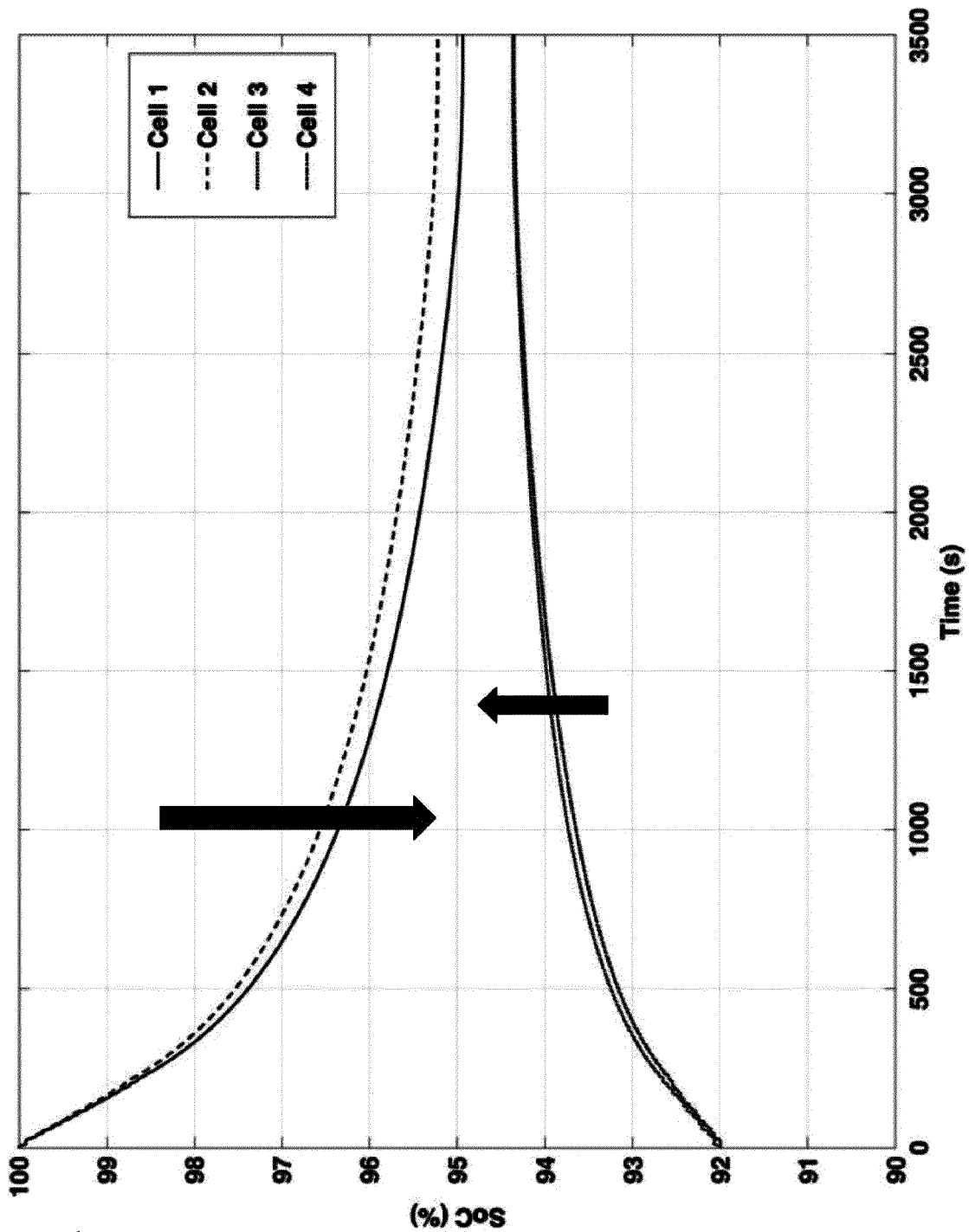
FIGS. 15a and b illustrate cells SoC of a balancing simulation: a) series-parallel mode (R1=1.5Ω), and b) passive balancing mode by using single ohmic resistor (R1=1.5Ω) according to an embodiment of the present invention.
Figure 15B:
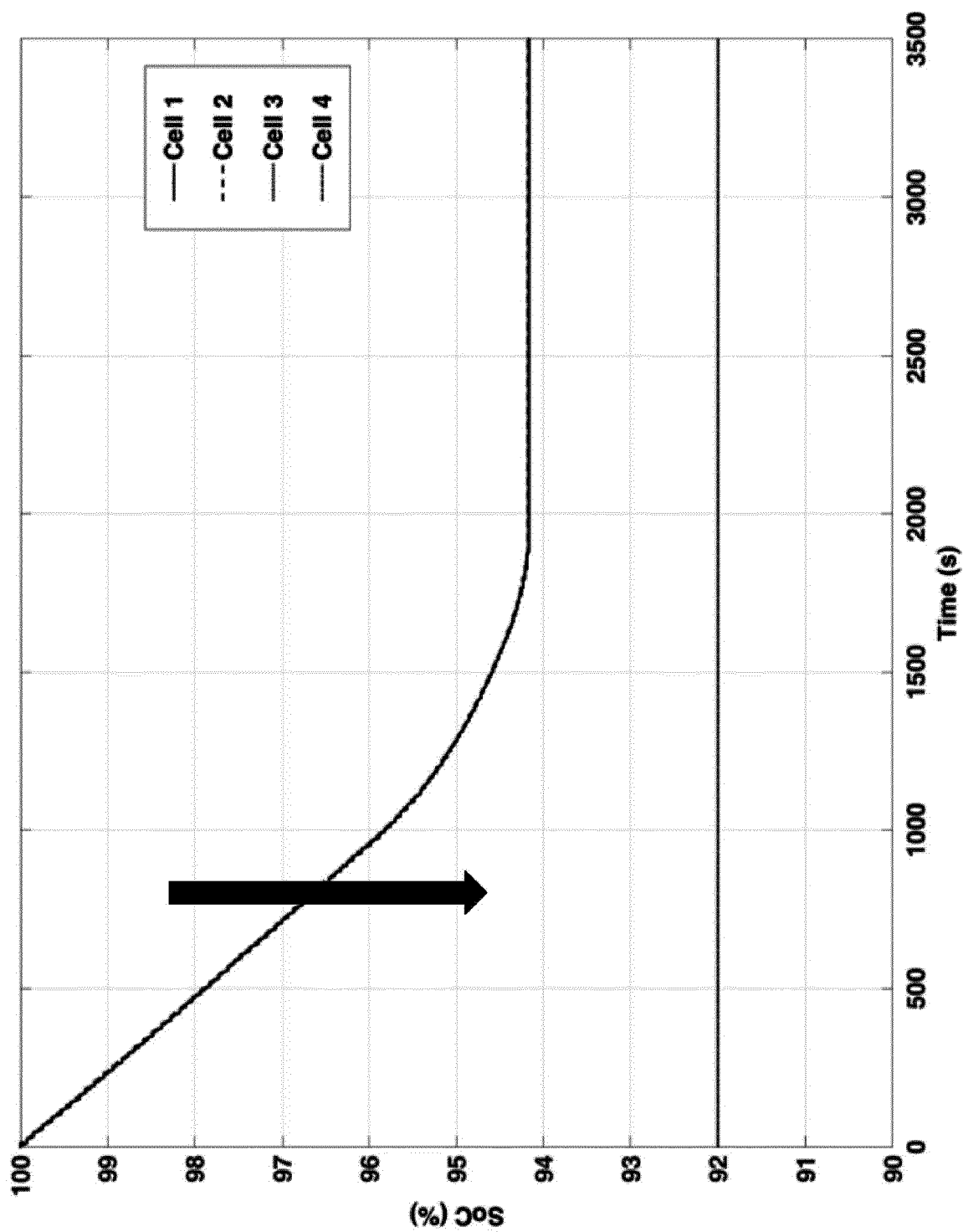
Figure 16A:
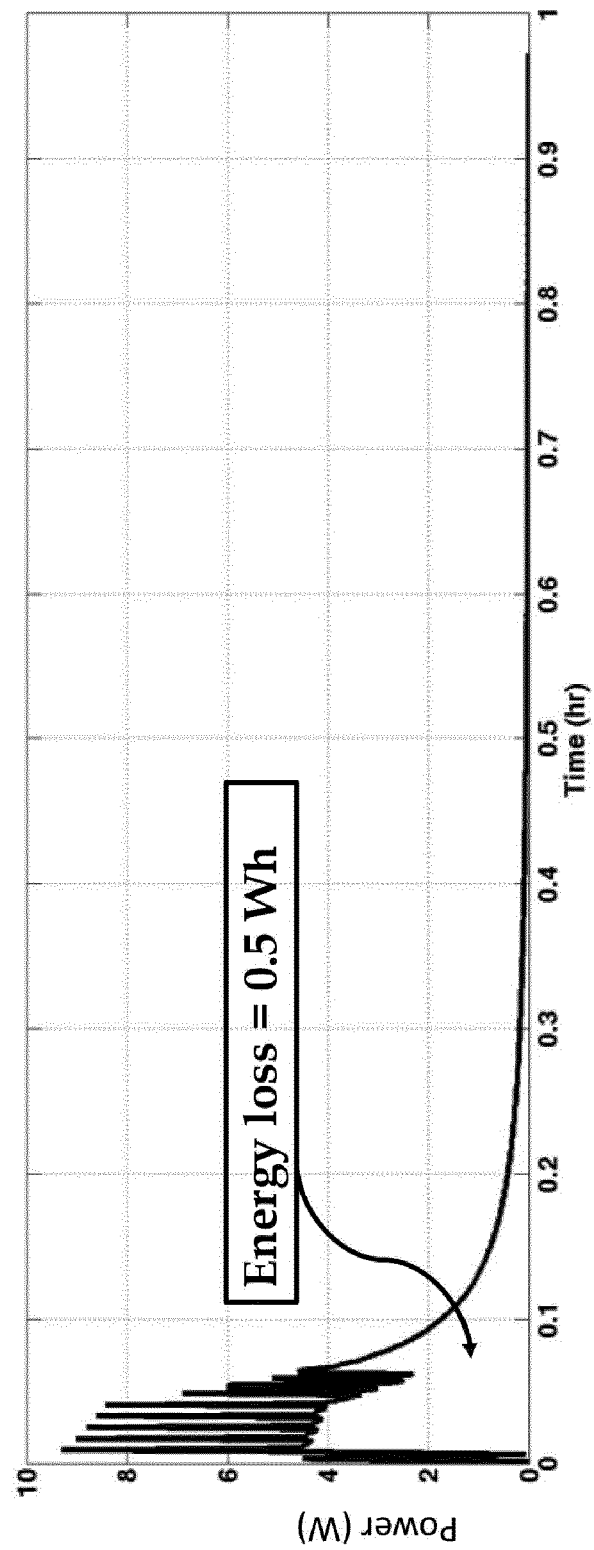
FIGS. 16a and b illustrate energy loss of of a balancing simulation: a) series-parallel mode (R1=1.5Ω), and b) passive balancing mode by using single ohmic resistor (R1=1.5Ω) according to an embodiment of the present invention.
Figure 16B:
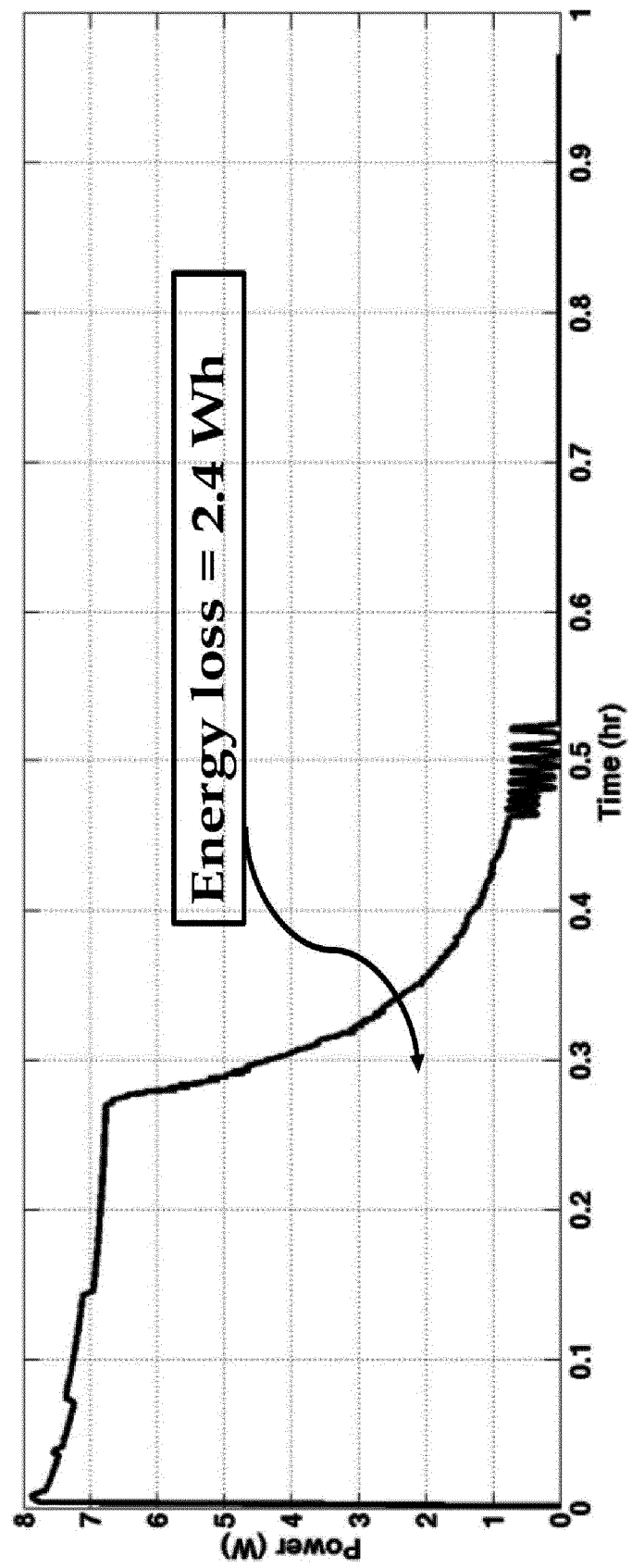

To illustrate the main advantage of using a series-parallel mode during rest time, FIG. 16 shows that the series-parallel balancing mode has the ability to reduce energy loss by 80% compared to the passive balancing mode, because the series-parallel balancing mode provides a discharge path between higher and lower energy cells. For instance, as can be seen from FIG. 15, the SoC of cell 1 and cell 2 decreased from 100% to 95% and the SoC of cell 3 and cell 4 increased from 92% to 94.5% due to using series-parallel balancing mode. In the passive mode, the SoC of cell 1 and cell 2 decreased 6% by dissipating the energy in the single ohmic resistor.

Pulse Width Modulation (PWM) Control Strategies

Figure 17:
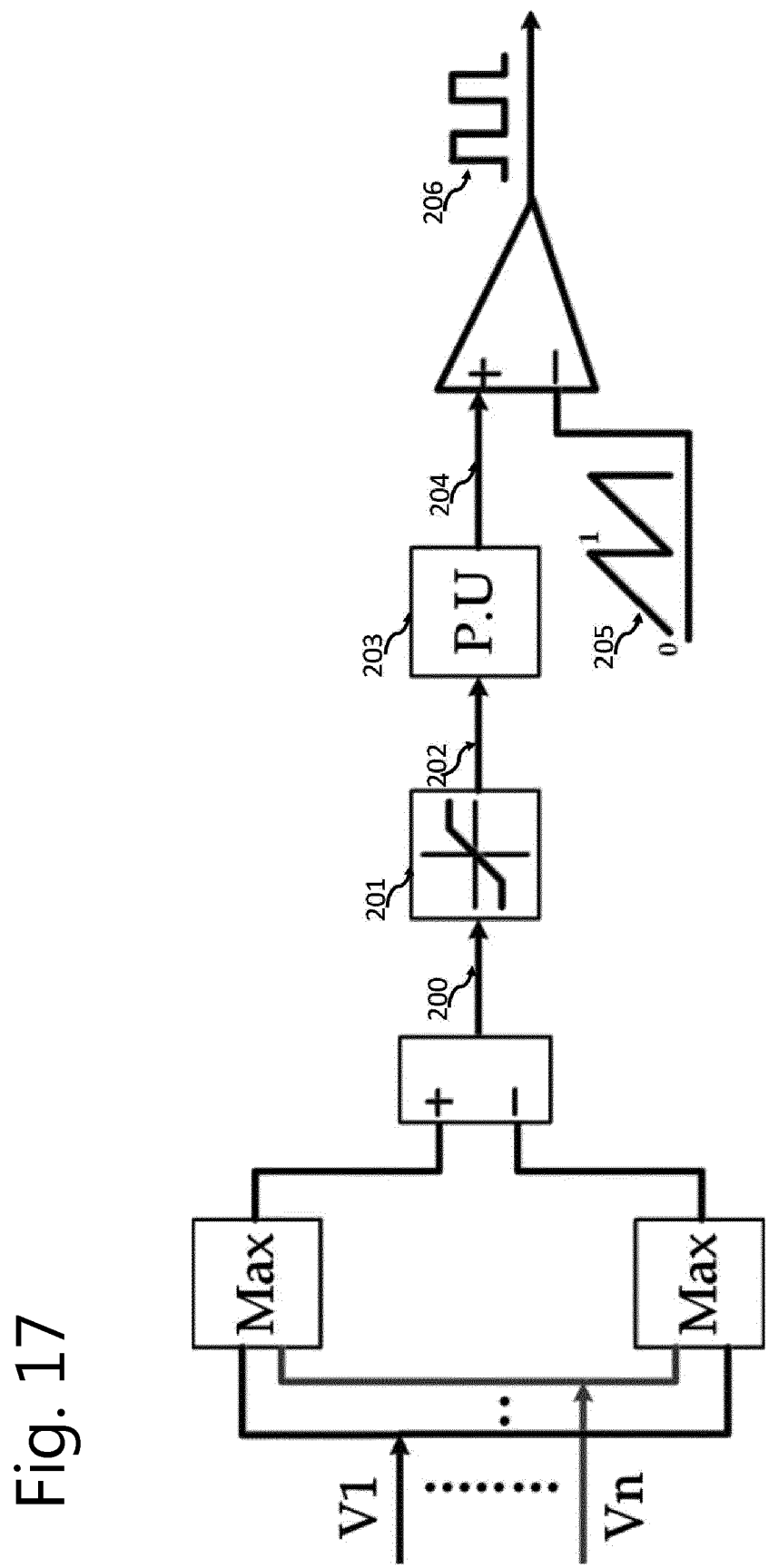
FIG. 17 illustrates control strategy based on PWM technique (where n is number of RES cells such as series connected battery cells) according to an embodiment of the present invention.

In order to overcome the imbalance in voltage and SoC between the cells that are connected in series, a control strategy was developed based on PWM technique as shown in FIG. 17 which can be used with any of the embodiments of the present invention. As described above the balancing modes mainly depend on discharging the energy from the higher energy cell to the lower energy cell (in case of series-parallel mode) or on dissipating the energy in a single ohmic resistor (in case of passive mode), which means the balancing is performed in a cell by cell balancing manner. In this section, the control strategy is described that has been designed for lithium-ion batteries, for example.

However, this control can be modified to be used for different energy storage technologies. In case of lithium-ion battery cells, the OCV voltage is almost flat and the difference between voltage at 100% SoC and 0% SoC is around 600 mV. Thus, the battery management system should disconnect the battery pack for protection when the difference between the voltages of cells in the string becomes more than a limit value, e.g. more than 300 mV (during rest time).

In FIG. 17, the inputs of the control scheme are the voltage of all cells that are connected in series. Then, maximum and minimum voltage are calculated to identify the highest and lowest energy cell based on the cell voltage. Afterwards, the voltage difference ($\Delta V$) (200) is limited (201) by using saturation block. The output of the saturation block ($\Delta V_L$) (202) varies between 0 and 200 mV, and then the per-unit (P.U) (203) value ($\Delta V_{LPU}$) (204) is computed by ($\Delta V_L$ (202)/200 mV) with the aim to obtain the voltage difference ($\Delta V_{LPU}$) (204) changing from 0 to 1. The output of the P.U block (203) is compared to carrier wave (205) (i.e. positive ramp or negative ramp or triangle wave) to generate the switch pulse signal (206). The switch pulse signal (206) is used as driving signals to control the switches. For example, in passive mode, the switch pule signal can be used to drive switching devices or switches S1, S19, S23, S4 in order to decrease the high energy of battery cell B1.

Figure 18:
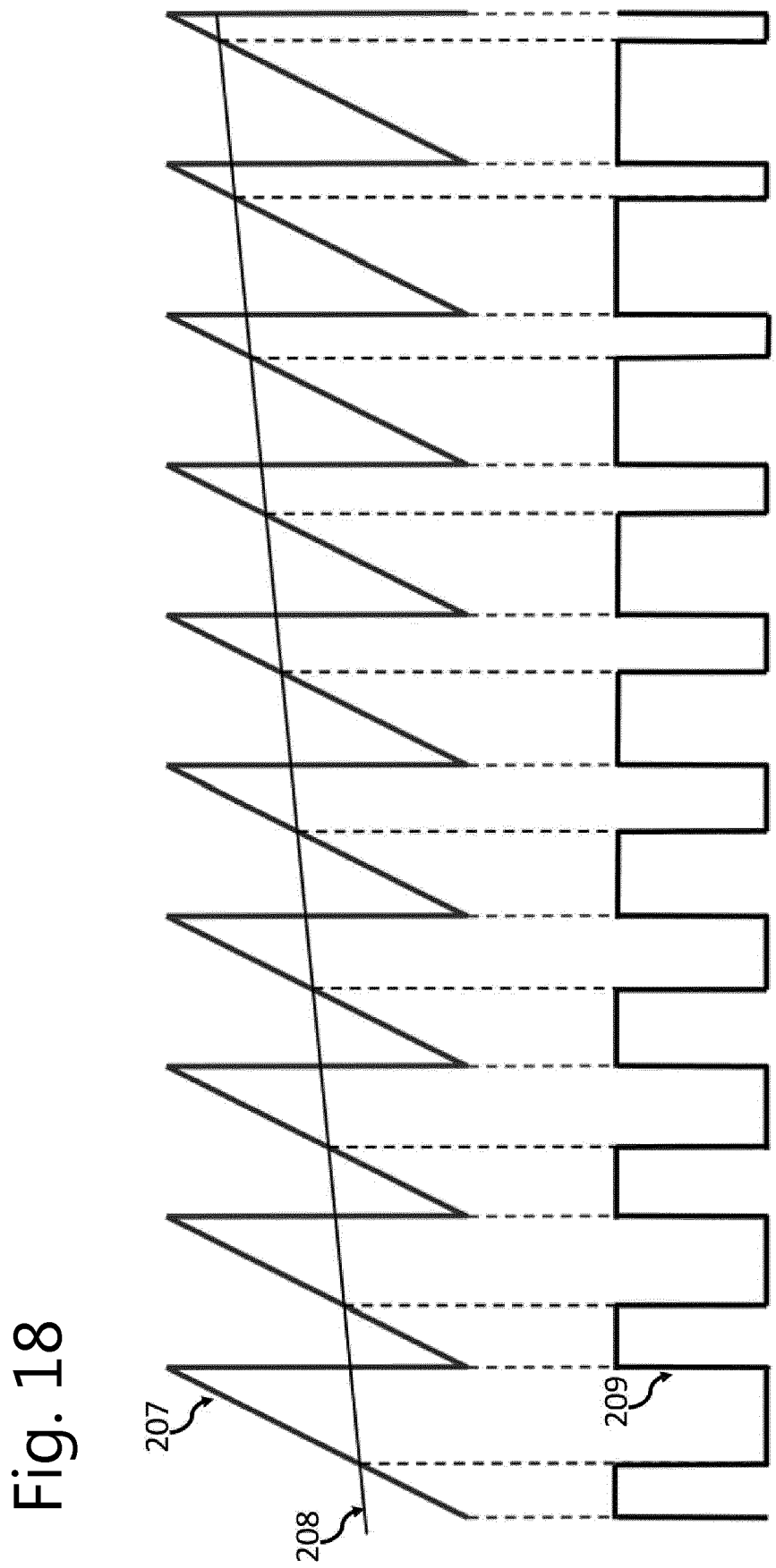
FIG. 18 illustrates pulse signal based on PWM technique according to an embodiment of the present invention.

As can be seen in FIG. 18, the switch pulse signal (209) can be generated by computing the intersection points between the voltage differences ($\Delta V_{LPU}$) (208) and the carrier wave (207), as. The pulse signal is mainly used to open the discharge path for the cell, which has the maximum voltage compared to the rest of the cells in the string.

A carrier waveform is used to maintain the pulse frequency constant. To validate the performance of the PWM control strategy for accurately implementing the balancing modes, different balancing modes based on the PWM control strategy have been designed and investigated.

AC Impedance Testing Mode

Embodiments of the present invention include one or more diagnostic tests selected from current diagnostic, voltage diagnostic and a resistance or impedance diagnostic tests e.g. as indicated in U.S. Pat. Nos. 4,719,427 and 4,361,809 which are incorporated herewith by reference. As advantage of embodiments of the present invention is that an external function generator with switches is not needed to apply a sinusoidal signal such as a small sinusoidal signal in order to calculate the AC impedance of the battery cell.

In this embodiment a DFP or SoH mode is provided for a system or method or device with the same configuration (e.g. bidirectional and unidirectional switches optionally connected to a single ohmic device such as a resistor) that is used for balancing, as described above with reference to FIGS. 1, 2, 4, 5, 12, 13. There is no need to use an external supply. In this embodiment, a diagnostic parameter of a cell or pack of cells such as battery cells is estimated, e.g. SoH. For example, the SoH of a rechargeable energy storage cell can be estimated from the results of applying an AC impedance testing mode. For example, a square or quasi-square wave or in general a pulse width modulation signal, e.g. current signal can be applied to a cell or to cells in a battery pack and the response voltage signal measured. To generate the pulses such as a square wave or quasi-square wave current pulses for example, a DFP can be used to for example, select a group of cells from all cells B1 to B4. The selected group of cells can be used as a DC source in order to test another cell group of the same battery and vice versa, e.g. without a need for an external supply or DC/DC converter. The RESS can be isolated using the protection relay (8).

Figure 19:
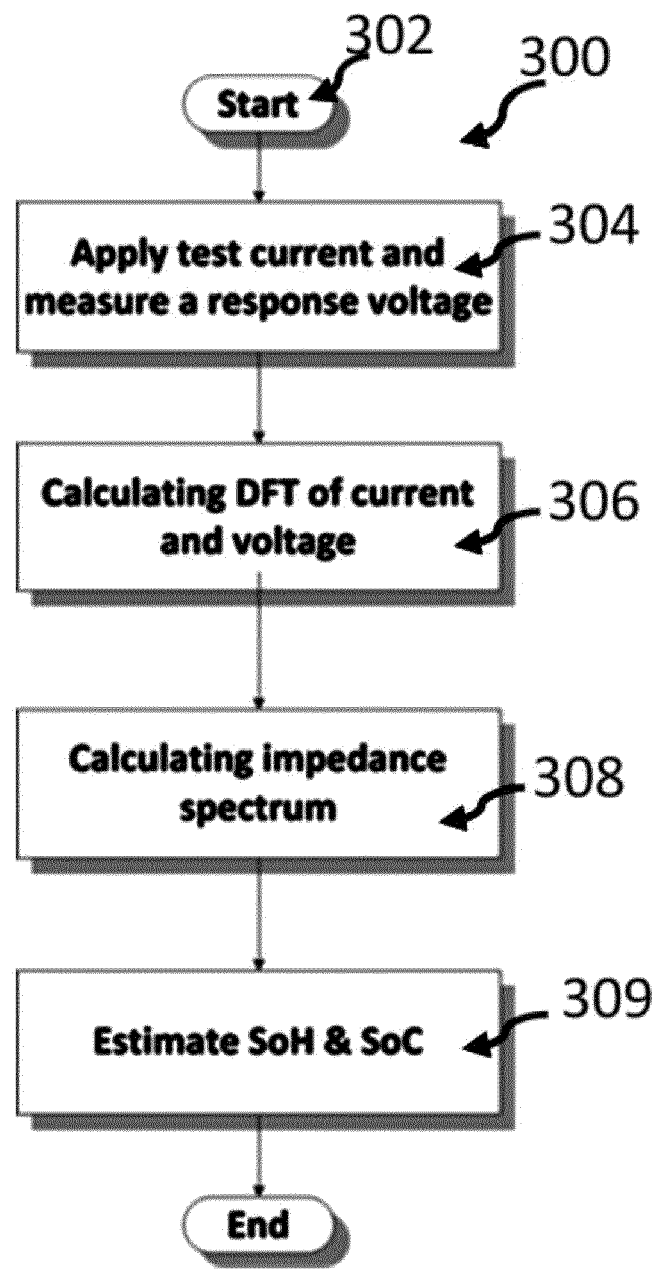
FIG. 19 illustrates a flowchart the proposed methodology for estimating the SoH and/or the SoC according to an embodiment of the present invention.

For example, a pulsed current such as a square wave or quasi-square wave current can be applied to one or more cells and the response signal voltage recorded. FIG. 19 illustrates a flowchart (300) for this embodiment for estimating the SoH and/or the SoC of a battery cell or cells. This method comprises or consists of an electrochemical impedance spectroscopy (EIS) test, e.g. comprising the step of applying a periodical current waveform (e.g. a square wave) to a battery cell or cells under test and measuring a response voltage waveform. To generate the square wave current, one group of cells can be used as a DC source to test another cell group (e.g. comprising one or more cells of the same battery) and vice versa.

The method starts in step 302, and in step 304 the periodic current signal such as a square wave current signal is applied to one or more cells and the applied current signal and the one or more response voltage signals are measured. In step 306 the measured current and voltage signal in time domain is transformed into the frequency domain by using DFT (discrete Fourier transform). Based on the voltage and current signals in the frequency domain, an AC impedance of the battery cell or cells is computed in step 308 by voltage divided by current in the frequency domain, and then the resonance impedance (lowest value of AC impedance, for example AC impedance at 1 kHz—see FIG. 21) is calculated to estimate the SoH of the battery cell or cells in step 309.

Figure 20A:
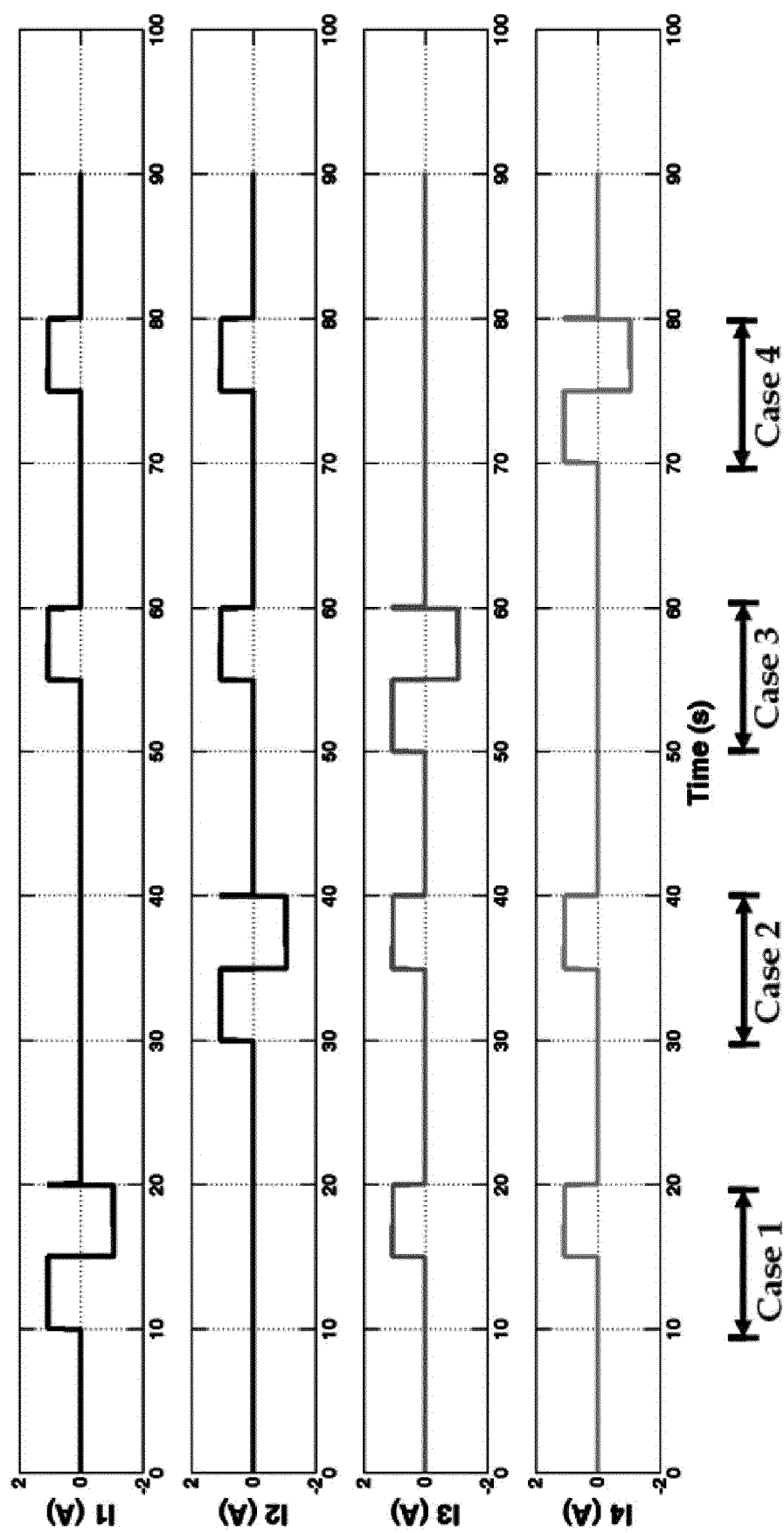
FIGS. 20 a and b illustrate simulation results of AC impedance testing mode: a) excitation current, and b) response voltage according to an embodiment of the present invention.
Figure 20B:
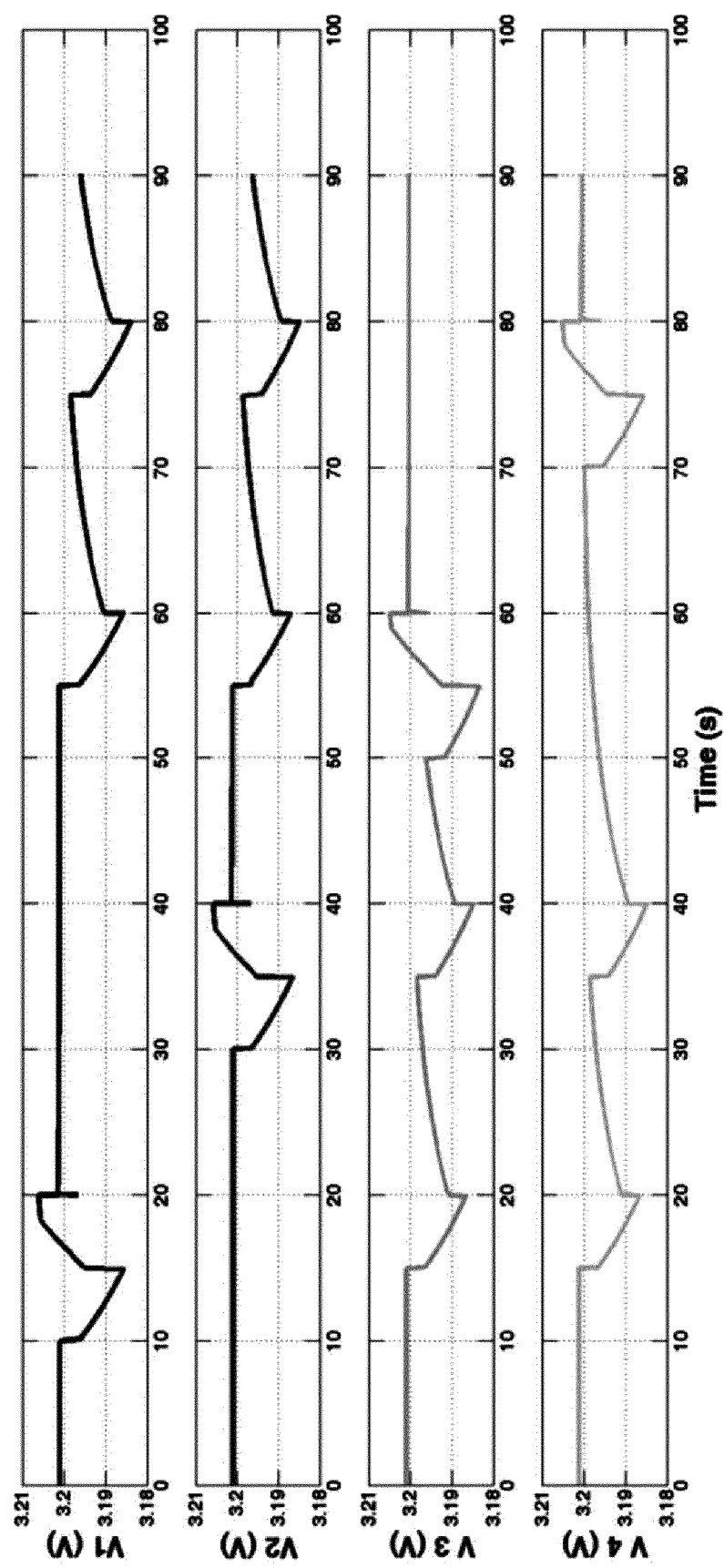

To validate the ability of the inventive management system for performing the AC testing mode, the results are shown in FIG. 20.

For instance, in FIG. 20 case 1, cell B3 and cell B4 are used as a one DC source to apply the positive pulse on battery cell B1, while the negative pulse is formed by connecting cell B1 in parallel with R1.

Figure 21:
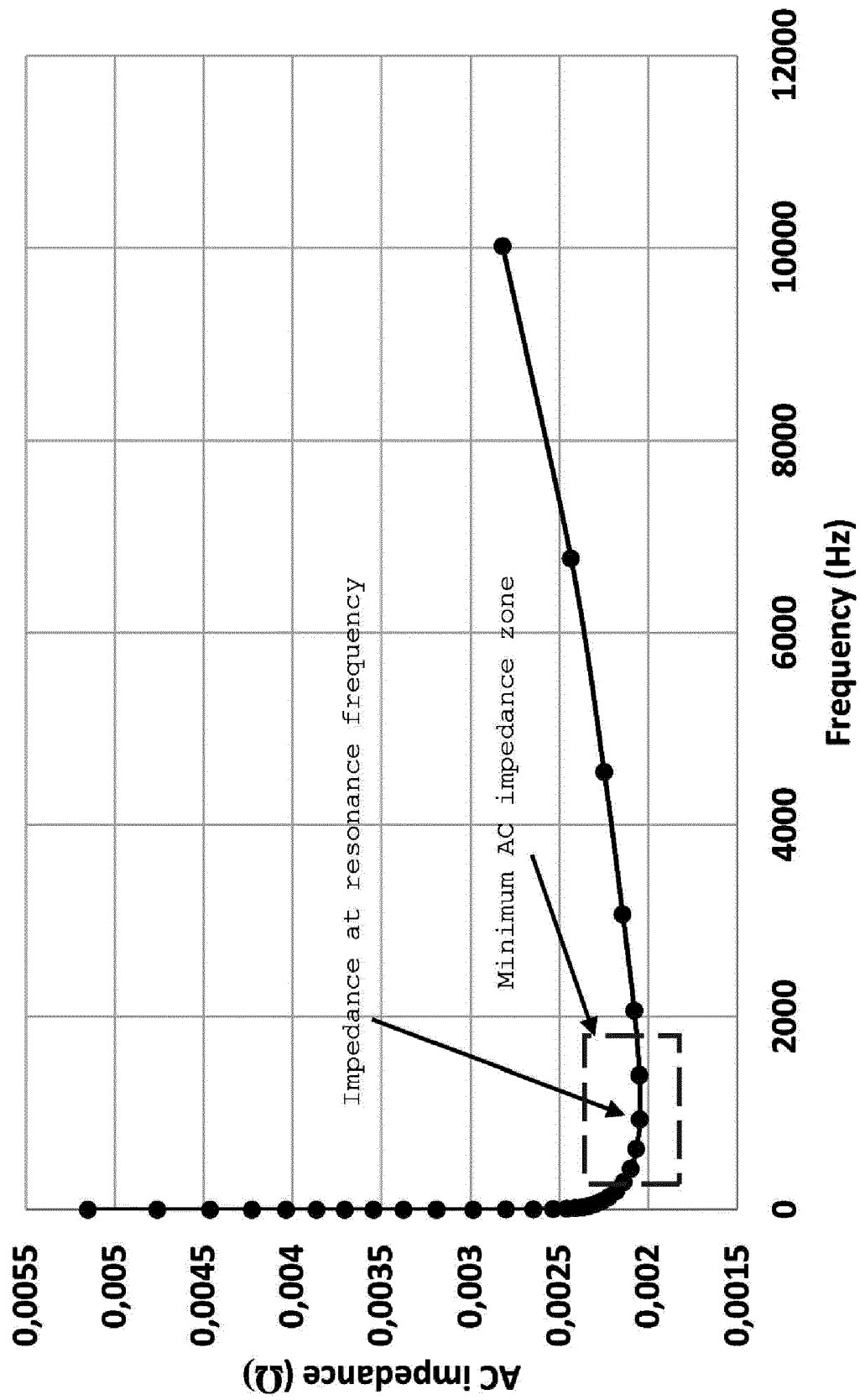
FIG. 21 illustrates AC impedance of batteries as a function of frequency level as used in an embodiment of the present invention.

The excitation current and response voltage signal are captured in the time domain and transformed into the frequency domain by using DFT (discrete Fourier transform). Based on the voltage and current signals in the frequency domain, an AC impedance of the battery can be computed as illustrated in FIG. 21. As shown in FIG. 21, the resonance impedance ($R_{im}$) represents the lowest value of the AC impedance, which indicates that the imaginary part of the impedance (Im $\{Z\}$=0) equals zero. Indeed, the real part is the only part that remains at around 1 kHz (which is the resonance frequency). Accordingly, at the resonance frequency point, the capacitive and inductive impedances cancel each other out, and therefore the battery impedance becomes purely resistive, which is called resonance impedance or internal resistance of the battery cell. RIM can be carried out on battery cells regardless of their SoC levels, because there is no effect of the SoC levels on the $R_{im}$ value.

Figure 22:
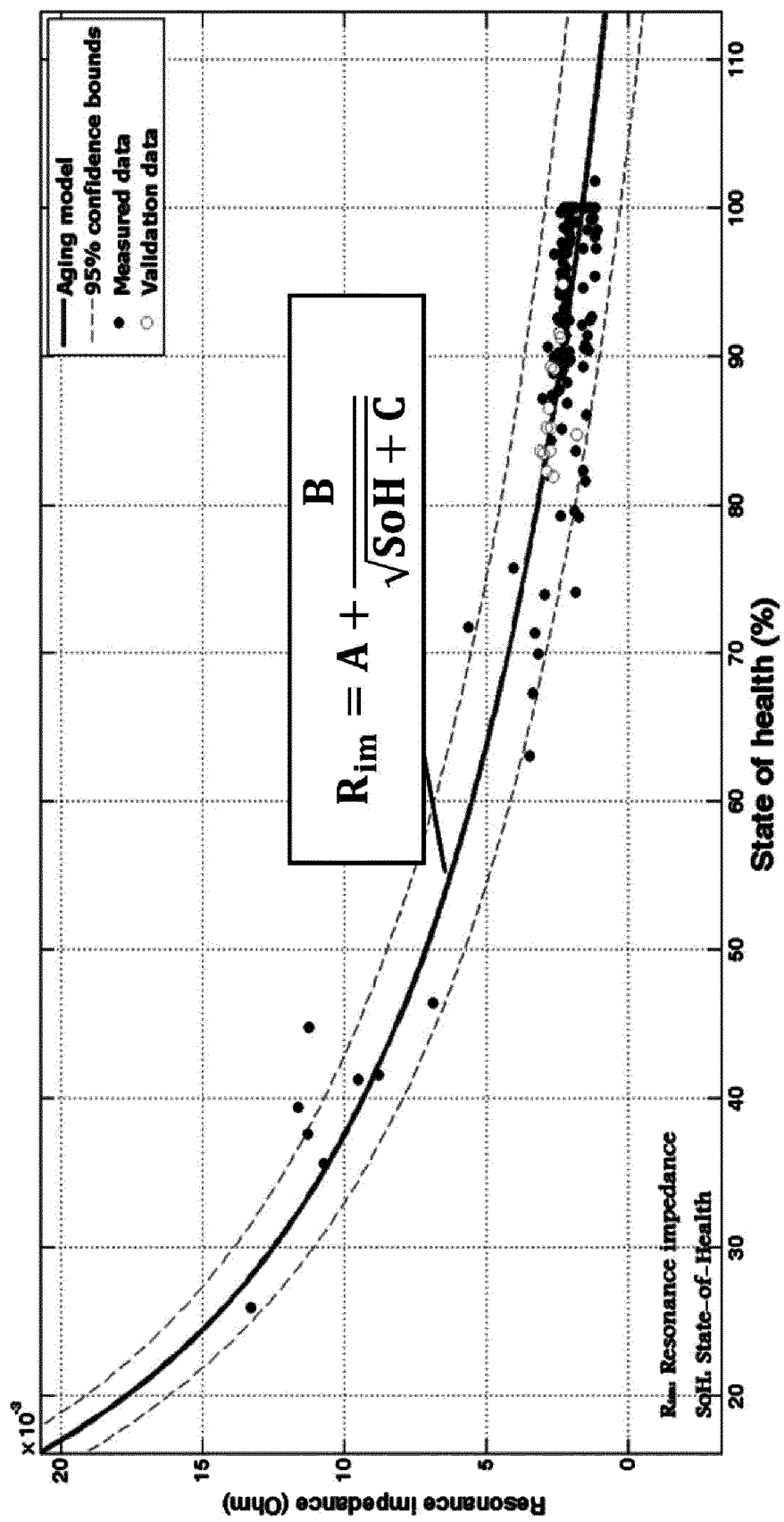
FIG. 22 illustrates generic aging model for SoH estimation based on experimental tests of different types of lithium-ion batteries as used in an embodiment of the present invention.

The resonance impedance ($R_{im}$) has been computed from the minimum impedance zone as well as the capacity of different battery types by using different life cycle profiles. Thus, independently or for use with any of the embodiments of the present invention, methods, systems and devices are provided adapted to determine the relationship between the SoH and the resonance impedance by performing the calculation (see FIG. 22) of equation 1:

$$SoH = \frac{B^2}{(R_{im} - A)^2} - C \quad (1)$$

Where C is a calibration constant, which can be used to adjust the confidence bounds of the curve. The value of constant A and B are mainly based on the initial value of AC impedance which is often declared in the datasheet of the battery. At 100% SoH let $\sqrt{SoH+C}$ be about 10%, where C is a constant <1% (e.g. ~0.1537%). Since A and B constants they can be calculated, as follows:

Therefore, these constants are calculated by using equations 2 and 3:

$$\frac{B}{10} - A = R_{int} \quad (2)$$

$$B = (R_{im})_{max} \quad (3)$$

Where $R_{int}$ is the initial resonance impedance, $(R_{im})_{max}$ is the maximum value of resonance impedance.

Equation (1) can be re-written as follows:

$$R_{im} = A + \frac{B}{\sqrt{SoH + C}}$$

To validate the aging model, batteries having different chemistry types and capacity rates were subjected to this test and the obtained SoH results were compared to the SoH results calculated by using a capacity test which is based on the remaining and rated capacity of the battery. Table 1 includes a comparison of results, and one can observe that the difference in SoH estimation between two methods (AC impedance at resonance frequency and capacity test) is around 3%.

TABLE 1 validation of the SoH estimation

| SoH from capacity test (%) | SoH from Resonance impedance (%) |
|---|---|
| 83.48 | 82.3 |
| 82.17 | 81.2 |
| 82.23 | 83.4 |
| 85.42 | 84.3 |
| 84.62 | 83.4 |
| 92.62 | 90.62 |
| 90.79 | 89.2 |

Figure 24:
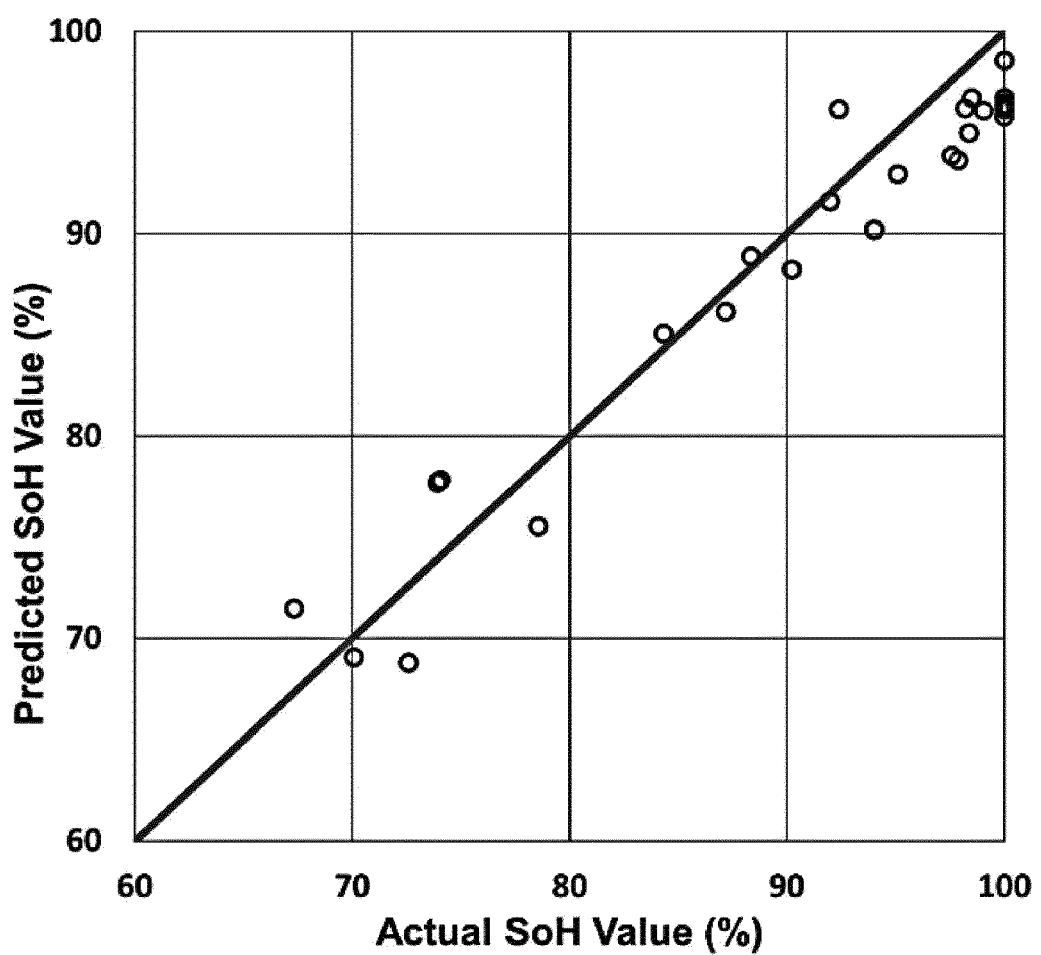
FIG. 24 shows actual values of SoH versus predicted SoH using an embodiment of the present invention.

The actual SoH was measured by performing capacity tests at $1I_t$ before applying the RIM to estimate the SoH of the used battery cells. $I_t$ (Amps) (Reference test current) is defined as $$\left[\frac{C_n(Ah)}{1\,(h)}\right],$$

where $C_n$ is the rated capacity of the cell, and n is the time base (h). As can be seen in FIG. 24, the solid line represents a zero difference between actual and predicted SoH. Although the lithium-ion battery cells have been tested under different load conditions, it is important to point out that the highest error obtained was 4.1%. In fact, the average error of the validation data (27 points) is 2.8%.

Further, these AC impedance determinations at 1 kHz or also known as "resonance impedance method" (RIM) have been performed to estimate the state-of-health (SoH) of lithium-ion battery cells. Furthermore, this method provides a quick, simple, and accurate test regime for testing, characterizing, and sorting used second-life batteries. All the used battery cells have been subjected to a potentiostatic Electrochemical Impedance Spectroscopy (EIS) mode by applying a small AC voltage (e.g. 10 mV) over the battery DC voltage and measuring the response current within the 50 mHz to 10 kHz frequency range by using a Bio-logic Impedance Spectroscopy device and EC-lab V10.21 software. To perform this method, The EIS results of 43 commercial lithium-ion (LFP, NMC) battery cells have been used to verify the ability of using the RIM for estimating SoH of the lithium-ion battery cells. Table 2 illustrates chemistry types of the tested cells, indicating battery shape, and capacity of high-power and high-energy battery cells.

TABLE 2

Technical specification of the tested lithium-ion battery cells

| Battery chemistry | Type | Shape | Capacity | Nominal voltage | Number of cells |
|---|---|---|---|---|---|
| LFP | High Power | Pouch | 7 Ah | 3.3 V | 25 |
|  | High Power | Pouch | 14 Ah | 3.3 V | 2 |
| NMC | High Power | Pouch | 12 Ah | 3.7 V | 9 |
|  | High Energy | Pouch | 40 Ah | 3.7 V | 4 |
|  | High Energy | Pouch | 9.5 Ah | 3.7 V | 3 |

Figure 23:
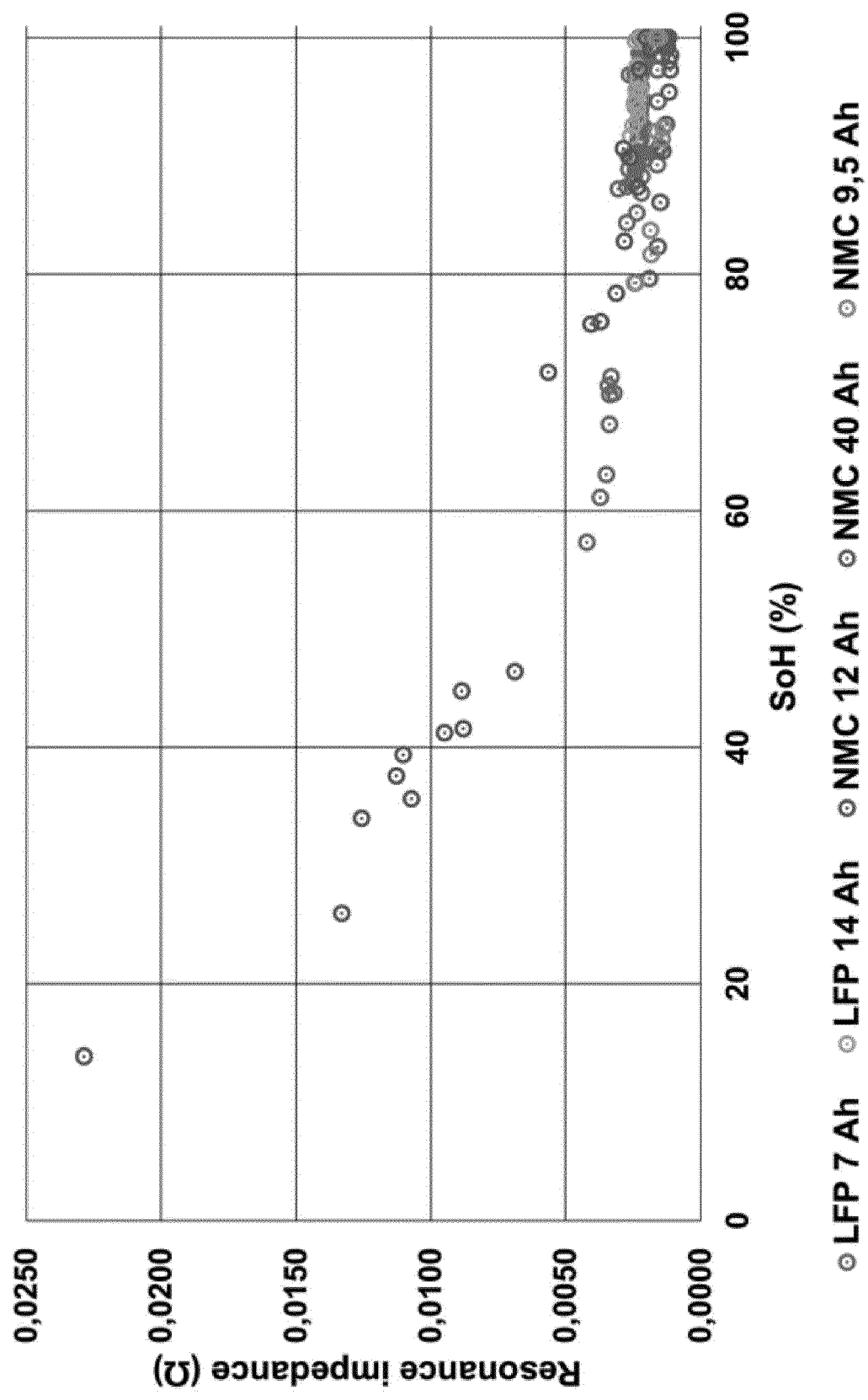
FIG. 23 shows the relationship between the SoH and the resonance impedance of the tested LFP (lithium iron phosphate) and NMC (lithium nickel manganese cobalt oxide) batteries with different sizes.

The resonance impedance has been measured at 1 kHz for all tested battery cells, which have been subjected to different ageing tests. The relationship between state-of-health (%) and impedance $R_{im}$ are shown in FIG. 23. It is clear from this figure that the $R_{im}$ value is strongly related to battery state-of-health for all the tested battery cells. From FIG. 23, the EIS results reveal that the relationship between SoH and $R_{im}$ only seemed to be linear between 100% SoH and 80% SoH. However, it is clear that this relationship became nonlinear when the SoH of the battery cells decreased lower than 80% SoH.

Methods of these embodiments can be used to identify end-of-life of used or second-life batteries in, for example stationary applications. With these methods the battery life can be predicted based on the resonance impedance value. The lowest SoH of the first-life battery is typically approximately 80%. Based on the ageing model according to embodiments of the present invention, the difference of the resonance impedance is divided by the associated SoH difference in order to calculate the rate of increasing $R_{im}$ e.g. for every unit of SoH change, e.g. for every 1% decrease in SoH.

For the batteries tested in the range 100% to 80% SoH, the $R_{im}$ value increases 0.08 mΩ with every decreasing 1% in SoH. The rate of increasing $R_{im}$ increases with decreasing battery SoH. So for example, for the range 20% to 0% SoH, the $R_{im}$ value rapidly increases by around 2.13 mΩ with every decreasing 1% in SoH. Consequently, battery cells operating at an SoH from 20% to 0% might be heated up due to the increase of their internal impedance and might be swollen as well. In addition, any battery cells at lower than 20% SoH are unable to provide energy for more than 12 min at $1I_t$.

An assessment method based on RIM values for testing and sorting second-life batteries to determine which battery cells are considered reusable in accordance with an embodiment of the present invention includes the following steps after the used cells have been visually examined to separate out cells/modules with obvious physical damage, leaks, oxidized layers, cell deformation, or other signs of abuse, the method comprising the steps:

voltage verification whereby a voltage measurement will be performed to identify cells/modules that have failed (for example, due to short circuits or dried-out separators), and assessment process whereby the SoH is estimated by applying the resonance impedance methodology and using the generic-ageing model.

To measure the AC impedance of the battery cells, an EIS device can be used to generate a sinusoidal waveform at 1 kHz over the DC voltage of the battery cells and to measure the response current. Practically, due to using a very small sinusoidal signal (roughly 10 mV or 10 mA), an advanced filter and robust algorithm are needed to calculate AC impedance and to remove the influence of noise and interference of surrounding devices. Hence, a periodical signal (i.e., square waveform) at low frequency (approximately 100 mHz) with a simple low pass filter can be designed in order to avoid the influence of the noise or any interference on the measuring unit. This method can be implemented off-line for testing and sorting the second-life battery cells or on-line as a function of the battery management system for estimating the SoH of the battery cells.

Methods according to the present invention can be performed by a control unit (9) with processing capability such as provided by one or more microprocessors, FPGA's, or a central processing unit (CPU) and/or a Graphics Processing Unit (GPU), and which is adapted to carry out the respective functions by being programmed with software, i.e. one or more computer programmes. References to software can encompass any type of programs in any language executable directly or indirectly by a processor, either via a compiled or interpretative language. The implementation of any of the methods of the present invention can be performed by logic circuits, electronic hardware, processors or circuitry which can encompass any kind of logic or analog circuitry, integrated to any degree, and not limited to general purpose processors, digital signal processors, ASICs, FPGAs, discrete components or transistor logic gates and similar.

Such a control unit (9) may have memory (such as non-transitory computer readable medium, RAM and/or ROM), an operating system, optionally a display such as a fixed format display, ports for data entry devices such as a keyboard, a pointer device such as a "mouse", serial or parallel ports to communicate other devices, network cards and connections to connect to any of the networks.

The software can be adapted to perform a management method for rechargeable energy storage devices comprising series connected energy storage cells and switching devices for splitting the series connected energy cells into groups of cells, the method comprising: activating the switching devices to select any one of externally powered or internally powered cell balancing and an internally powered diagnostic test. The software can be embodied in a computer program product adapted to carry out the functions itemised below when the software is loaded onto the controller and executed on one or more processing engines such as microprocessors, ASIC's, FPGA's etc. Hence a control unit (9) for use with any of the embodiments of the present invention can incorporate a computer system capable of running one or more computer applications in the form of computer software.

The method above can be performed by one or more computer application programs running on the computer system by being loaded into a memory and run on or in association with an operating system such as Windows™ supplied by Microsoft Corp, USA, Linux, Android or similar. The computer system can include a main memory, preferably random access memory (RAM), and may also include a non-transitory hard disk drive and/or a removable non-transitory memory, and/or a non-transitory solid state memory. Non-transitory removable memory can be an optical disk such as a compact disc (CD-ROM or DVD-ROM), a magnetic tape, which is read by and written to by a suitable reader. The removable non-transitory memory can be a computer readable medium having stored therein computer software and/or data. The non-volatile storage memory can be used to store persistent information that should not be lost if the computer system is powered down. The application programs may use and store information in the non-volatile memory.

The software embodied in the computer program product is adapted to carry out the following functions when the software is loaded onto the respective device or devices and executed on one or more processing engines such as microprocessors, ASIC's, FPGA's etc.: a single ohmic device determining the level of balancing current, and/or an additional ohmic device connected in parallel with the single ohmic device in order to change the resistance value to determine the level of balancing current.

The software embodied in the computer program product is adapted to carry out the following functions when the software is loaded onto the respective device or devices and executed on one or more processing engines such as microprocessors, ASIC's, FPGA's etc.: activating bidirectional and unidirectional switching devices to select operational modes.

The software embodied in the computer program product is adapted to carry out the following functions when the software is loaded onto the respective device or devices and executed on one or more processing engines such as microprocessors, ASIC's, FPGA's etc.:

Using a group of cells to apply an excitation current for testing another group of cells. A further step is measuring a response voltage signal to the excitation current.

The software embodied in the computer program product is adapted to carry out the following functions when the software is loaded onto the respective device or devices and executed on one or more processing engines such as microprocessors, ASIC's, FPGA's etc.: the externally powering balancing modes in a passive balancing mode during charging or discharging of the RESS, and/or internally powering cell balancing in a series-parallel mode balancing during a rest time.

The software embodied in the computer program product is adapted to carry out the following functions when the software is loaded onto the respective device or devices and executed on one or more processing engines such as microprocessors, ASIC's, FPGA's etc.: a passive balancing mode protecting the rechargeable energy storage cells against overcharge or over discharge.

The software embodied in the computer program product is adapted to carry out the following functions when the software is loaded onto the respective device or devices and executed on one or more processing engines such as microprocessors, ASIC's, FPGA's etc.: a series-parallel mode performing complete balancing of the rechargeable energy storage cells during a rest time.

The software embodied in the computer program product is adapted to carry out the following functions when the software is loaded onto the respective device or devices and executed on one or more processing engines such as microprocessors, ASIC's, FPGA's etc.:

converting response voltage signals from time to frequency domain by using a discrete Fourier transform and means for computing the AC impedance as a function of frequency levels. A further step is calculating an AC impedance to estimate the SoH of the rechargeable energy storage cells.

The software embodied in the computer program product is adapted to carry out the following functions when the software is loaded onto the respective device or devices and executed on one or more processing engines such as microprocessors, ASIC's, FPGA's etc.: estimating SoH of the rechargeable energy storage cells by using a generic aging model.

The software embodied in the computer program product is adapted to carry out the following functions when the software is loaded onto the respective device or devices and executed on one or more processing engines such as microprocessors, ASIC's, FPGA's etc.:

The generic aging model relates resonance impedance to State of Charge, for example, in the model the resonance impedance is defined by:

$$R_{im} = A + \frac{B}{\sqrt{SoH + C}};$$

whereby A, B and C are constants.

Any of the above software may be implemented as a computer program product which has been compiled for a processing engine in any of the servers or nodes of the network. The computer program product may be stored on a non-transitory signal storage medium such as an optical disk (CD-ROM or DVD-ROM), a digital magnetic tape, a magnetic disk, a solid state memory such as a USB flash memory, a ROM, etc.

The invention claimed is:

1. A management system for rechargeable energy storage devices comprising:
   series connected energy storage cells,
   a cell splitting circuit comprising switches configured for splitting the series connected energy storage cells into groups of cells,
   a control unit, and
   a mode selection circuit comprising switching devices and a single ohmic device, wherein the switching devices are configured to select anyone of:
   externally powered cell balancing, wherein externally powered cell balancing is a passive balancing mode during charging or discharging of the rechargeable energy storage devices,
   internally powered cell balancing, wherein internally powered cell balancing is a series-parallel mode balancing during a rest time, and
   an internally powered diagnostic test for state-of-health or state-of-charge estimation, wherein a first group of cells of said groups of cells split with the cell splitting circuit is adapted to apply an excitation current for testing a second group of cells of said groups of cells, and wherein said single ohmic device is configured to determine a level of balancing current for said passive and for said series-parallel mode balancing.

2. The management system of claim 1, further comprising an additional ohmic device connected in parallel with the single ohmic device in order to change a resistance value which determines the level of balancing current.

3. The management system of claim 1, further comprising means for measuring a response voltage signal to the excitation current.

4. The management system of claim 3, further comprising means for converting response voltage signals from time to frequency domain by using a discrete Fourier transform and means for computing the AC impedance as a function of frequency levels, and wherein the management system is further adapted to estimate a State-of-Health ("SoH") of the rechargeable energy storage cells by using said AC impedance.

5. The management system of claim 1, wherein said passive balancing mode is adapted to protect the rechargeable energy storage cells against overcharge or overdischarge.

6. The management system of claim 1, adapted to estimate a SoH of the rechargeable energy storage cells by using a generic aging model.

7. The management system of claim 1, wherein the switching devices of the mode selection circuit comprise bidirectional and unidirectional switches.

8. The management system of claim 1, wherein said series-parallel mode is adapted to complete balancing of the rechargeable energy storage cells during the rest time.

9. A management method for rechargeable energy storage devices comprising series connected energy storage cells and a mode selection circuit comprising switching devices and a single ohmic device, the method comprising:

activating the switching devices of the mode selection circuit to select any one of:

externally powered cell balancing, wherein the externally powered balancing mode is a passive balancing mode during charging or discharging of the rechargeable energy storage devices, internally powered cell balancing, wherein the internally powered cell balancing is a series-parallel mode balancing during a rest time, and an internally powered diagnostic test for state-of-health or state-of-charge estimation, wherein when the internally powered diagnostic test is selected then splitting the series connected energy cells into groups of cells and applying with one group of cells of said group of cells an excitation current for testing another group of cells of said groups of cells, wherein when the passive or series-parallel mode balancing is selected then using the single ohmic device for determining a level of balancing current and drawing the balancing current from or injecting the balance current into one or more of rechargeable energy cells.

10. The management method of claim 9, further comprising changing a resistance value which determines the level of balancing current using an additional ohmic device connected in parallel with the single ohmic device.

11. The management method of claim 9, further comprising measuring a response voltage signal to the excitation current.

12. The management method of claim 11, further comprising converting response voltage signals from time to frequency domain by using a discrete Fourier transform and computing the AC impedance as a function of frequency levels and estimating a SoH of the rechargeable energy storage cells by using said AC impedance.

13. The management method of claim 9, wherein the passive balancing mode is adapted to protect the rechargeable energy storage cells against overcharge or overdischarge, and/or wherein the series-parallel mode is adapted to complete balancing of the rechargeable energy storage cells during the rest time.

14. The management method of claim 9, further comprising estimating a SoH of the rechargeable energy storage cells by using a generic aging model.

15. A non-volatile signal storage means storing a computer program product which when executed on a processing engine implements the method of claim 9.

* * * * *